United States Patent
Tsuchiya et al.

(10) Patent No.: US 10,831,066 B2
(45) Date of Patent: Nov. 10, 2020

(54) LIQUID CRYSTAL DISPLAY DEVICE AND ALIGNMENT FILM

(71) Applicant: SHARP KABUSHIKI KAISHA, Sakai (JP)

(72) Inventors: Hiroshi Tsuchiya, Sakai (JP); Masanobu Mizusaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 33 days.

(21) Appl. No.: 16/083,851

(22) PCT Filed: Mar. 3, 2017

(86) PCT No.: PCT/JP2017/008396
§ 371 (c)(1),
(2) Date: Sep. 10, 2018

(87) PCT Pub. No.: WO2017/154747
PCT Pub. Date: Sep. 14, 2017

(65) Prior Publication Data
US 2019/0064604 A1    Feb. 28, 2019

(30) Foreign Application Priority Data
Mar. 10, 2016   (JP) ................. 2016-047405

(51) Int. Cl.
*G02F 1/1337*   (2006.01)
*G02F 1/13357*  (2006.01)
(Continued)

(52) U.S. Cl.
CPC ........ *G02F 1/133703* (2013.01); *G02F 1/017* (2013.01); *G02F 1/1337* (2013.01);
(Continued)

(58) Field of Classification Search
CPC ............ G02F 1/133703; G02F 1/1337; G02F 1/133617; G02F 1/017; G02F 1/133603;
(Continued)

(56) References Cited

U.S. PATENT DOCUMENTS

2004/0025634 A1   2/2004  Nakamura et al.
2005/0220915 A1   10/2005 Nakamura et al.
(Continued)

FOREIGN PATENT DOCUMENTS

JP    2003-225900 A   8/2003
JP    2010-134270 A   6/2010
(Continued)

OTHER PUBLICATIONS

Konshina et al., The doping of the polyimide alignment layer by semiconductor quantum dots, Aug. 2013, AIP Advances 3, 082104.*

*Primary Examiner* — Eli D. Strah
(74) *Attorney, Agent, or Firm* — ScienBiziP, P.C.

(57) ABSTRACT

The present invention provides a liquid crystal display device capable of maintaining a favorable voltage holding ratio for a long period of time and thereby reducing generation of image sticking not only at room temperature but also at high temperatures. The liquid crystal display device includes: paired substrates; a liquid crystal layer that is held between the paired substrates and contains liquid crystal molecules; and an alignment film disposed between at least one of the paired substrates and the liquid crystal layer, the alignment film containing quantum dots.

19 Claims, 6 Drawing Sheets

(51) Int. Cl.
  *G02F 1/017* (2006.01)
  *H01L 33/50* (2010.01)
  *G02F 1/1333* (2006.01)
(52) U.S. Cl.
  CPC .. *G02F 1/133603* (2013.01); *G02F 1/133617* (2013.01); *B32B 2457/202* (2013.01); *G02F 1/133788* (2013.01); *G02F 2001/01791* (2013.01); *G02F 2001/133397* (2013.01); *G02F 2202/36* (2013.01); *H01L 33/502* (2013.01); *Y10T 428/1023* (2015.01); *Y10T 428/1027* (2015.01)
(58) Field of Classification Search
  CPC ... G02F 1/133788; G02F 2001/133397; G02F 2001/01791; G02F 2202/36; Y10T 428/1023; Y10T 428/1027; B32B 2457/202; H01L 33/502
  See application file for complete search history.

(56) References Cited

U.S. PATENT DOCUMENTS

| | | | |
|---|---|---|---|
| 2007/0128350 A1 | 6/2007 | Nakamura et al. | |
| 2010/0167011 A1* | 7/2010 | Dubrow | C09K 11/56 428/141 |
| 2012/0113672 A1* | 5/2012 | Dubrow | G02B 6/0061 362/602 |
| 2013/0075014 A1 | 3/2013 | Dubrow | |
| 2014/0111754 A1* | 4/2014 | Matsumoto | G02F 1/133723 349/123 |
| 2014/0178648 A1 | 6/2014 | Dubrow | |
| 2015/0002788 A1* | 1/2015 | Guo | G02F 1/133602 349/69 |
| 2015/0109560 A1* | 4/2015 | Guo | B82Y 30/00 349/68 |
| 2015/0300600 A1 | 10/2015 | Dubrow et al. | |
| 2016/0009988 A1 | 1/2016 | Dubrow | |
| 2016/0103368 A1* | 4/2016 | Imanishi | G02F 1/1341 349/43 |
| 2016/0108316 A1* | 4/2016 | Kurisawa | G02F 1/133707 349/106 |
| 2016/0208173 A1* | 7/2016 | Kang | C09K 19/56 |
| 2016/0349428 A1 | 12/2016 | Dubrow et al. | |
| 2016/0363713 A1 | 12/2016 | Dubrow et al. | |
| 2018/0022992 A1 | 1/2018 | Dubrow | |
| 2018/0129101 A1* | 5/2018 | Kawahira | G02F 1/133345 |

FOREIGN PATENT DOCUMENTS

| | | | | |
|---|---|---|---|---|
| JP | 2013-544018 A | | 12/2013 | |
| KR | 20120007780 A | | 1/2012 | |
| KR | 20130074891 | * | 7/2013 | ........... G02F 1/1335 |
| KR | 20130074891 A | * | 7/2013 | |
| KR | 20130074891 A | | 7/2013 | |
| WO | 2005/023704 A1 | | 3/2005 | |
| WO | 2012/064562 A1 | | 5/2012 | |
| WO | 2014/175485 A1 | | 10/2014 | |

* cited by examiner (a) Spacer linking group (b)

(a)

(b)

LIQUID CRYSTAL DISPLAY DEVICE AND ALIGNMENT FILM

TECHNICAL FIELD

The present invention relates to liquid crystal display devices and alignment films.

BACKGROUND ART

Liquid crystal display devices are display devices utilizing a liquid crystal composition to provide display. In a typical display mode thereof, a liquid crystal panel enclosing a liquid crystal composition between paired substrates is irradiated with light emitted by a backlight disposed behind the liquid crystal panel. Examples of the backlight include those utilizing light emitting diodes (LEDs) and cold cathode fluorescent lamps (CCFLs). When voltage is applied to the liquid crystal composition, the alignment of liquid crystal molecules is changed, and thereby the amount of light transmitted through the liquid crystal panel is controlled. Such liquid crystal display devices have characteristics such as a thin profile, a light weight, and low power consumption, and are therefore utilized in electronic devices such as smartphones, tablet PCs, and car navigation systems.

Patent Literature 1 discloses a color liquid crystal display device assembly in which a light source of a planar light source device emits first primary color light, and a front panel includes, on a first surface of its first substrate, second and third primary color emitting regions including second and third primary color emitting particle layers which emit second and third primary color light rays when excited by the first primary color light passed through second and third sub-pixels, and a diffusion region where the first primary color light passed through a first sub-pixel is diffused. Patent Literature 1 also discloses light emitting particles utilizing quantum well structures such as zero-dimensional quantum well structures (quantum dots) as a material constituting the second and third primary color emitting regions. Examples of the method for producing quantum dots include those disclosed in Patent Literatures 2 and 3.

CITATION LIST

Patent Literature

Patent Literature 1: JP 2010-134270 A
Patent Literature 2: JP 2003-225900 A
Patent Literature 3: WO 2005/023704

SUMMARY OF INVENTION

Technical Problem

A widely used backlight for a liquid crystal display device utilizes a pseudo-white light emitting diode (hereinafter, also referred to as a pseudo-white LED) which produces white light using a blue light emitting diode and a fluorescent substance (for example, yttrium aluminum garnet (YAG)). Long-term use of a liquid crystal display device using a pseudo-white LED in a backlight may cause image sticking and thus lower the reliability of the device. In a high-temperature environment, long-term use causes more significant image sticking.

The present invention has been made in view of the above current state of the art and aims to provide a liquid crystal display device capable of maintaining a favorable voltage holding ratio for a long period of time and thereby reducing generation of image sticking not only at room temperature but also at high temperatures.

Solution to Problem

The present inventors made studies on causes of image sticking on a display screen of a liquid crystal panel. The studies found that under light emitted by a backlight (hereinafter, also referred to as backlight illumination), some materials of the components (e.g., alignment films, liquid crystal material) constituting the liquid crystal panel generate radicals which are then turned into ionic impurities and dissolve into the liquid crystal layer. This phenomenon was found to decrease the voltage holding ratio of the liquid crystal panel, causing image sticking. The studies also found that long-term use of a liquid crystal display device utilizing a pseudo-white LED in a backlight is likely to cause image sticking because the luminescent substance has a low luminous efficacy and light emitted by a pseudo-white LED includes near-ultraviolet rays which have a high energy.

The present inventors made studies on a method that reduces near-ultraviolet rays incident on the liquid crystal panel. The studies revealed that adding quantum dots to an alignment film reduces incidence of near-ultraviolet rays on the liquid crystal panel. FIG. 1 is a graph of an emission spectrum in the case of adding no quantum dots to an alignment film. FIG. 2 is a graph of an emission spectrum in the case of adding quantum dots to an alignment film. FIG. 1 and FIG. 2 each show the measured spectrum of light emitted toward the viewer by a pseudo-white LED in a backlight and passed through the liquid crystal panel. The vertical axis of the graph in each of FIG. 1 and FIG. 2 shows the emission intensity. Comparison between FIG. 1 and FIG. 2 shows that in the case of adding quantum dots to the alignment film, light in the near-ultraviolet to blue spectral range was converted into light in the green to red spectral range. The inventors thereby arrived at a solution to the above problem, completing the present invention.

In other words, one aspect of the present invention may be a liquid crystal display device including: paired substrates; a liquid crystal layer that is held between the paired substrates and contains liquid crystal molecules; and an alignment film disposed between at least one of the paired substrates and the liquid crystal layer, the alignment film containing quantum dots. Another aspect of the present invention may be an alignment film for use in controlling the initial alignment of liquid crystal in a liquid crystal display device, the alignment film containing quantum dots.

As described above, with the quantum dots used as a wavelength conversion material, high energy, short wavelength light included in the backlight illumination can be efficiently converted into lower energy, long wavelength light. The quantum dots therefore can reduce a decrease in the quality and reliability of a liquid crystal display device due to application of short wavelength light.

Patent Literature 1 discloses a technique which, without color filters, uses light of one of the three primary colors (RGB) (first primary color light) as light from the backlight and converts the light rays into those of the other two colors by the primary color light-emitting layers to produce light rays of the three primary colors for color display. This configuration is described to increase the effective usage efficiency of the first primary color light. Patent Literature 1, however, is silent as to the quality and reliability of the liquid crystal panel, including the image sticking problem which is to be solved by the present invention. Moreover, in the case of forming "primary color light-emitting layers" inside the liquid crystal panel, an additional step is required to form the primary color light-emitting layers in each sub-pixel. The present invention avoids such an additional step since quantum dots are added to an alignment film material in advance, and can employ a normal panel formation process.

Advantageous Effects of Invention

The liquid crystal display device of the present invention having the configuration described above can efficiently convert short wavelength light, emitted by the backlight and incident on the liquid crystal panel, into long wavelength light, preventing a decrease in the voltage holding ratio due to short wavelength light. The liquid crystal display device thereby can maintain a favorable voltage holding ratio and reduce generation of image sticking on the display screen. The alignment film of the present invention can efficiently convert short wavelength light passed therethrough into long wavelength light.

DESCRIPTION OF EMBODIMENTS

Hereinafter, embodiments of the present invention are described. The embodiments are not intended to limit the scope of the present invention and may appropriately be modified within the spirit of the present invention.

Embodiment 1

Figure 3:
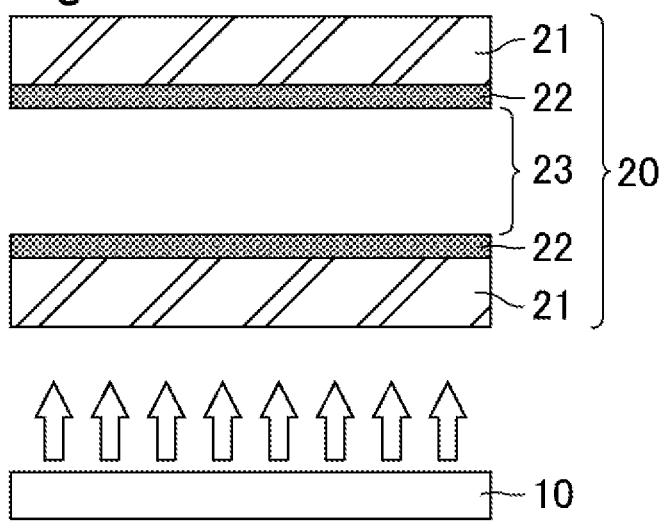
FIG. 3 is a schematic cross-sectional view of a liquid crystal display device of Embodiment 1.

FIG. 3 is a schematic cross-sectional view of a liquid crystal display device of the present embodiment. The liquid crystal display device of the present embodiment includes a liquid crystal panel 20 and a backlight 10. The liquid crystal panel 20 includes paired substrates 21, a liquid crystal layer 23 held between the paired substrates 21, and alignment films 22 disposed between the respective substrates 21 and the liquid crystal layer 23. The liquid crystal layer 23 contains liquid crystal molecules. The alignment films 22 each contain quantum dots.

The liquid crystal panel 20 may be a common liquid crystal panel in an active matrix-type display mode as long as it includes the paired substrates 21, the liquid crystal layer 23 held between the paired substrates 21, and the alignment films 22 disposed between the respective substrates 21 and the liquid crystal layer 23. In the active matrix-type display mode, usually, a signal voltage is applied to an electrode in each pixel through the corresponding active element such as a thin-film transistor (TFT) when the TFT is turned on, and the electric charge charged in the pixel is held while the active element is turned off. The ratio of the charged electric charge held during one frame (e.g., 16.7 ms) is a voltage holding ratio (VHR). In other words, a low VHR means that the voltage applied to the liquid crystal layer is likely to be attenuated with time. In an active matrix-type display mode, the VHR is required to be high.

The paired substrates 21 may be, for example, an active matrix substrate (TFT substrate) and a color filter (CF) substrate in combination. The active matrix substrate may be one usually used in the field of liquid crystal display devices. The active matrix substrate has, in a plan view thereof, a configuration including, on a transparent substrate, components such as parallel gate signal lines; parallel source signal lines that extend in the direction perpendicular to the gate signal lines; active elements such as TFTs disposed at the respective intersections of the gate signal lines and the source signal lines; and pixel electrodes disposed in the respective regions defined by the gate signal lines and the source signal lines in a matrix form. In a horizontal alignment mode, the configuration may further include components such as a common conductive line; and a counter electrode connected to the common conductive line. The TFTs each preferably include a channel layer formed from indium-gallium-zinc-oxygen (IGZO) which is an oxide semiconductor.

Figure 4:
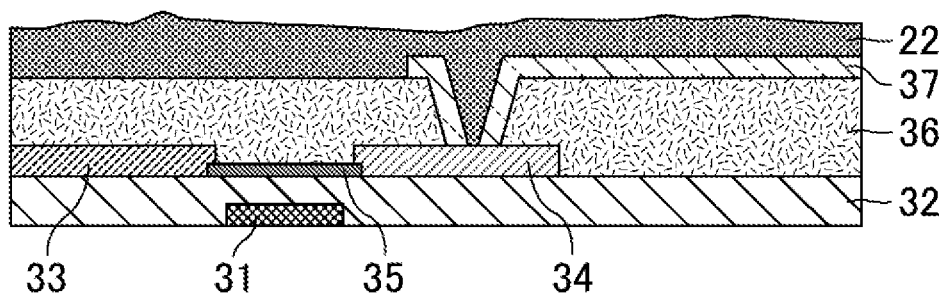
FIG. 4 is a schematic cross-sectional view of a TFT substrate used in IPS mode, 4D-RTN mode, and MVA mode liquid crystal display devices.
Figure 5:
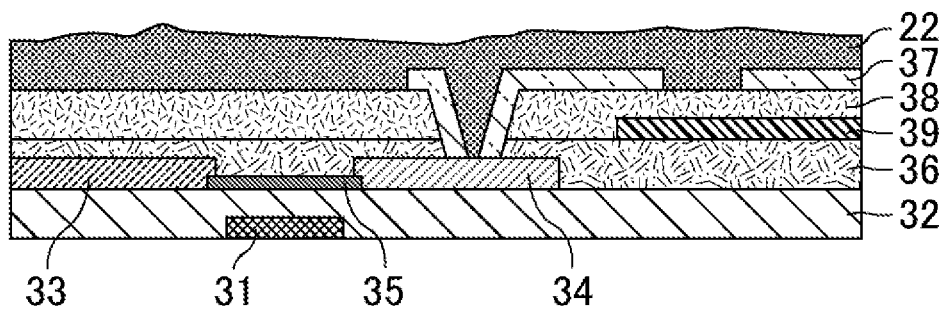
FIG. 5 is a schematic cross-sectional view of a TFT substrate used in an FFS mode liquid crystal display device.

An exemplary configuration of a TFT substrate is described with reference to FIG. 4 and FIG. 5. FIG. 4 is a schematic cross-sectional view of a TFT substrate used in IPS mode, 4D-RTN mode, and MVA mode liquid crystal display devices. FIG. 5 is a schematic cross-sectional view of a TFT substrate used in an FFS mode liquid crystal display device. FIG. 4 and FIG. 5 are each an enlarged view of a structure near a TFT. As shown in FIG. 4 and FIG. 5, a source signal line 33 and a drain electrode 34 are disposed on a gate signal line 31 with a gate insulator 32 in between, and a semiconductor layer 35 is disposed between the source signal line 33 and the drain electrode 34. When a current is passed through the semiconductor layer 35, a signal transmitted by the source signal line 33 is written on a first electrode 37 disposed on a first interlayer film 36 through the drain electrode 34. The first electrode 37 is, for example, a pixel electrode. In the FFS mode, a second electrode 39 is disposed under the first electrode 37 with a second interlayer film 38 in between. The voltage applied to the second electrode 39 may be different from the voltage applied to the first electrode 37. The second electrode 39 is, for example, a common electrode.

The color filter substrate may be one usually used in the field of liquid crystal display devices. The color filter substrate has, for example, a configuration including, on a transparent substrate, components such as a black matrix formed in a grid pattern; and color filters formed in the respective cells of the grid (in the respective pixels).

Both the color filters and the active matrix may be formed on one of the paired substrates 21.

The liquid crystal layer 23 may be any layer that contains at least one liquid crystal material. Usually, the liquid crystal layer 23 contains thermotropic liquid crystal, preferably a liquid crystal material in a nematic phase (nematic liquid crystal).

The anisotropy ($\Delta\varepsilon$) of dielectric constant of the liquid crystal material defined by the following formula may be negative or positive. In other words, the liquid crystal molecules may have negative anisotropy of dielectric constant or positive anisotropy of dielectric constant. Liquid crystal molecules having negative anisotropy of dielectric constant can be, for example, those having an anisotropy $\Delta\varepsilon$ of −1 to −20. Liquid crystal molecules having positive anisotropy of dielectric constant can be, for example, those having an anisotropy $\Delta\varepsilon$ of 1 to 20. The liquid crystal layer 23 may further contain liquid crystal molecules having no polarity, i.e., having an anisotropy $\Delta\varepsilon$ of substantially 0 (neutral liquid crystal molecules). Examples of the neutral liquid crystal molecules include liquid crystal molecules having an alkene structure.

$\Delta\varepsilon$=(dielectric constant in major axis direction)−(dielectric constant in minor axis direction)

In conventional liquid crystal display devices, liquid crystal molecules having negative anisotropy of dielectric constant tend to cause defects such as image sticking and stains in a more significant manner than liquid crystal molecules having positive anisotropy of dielectric constant. This is presumed to be due to the following mechanism. That is, typically, some of radicals generated in a polymer which is a material constituting an alignment film are easily transferred to negative liquid crystal molecules and/or neutral liquid crystal molecules having an alkene structure (liquid crystal molecules having no polarity) in the liquid crystal layer to decrease the VHR. Hence, in a photo-alignment liquid crystal display, radicals generated from photo-aligning functional groups in a photo-alignment film are transferred to a liquid crystal material (in particular, negative liquid crystal material) and eventually ionized, decreasing the VHR. This is presumed to be due to a greater polarization of liquid crystal molecules having negative anisotropy of dielectric constant in the minor axis direction, which increases the influence of VHR decrease when the radicals are ionized. In other words, the liquid crystal display device of the present embodiment achieves a more significant effect when it contains a liquid crystal material having negative anisotropy of dielectric constant than when it contains a liquid crystal material having positive anisotropy of dielectric constant.

The alignment films 22 each have a function of controlling the alignment of liquid crystal molecules in the liquid crystal layer 23. When the voltage applied to the liquid crystal layer 23 is less than the threshold voltage (including no voltage application), the alignment of the liquid crystal molecules in the liquid crystal layer 23 is mainly controlled by the function of the alignment films 22. In this state, the angle formed by the major axis of each liquid crystal molecule and the surface of one of the paired substrates 21 is called a "pre-tilt angle". The "pre-tilt angle" as used herein means the angle of inclination of a liquid crystal molecule from the direction parallel to the substrate surface, with the angle of direction parallel to the substrate surface being 0° and the angle of the direction normal to the substrate surface being 90°.

The alignment films 22 may give any pre-tilt angle to the liquid crystal molecules. The alignment films 22 may be horizontal alignment films or vertical alignment films.

In the case where the alignment films 22 are horizontal alignment films, each alignment film 22 preferably aligns its neighboring liquid crystal molecules in the direction parallel to a surface thereof. In this case, the pre-tilt angle is preferably substantially 0° (for example, smaller than 10°), more preferably 0° in order to maintain a favorable constant ratio for a long period of time. In the case where the display mode is the IPS mode or the FFS mode, the pre-tilt angle is preferably 0° also in terms of the viewing angle characteristics. In the case where the display mode is the TN mode, the pre-tilt angle is set to, for example, about 2° due to restrictions in the mode.

In the case where the alignment films 22 are vertical alignment films, each alignment film 22 preferably aligns its neighboring liquid crystal molecules in the direction perpendicular to a surface thereof. In this case, the pre-tilt angle is preferably substantially 90° (for example, 80° or greater and 90° or smaller), more preferably 85° or greater. In the case where the display mode is the 4D-RTN mode, the pre-tilt angle is more preferably 88° to 89°.

The alignment films 22 each preferably contain a photo-aligning functional group. The photo-aligning functional group means a functional group that undergoes a structural change when irradiated with light (electromagnetic waves) such as ultraviolet light or visible light. The structural change of the photo-aligning functional group may be, for example, dimerization (formation of dimers), isomerization, photo-Fries rearrangement, or decomposition. Upon structural change of the photo-aligning functional group, the alignment film 22 can exert the alignment-controlling force or change the alignment-controlling force level and/or direction. The alignment-controlling force is the ability of controlling the alignment of nearby liquid crystal molecules.

On such alignment films 22 containing a photo-aligning functional group can be performed an alignment treatment (photo-alignment treatment). The photo-alignment treatment is a dustless, highly reliable liquid crystal alignment method with excellent in-plane uniformity. Also, since the alignment treatment is directly performed on the alignment films 22, alignment-controlling components such as projections and structures are not necessary. This means that treatment eliminates the causes of a decrease in transmittance, enabling achievement of high transmittance.

The photo-aligning functional group is preferably at least one photo-aligning functional group selected from the group consisting of a cinnamate group, a chalcone group, a coumarin group, an azobenzene group, and a tolane group. The liquid crystal display device of the present embodiment contains quantum dots in each alignment film 22, and thus can convert ultraviolet rays in the backlight illumination into lower energy visible rays. Hence, when the photo-aligning functional group is a cinnamate group, an azobenzene group, or a chalcone group which are likely to absorb light having a wavelength of 320 nm or longer and generate radicals, the liquid crystal display device can more effectively reduce generation of image sticking.

Each alignment film 22 contains quantum dots. Containing quantum dots, the alignment film 22 can convert light in the near-ultraviolet to blue spectral range in the backlight illumination into light in the green to red spectral range. Such an alignment film can reduce generation of radicals in some components (e.g., alignment films, liquid crystal material) due to application of backlight illumination, thereby reducing a decrease in voltage holding ratio of the liquid crystal panel. The liquid crystal display device can thereby reduce generation of image sticking.

Quantum dots are nanoscale (e.g., average particle size=2 to 10 nm). semiconductor crystals having optical characteristics in terms of quantum mechanics. Examples thereof include colloidal particles composed of 10 to 50 atoms. Quantum dots have a narrow spectral radiation bandwidth and a high quantum efficiency, and can absorb light having a wavelength in a wide range.

The quantum dots are formed of, for example, a compound such as cadmium selenide (CdSe), cadmium telluride (CdTe), cadmium sulfide (CdS), lead sulfide (PbS), or indium phosphide (InP), or an alloy such as CdSeS. In particular, the quantum dots are preferably formed of at least one compound selected from the group consisting of cadmium selenide (CdSe), cadmium telluride (CdTe), cadmium sulfide (CdS), and indium phosphide (InP).

Examples of the quantum dots include core-type quantum dots, alloy-type quantum dots, and core-shell-type quantum dots. The present embodiment can employ any of the core-type quantum dots, the alloy-type quantum dots, and the core-shell-type quantum dots.

The core-type quantum dots are colloidal particles which are semiconductor crystals having a single uniform internal composition. Examples of the semiconductor constituting a core-type quantum dot include CdSe, CdTe, CdS, PbS, and InP. Specifically, products (#662429, #662356, #662445, #662488) available from Sigma-Aldrich Japan can be used. The emission wavelength peak of core-type quantum dots can be adjusted by adjusting the particle size.

The alloy-type quantum dots are colloidal particles of an alloy of multiple semiconductors. Examples of the alloy-type quantum dots include those of CdSeS. Specifically, products #753742 and #753793 available from Sigma-Aldrich Japan can be used. The optical characteristics and the electrical characteristics of alloy-type quantum dots can be adjusted by varying their composition and internal structure.

The core-shell-type quantum dots are those in which the surfaces of the core-type quantum dots or the alloy-type quantum dots are coated with a semiconductor compound such as zinc sulfide (ZnS). Examples of the core-shell-type quantum dots include CdSe/ZnS (core/shell), CdTe/ZnS, CdS/ZnS, PbS/ZnS, InP/ZnS, and CdSeS/ZnS. Specifically, products (#776750, #790192, #694592) available from Sigma-Aldrich Japan can be used.

Figure 6:
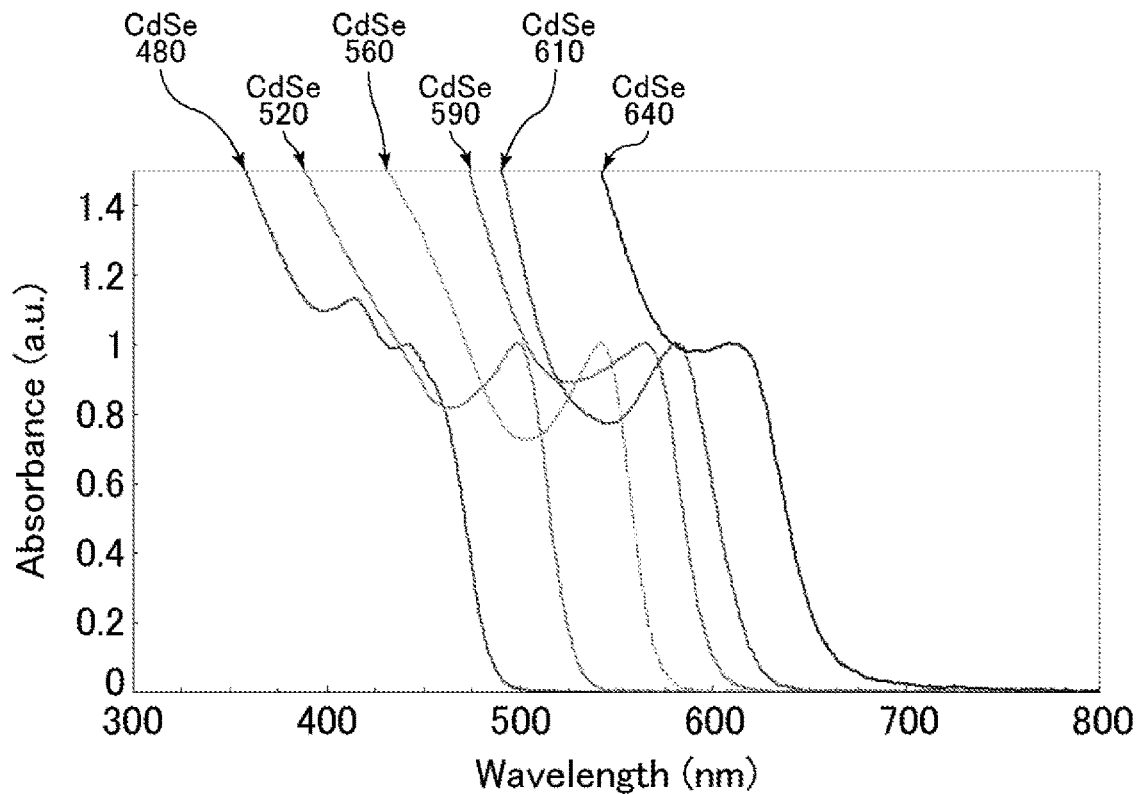
FIG. 6 is a graph of absorption spectra of CdSe products.
Figure 7:
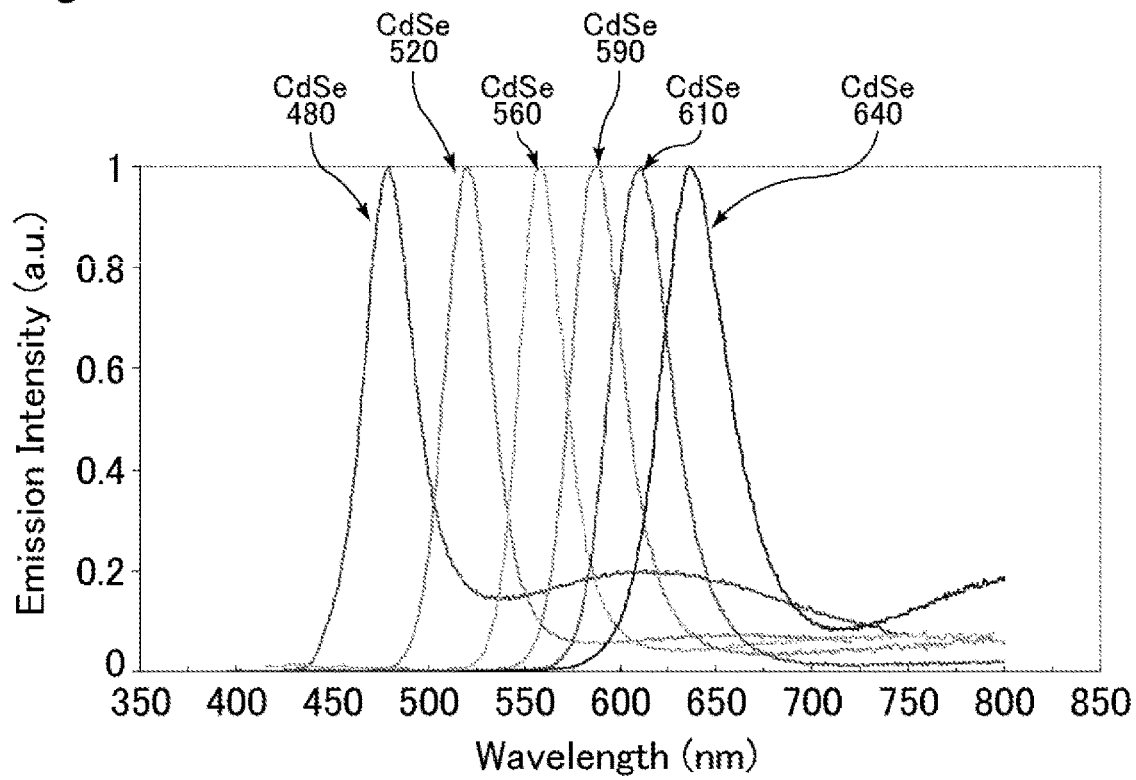
FIG. 7 is a graph of emission spectra of the CdSe products.
Figure 8:
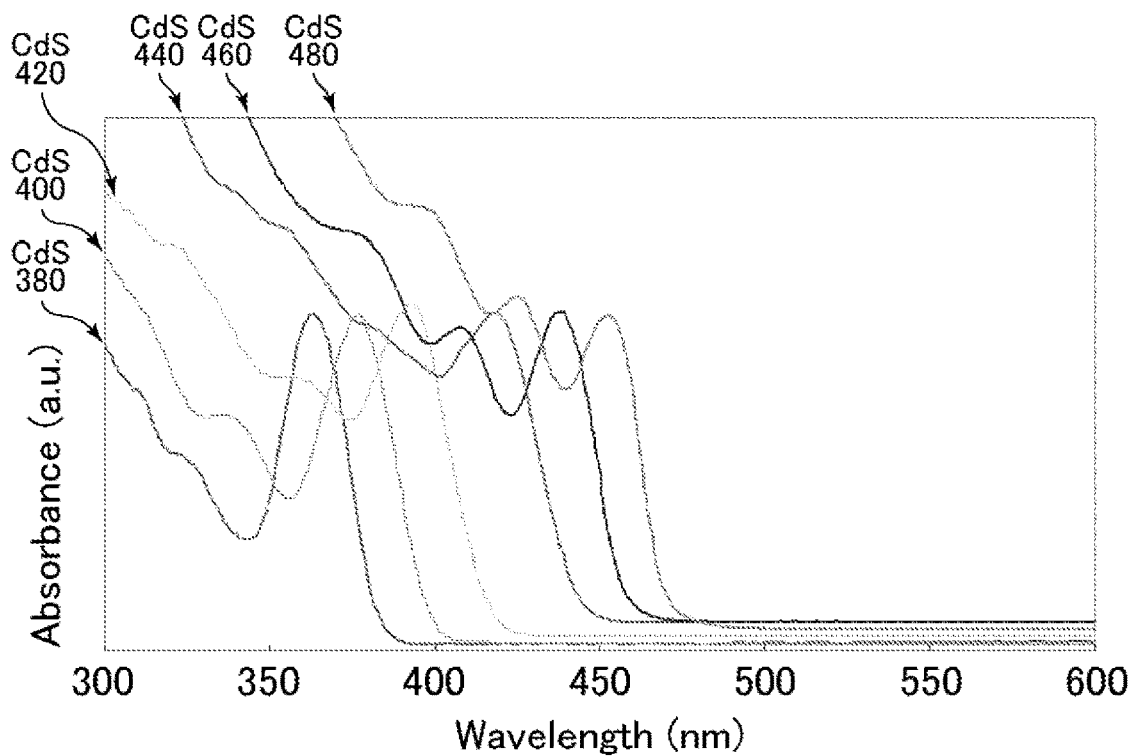
FIG. 8 is a graph of absorption spectra of CdS products.
Figure 9:
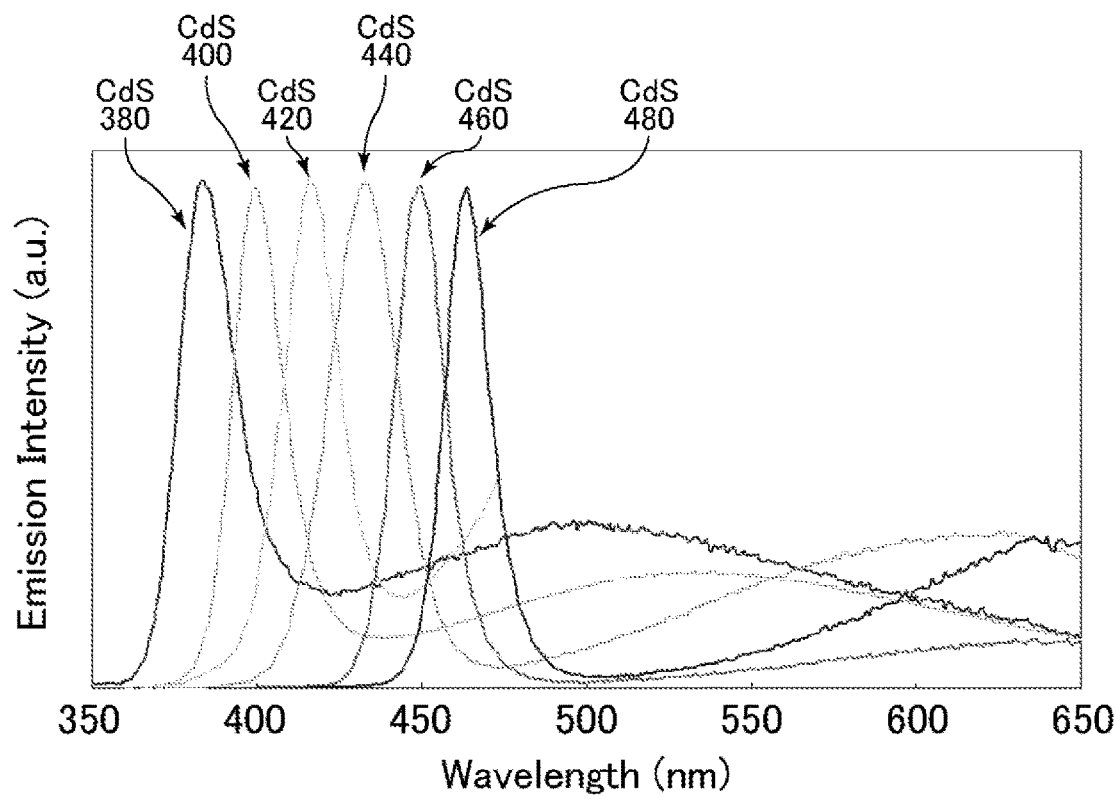
FIG. 9 is a graph of emission spectra of the CdS products.

FIG. 6 is a graph of absorption spectra of CdSe products. FIG. 7 is a graph of emission spectra of the CdSe products. FIG. 8 is a graph of absorption spectra of CdS products. FIG. 9 is a graph of emission spectra of the CdS products. In each of FIG. 6 and FIG. 8, the horizontal axis shows the wavelength (nm) and the vertical axis shows the absorbance (a.u.). In each of FIG. 7 and FIG. 9, the horizontal axis shows the wavelength (nm) and the vertical axis shows the emission intensity (a.u.).

The core-type quantum dots used were Lumidot™ CdS 380, CdS 400, CdS 420, CdS 460, CdS 480, CdSe 480, CdSe 520, CdSe 560, CdSe 590, CdSe 610 or CdSe 640 (all available from Sigma-Aldrich Japan).

As shown in FIG. 6 and FIG. 8, both CdSe and CdS can absorb light having a wavelength in a wide range, particularly light in a short wavelength range. Also, as shown in FIG. 7 and FIG. 9, both CdSe and CdS can convert short wavelength light into lower energy visible light.

The following Table 1 summarizes the emission wavelength peaks and particles sizes of the quantum dots.

TABLE 1

| Quantum dot | Emission wavelength peak (±10 nm) | Particle size (nm) |
| --- | --- | --- |
| CdS 380 | 380 | 1.6 to 1.8 |
| CdS 400 | 400 | 1.8 to 2.3 |
| CdS 420 | 420 | 2.3 to 2.9 |
| CdS 440 | 440 | 2.9 to 4.0 |
| CdS 460 | 460 | 4.0 to 5.4 |
| CdS 480 | 480 | 5.4 to 7.3 |
| CdSe 480 | 480 | 2.1 to 2.3 |
| CdSe 520 | 520 | 2.4 to 2.6 |
| CdSe 560 | 560 | 3.0 to 3.5 |
| CdSe 590 | 590 | 4.0 to 4.3 |
| CdSe 610 | 610 | 4.7 to 5.2 |
| CdSe 640 | 640 | 6.2 to 7.7 |

As shown in Table 1, the CdSe quantum dots with different particle sizes of 2.1 nm to 7.7 nm have different emission peak wavelengths of 480 nm to 640 nm. The CdS quantum dots with different particle sizes of 1.6 nm to 7.3 nm have different emission peak wavelengths of 380 nm to 480 nm.

The quantum dots preferably have a particle size of 1 nm or greater and 30 nm or smaller. The quantum dots having a particle size falling within the above range can convert light having a short wavelength (in the near-ultraviolet to blue spectral range) into light having a long wavelength (in the green to red spectral range) spectral range. The particle size can be measured with, for example, a transmission electron microscope (TEM). The term "particle size" as used herein means the diameter of the core for core-type quantum dots, and the diameter of the whole particle including the shell for core-shell-type quantum dots.

The quantum dots preferably have an emission peak wavelength longer than 400 nm, based on the following consideration. The emission peak wavelength is more preferably longer than 450 nm, still more preferably longer than 500 nm. The upper limit of the emission peak wavelength is not limited, but is preferably shorter than 800 nm. Quantum dots having different emission peak wavelengths may be used in combination. The term "emission peak wavelength" as used herein means the peak wavelength at which the emission intensity of light emitted by the quantum dots is highest. The emission peak wavelength can be measured with, for example, a spectrophotometer.

Figure 10:
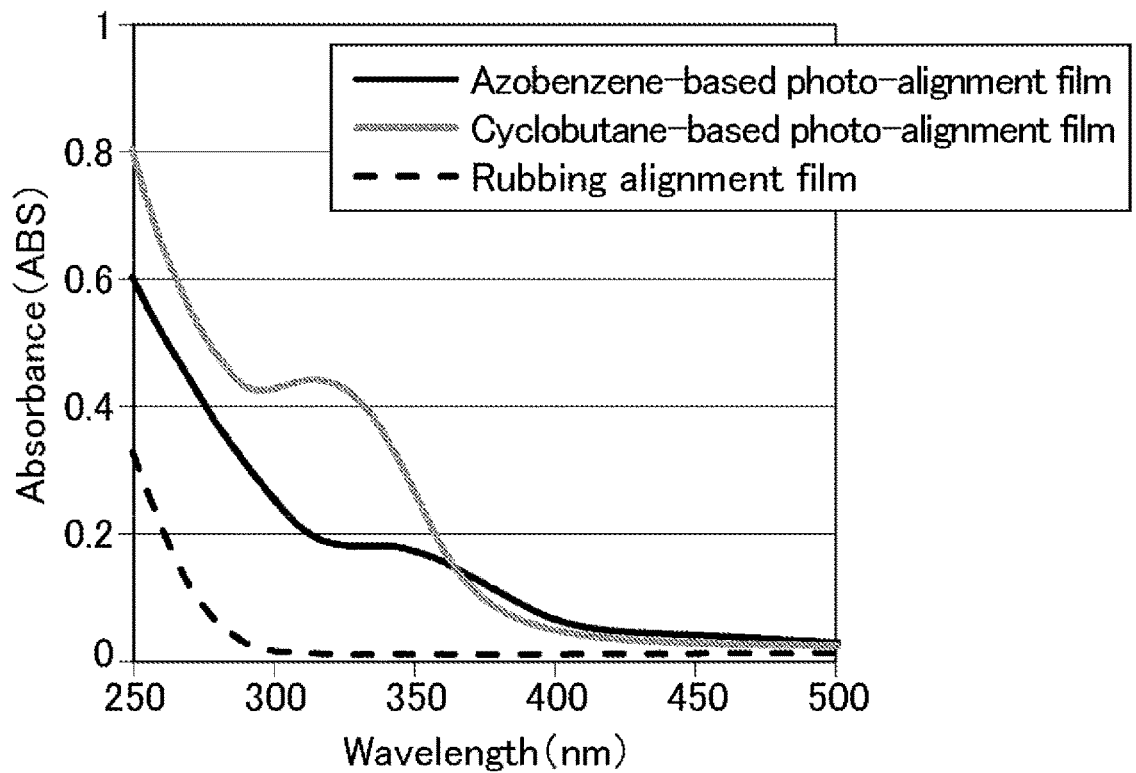
FIG. 10 is a graph of absorption spectra of alignment films.

FIG. 10 is a graph of absorption spectra of alignment films. A photo-alignment film material containing an azobenzene structure as a photoreactive group, a photo-alignment film material containing a cyclobutane structure as a photoreactive group, and a rubbing alignment film material containing no photoreactive group were prepared. Each material was applied to a glass substrate to a thickness of 100 nm, so that an alignment film was formed. The absorption spectrum of each alignment film was measured with a UV-Vis-NIR spectrophotometer (Shimadzu Corporation, UV-3100PC). FIG. 10 shows that both the photo-alignment films and the rubbing alignment film increase in absorbance at a wavelength of 400 nm or shorter. The photo-alignment films increase in absorbance even in a high wavelength range as compared with the rubbing alignment film presumably because the photoreactive group in the photo-alignment films absorbs light. The emission peak wavelength is therefore preferably longer than 400 nm as described above in order to reduce generation of radicals in the alignment film.

The quantum dots preferably have an emission peak wavelength that is longer than the shortest peak wavelength of light in the backlight illumination. The quantum dots can convert short wavelength light in the backlight illumination into long wavelength light, thereby reducing incidence of near-ultraviolet rays emitted by the backlight on the liquid crystal panel.

In order to reduce near-ultraviolet rays having a wavelength of 300 nm to 400 nm in the backlight illumination, the quantum dots preferably have an absorption spectrum at wavelengths shorter than 400 nm.

Figure 11:
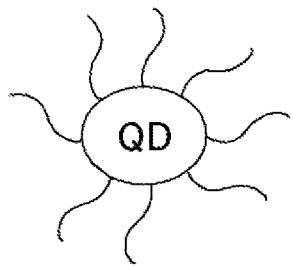
FIG. 11 is a schematic view illustrating the structure of a quantum dot.

The quantum dots each preferably have organic chains on its surface. FIG. 11 is a schematic view illustrating the structure of a quantum dot. As shown in FIG. 11, a quantum dot (QD) preferably has organic chains on its surface. The organic chain is preferably an alkyl group. Examples of the alkyl group include C2 to C20 alkyl groups. Each organic chain may be terminated with a carboxyl group, a hydroxy group, or an amino group. The core-type quantum dot, the alloy-type quantum dot, and the core-shell-type quantum dot can each have organic chains on its surface. The quantum dot having (capped with) organic chains on its surface has a higher solubility in an organic film such as an alignment film, and thus can be dispersed uniformly in the alignment film. This configuration can reduce a decrease in the quantum efficiency due to self-quenching caused by aggregation, for example.

Figure 12:
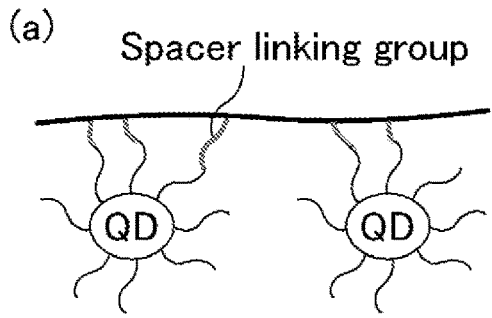
FIG. 12 shows schematic views of exemplary models of bonding between a polymer constituting an alignment film and quantum dots (QDs).
Figure 12:
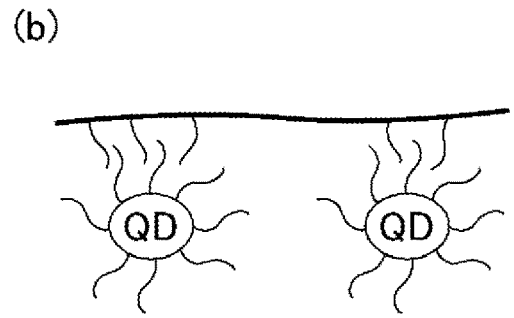
Figure 13:
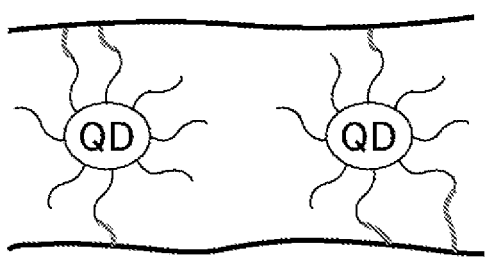
FIG. 13 shows schematic views of exemplary models of bonding between polymers constituting an alignment film and quantum dots (QDs).
Figure 13:
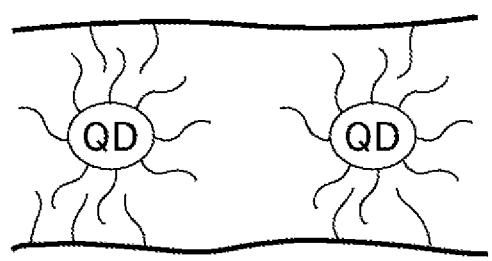

FIG. 12 and FIG. 13 each show schematic views of exemplary models of bonding between a polymer constituting an alignment film and quantum dots (QDs). As shown in FIGS. 12(a) and 12(b), multiple quantum dots may be bonded to one polymer constituting the alignment film 22. One quantum dot may be bonded to multiple polymer chains. As shown in FIGS. 13(a) and 13(b), multiple quantum dots may be bonded to multiple polymers constituting the alignment film 22.

The quantum dots are preferably chemically bonded to a polymer constituting an alignment film. For example, as shown in FIG. 12(a) and FIG. 13(a), the polymer constituting the alignment film 22 and the quantum dots may be bonded to each other by spacer linking groups of the polymer and the organic chains on the surfaces of the quantum dots. The chemical bonds are, for example, covalent bonds. Examples of the spacer linking groups include ester groups, amide groups, ether groups, and thiol groups.

The quantum dots may be bonded to the polymer constituting the alignment film by interaction as shown in FIG. 12(b) and FIG. 13(b). The interaction between the polymer and the quantum dots is, for example, an intermolecular force. Examples of the intermolecular force include hydrogen bonds, metal-p-orbital electron interaction, dipole-dipole interaction, and hydrophobic interaction. A functional group to be bonded to a quantum dot by a hydrogen bond is, for example, a carboxyl group, an amide group, an epoxy group, and a glycidyl group. A functional group to be bonded to a quantum dot by metal-p-orbital electron interaction or dipole-dipole interaction is, for example, a halogen group, preferably a fluorine group. A functional group to be bonded to a quantum dot by hydrophobic interaction is, for example, an alkyl group or a cholesteryl group.

The amount of the quantum dots in the whole alignment film material is preferably 2 parts by weight or more and 50 parts by weight or less. If the amount is less than 2 parts by weight, the emission intensity may be insufficient. Also, short wavelength light in the backlight illumination may not be converted into long wavelength light. In contrast, if the amount is more than 50 parts by weight, the dispersibility of the quantum dots may be low. Also, the degree of alignment of the liquid crystal may be low.

Each alignment film 22 preferably has a unit containing a horizontal alignment functional group and a unit containing a quantum dot. The horizontal alignment functional group and the quantum dot may be contained in the same unit or different units. In the case where they are contained in different units, the alignment film 22 preferably contains a copolymer of a unit containing a horizontal alignment functional group and a unit containing a quantum dot.

The alignment film 22 preferably has a unit containing a vertical alignment functional group and a unit containing a quantum dot. The vertical alignment functional group and the quantum dot may be contained in the same unit or different units. In the case where they are contained in different units, the alignment film 22 preferably contains a copolymer of a unit containing a vertical alignment functional group and a unit containing a quantum dot.

The alignment film 22 preferably has a unit containing a photo-aligning functional group and a unit containing a quantum dot. The photo-aligning functional group and the quantum dot may be contained in the same unit or different units. In the case where they are contained in different units, the alignment film 22 preferably contains a copolymer of a unit containing a photo-aligning functional group and a unit containing a quantum dot. Also, the alignment film 22 may contain a horizontal or vertical alignment functional group, a photo-aligning functional group, and a quantum dot in the same unit.

The alignment film 22 preferably contains at least one polymer selected from the group consisting of a polyamic acid, a polyimide, a polysiloxane, and a polyvinyl. The weight average molecular weight of the polymer can be made large in synthesis of the alignment film material. The polymer can therefore reduce dissolution of impurities (low-molecular component) into the liquid crystal layer during use of the liquid crystal display device, thereby further reducing image sticking (VHR decrease or residual DC generation) due to impurities.

The polyamic acid may have a repeating structural unit represented by the following formula (A-1), for example.

[Chem. 1]

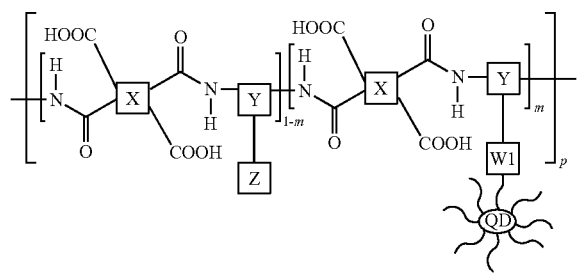

(A-1)

In the formula, m is a real number falling within the range of $0 < m \leq 0.5$; and p shows the degree of polymerization and is an integer of 1 or greater.

Specific examples of X include structures represented by the following formulas (X-A1) to (X-A12). At least one hydrogen atom in each structure may be replaced by a fluorine group, a methyl group, an ethyl group, or an isopropyl group.

[Chem. 2]

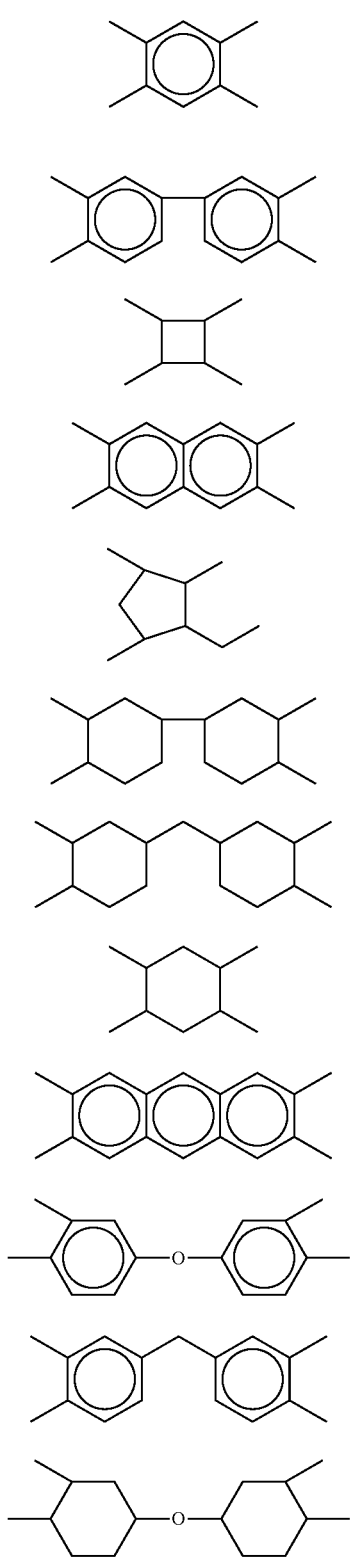

(X-A1)
(X-A2)
(X-A3)
(X-A4)
(X-A5)
(X-A6)
(X-A7)
(X-A8)
(X-A9)
(X-A10)
(X-A11)
(X-A12)

In the case where X is a photo-alignment structure, examples of X include structures represented by the following formulas (X-B1) to (XF-B4).

[Chem. 3]

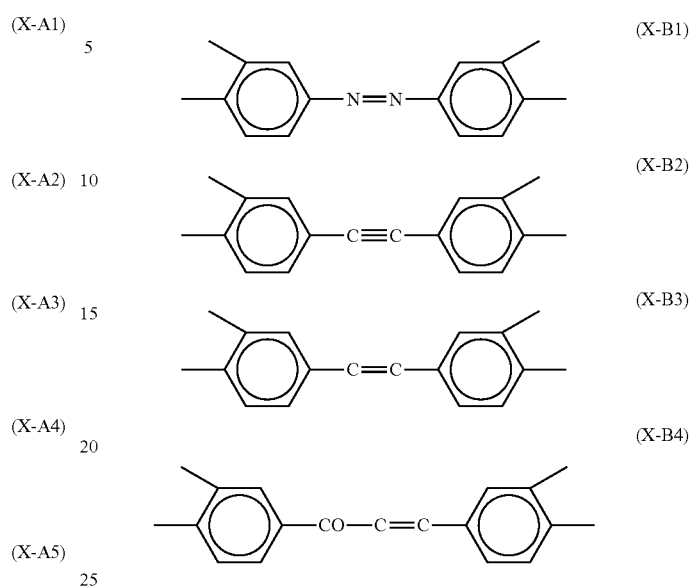

(X-B1)
(X-B2)
(X-B3)
(X-B4)

Specific examples of Y include structures represented by the following formulas (Y-A1) to (Y-A16). At least one hydrogen atom in each structure may be replaced by a fluorine group, a methyl group, an ethyl group, or an isopropyl group.

[Chem. 5]

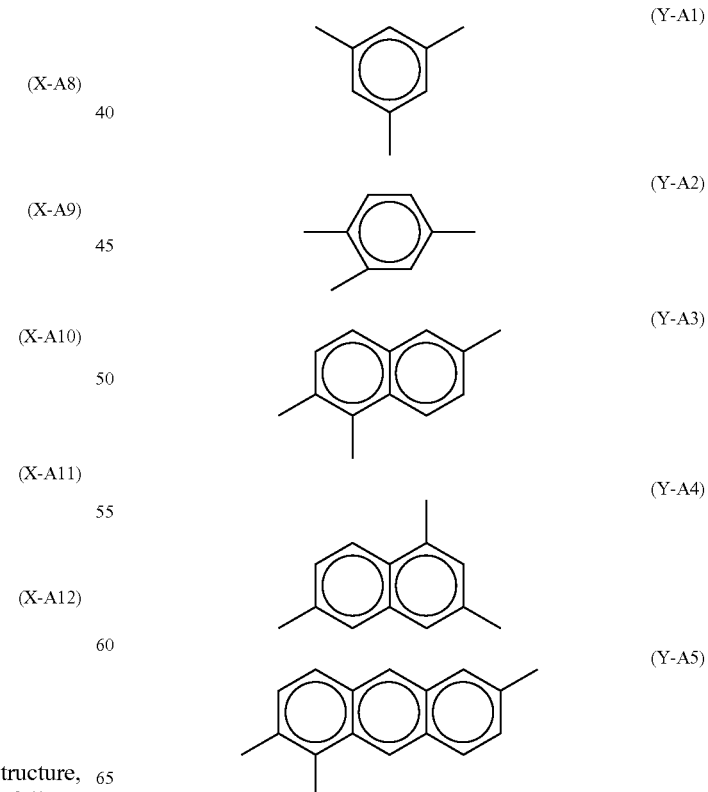

(Y-A1)
(Y-A2)
(Y-A3)
(Y-A4)
(Y-A5)

-continued (Y-A6) 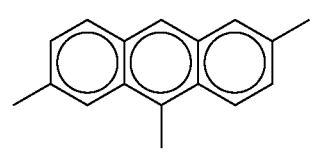

(Y-A7) 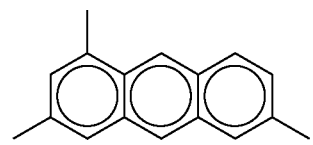

(Y-A8) 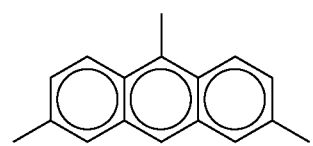

(Y-A9) 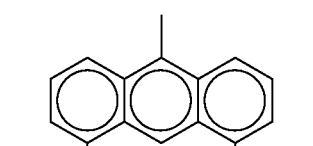

(Y-A10) 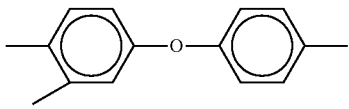

(Y-A11) 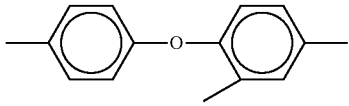

(Y-A12) 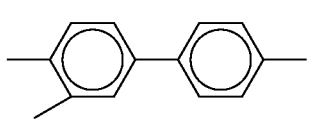

(Y-A13) 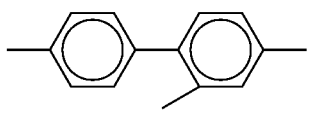

(Y-A14) 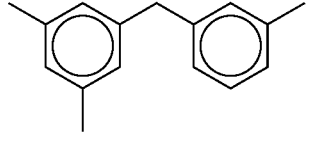

(Y-A15) 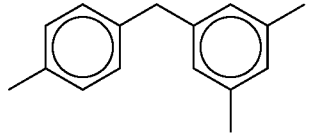

(Y-A16) 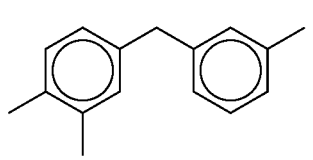

In the case where Y is a photo-alignment structure, examples of Y include structures represented by the following formulas (Y-B1) to (Y-B8).

[Chem. 5]

(Y-B1) 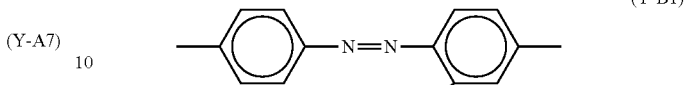

(Y-B2) 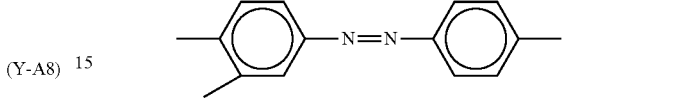

(Y-B3) 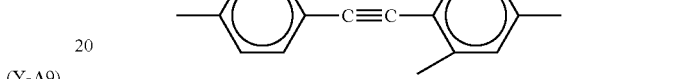

(Y-B4) 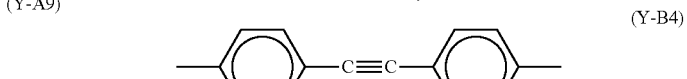

(Y-B5) 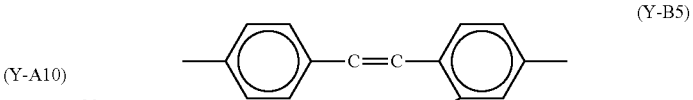

(Y-B6) 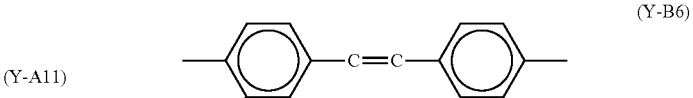

(Y-B7) 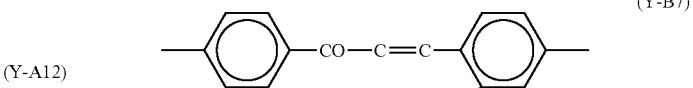

(Y-B8) 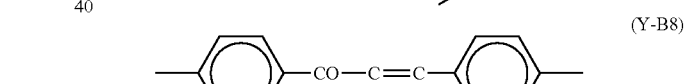

Z represents a side chain. Some or all of the repeating structural units represented by the formula (A-1) may not have a side chain Z.

In the case where the alignment film 22 is a horizontal alignment film, some of the repeating structural units represented by the formula (A-1) may additionally have as Z a functional group capable of aligning liquid crystal molecules in a substantially horizontal direction without being irradiated with light (hereinafter, such a functional group is also referred to as a horizontal alignment functional group).

Specific examples of the horizontal alignment functional group include structures represented by the following formulas (Z-A1) to (Z-A8).

[Chem. 6]

(Z-A1) —H (Z-A2) —CH$_3$

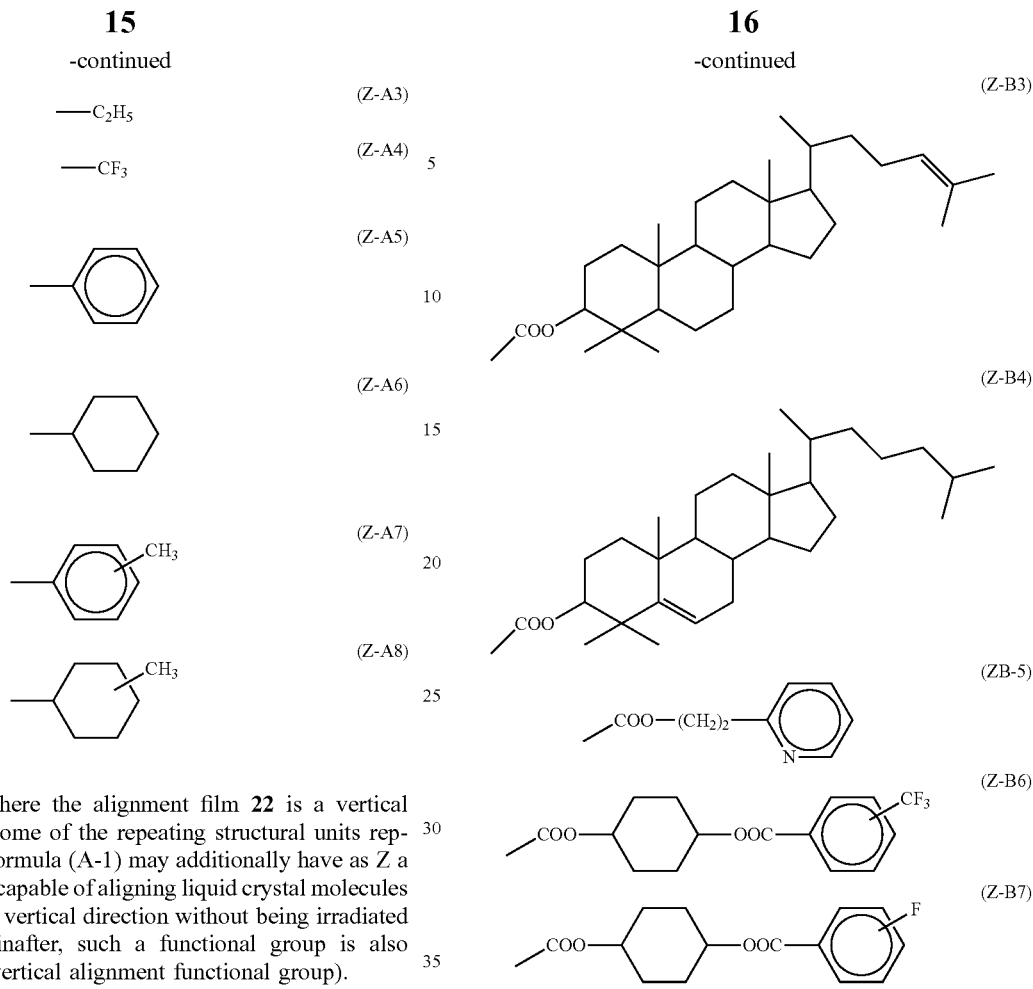

In the case where the alignment film 22 is a vertical alignment film, some of the repeating structural units represented by the formula (A-1) may additionally have as Z a functional group capable of aligning liquid crystal molecules in a substantially vertical direction without being irradiated with light (hereinafter, such a functional group is also referred to as a vertical alignment functional group).

Specific examples of the vertical alignment functional group include structures represented by the following formulas (Z-B1) to (Z-B7).

[Chem. 7]

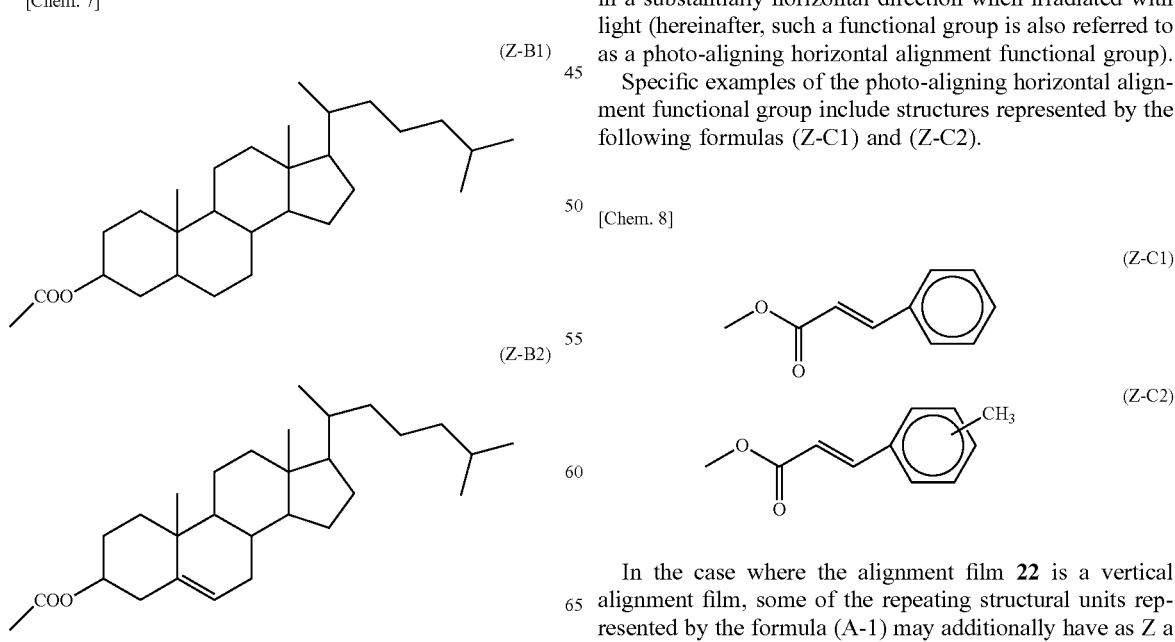

In the case where the alignment film 22 is a horizontal alignment film, some of the repeating structural units represented by the formula (A-1) may additionally have as Z a functional group capable of aligning liquid crystal molecules in a substantially horizontal direction when irradiated with light (hereinafter, such a functional group is also referred to as a photo-aligning horizontal alignment functional group).

Specific examples of the photo-aligning horizontal alignment functional group include structures represented by the following formulas (Z-C1) and (Z-C2).

[Chem. 8]

In the case where the alignment film 22 is a vertical alignment film, some of the repeating structural units represented by the formula (A-1) may additionally have as Z a functional group capable of aligning liquid crystal molecules in a substantially vertical direction when irradiated with light (hereinafter, such as functional group is also referred to as a photo-aligning vertical alignment functional group).
Specific examples of the photo-aligning vertical alignment functional group include structures represented by the following formulas (Z-D1) to (Z-D21).
[Chem. 9]
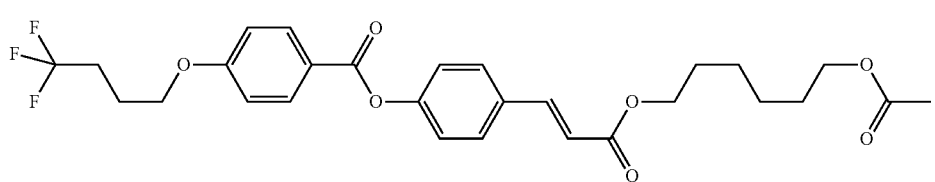
(Z-D1)
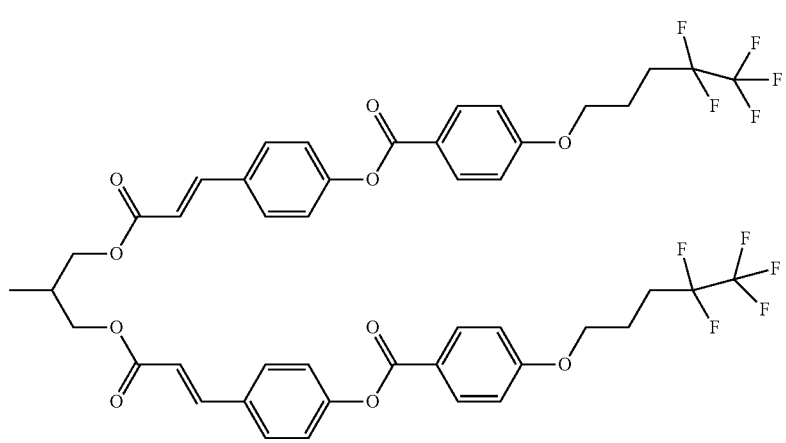
(Z-D2)
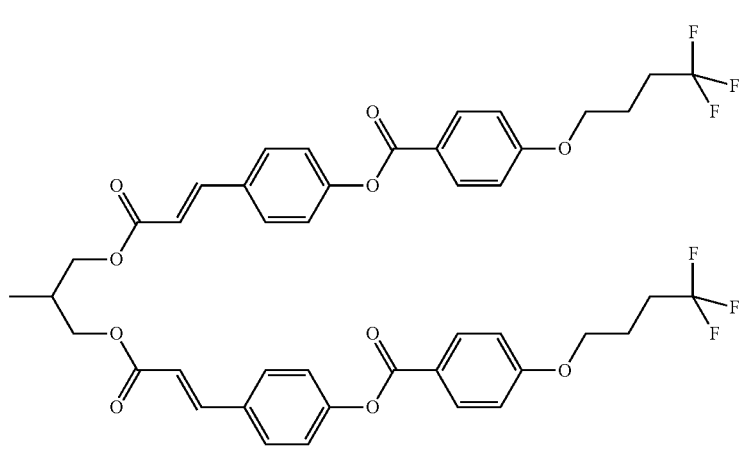
(Z-D3)
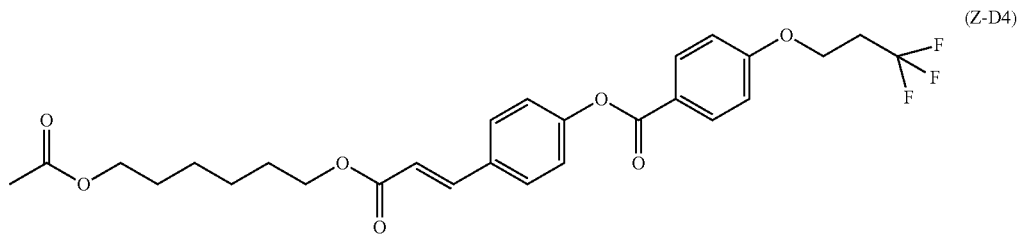
(Z-D4)
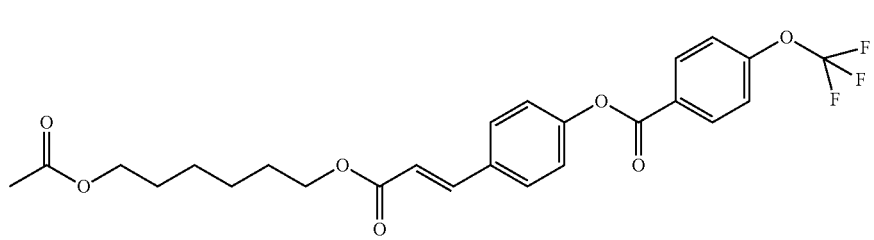
(Z-D5)

[Chem. 10]
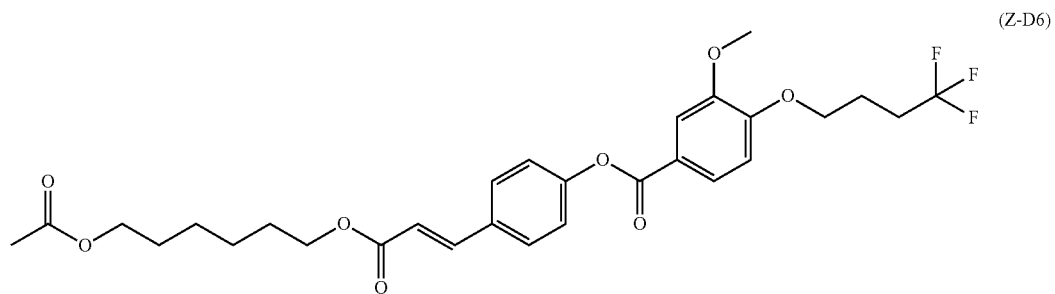
(Z-D6)
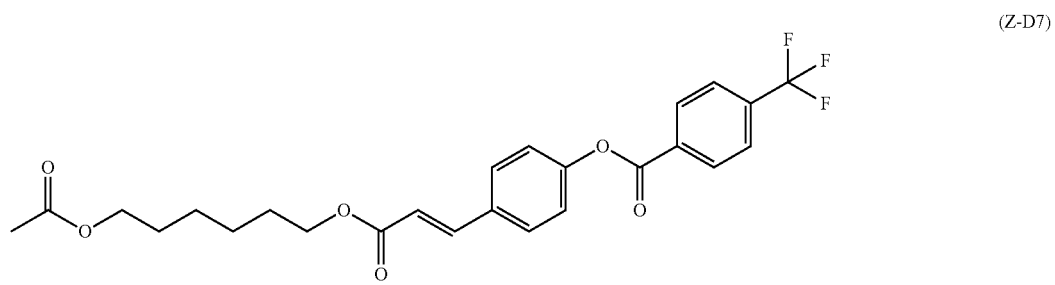
(Z-D7)
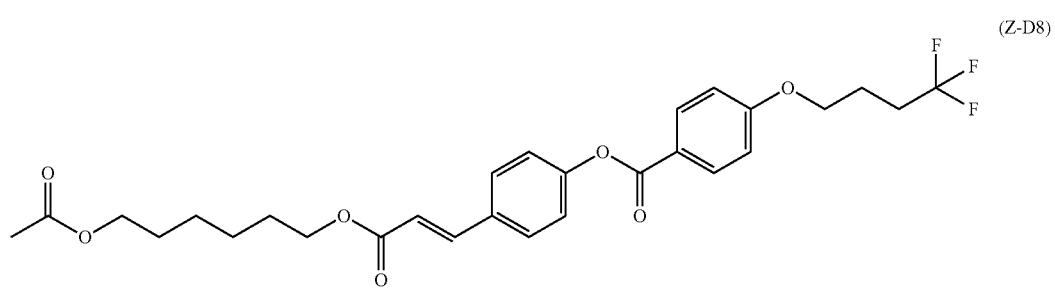
(Z-D8)
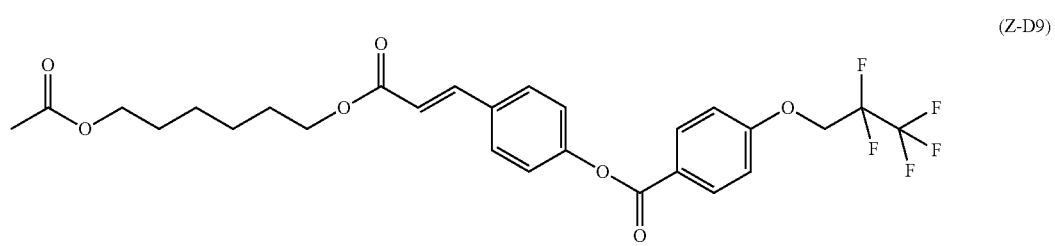
(Z-D9)
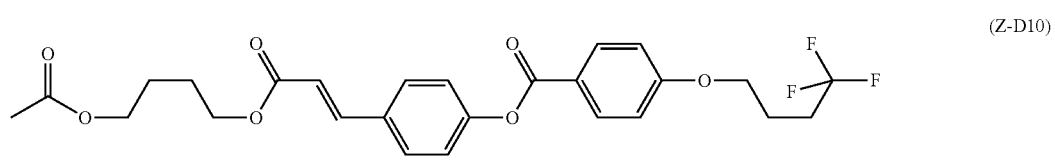
(Z-D10)
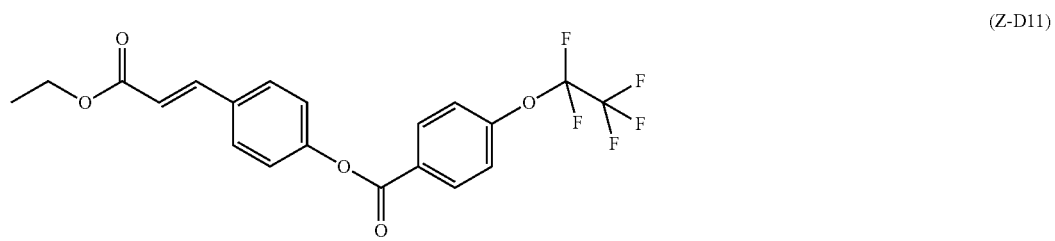
(Z-D11)

[Chem. 11]
(Z-D12)
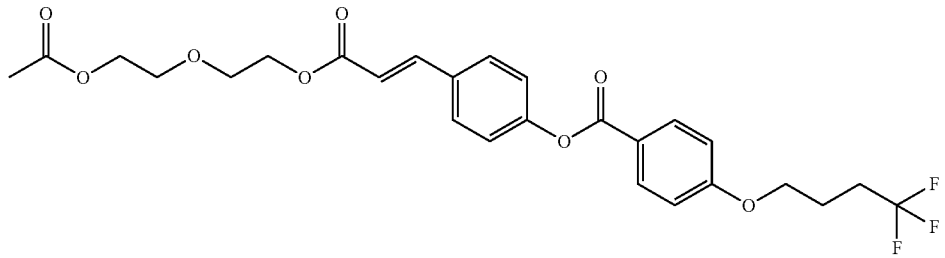
(Z-D13)
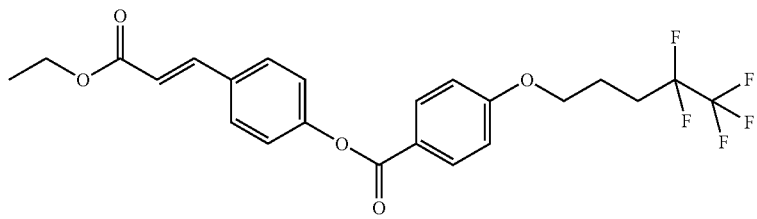
(Z-D14)
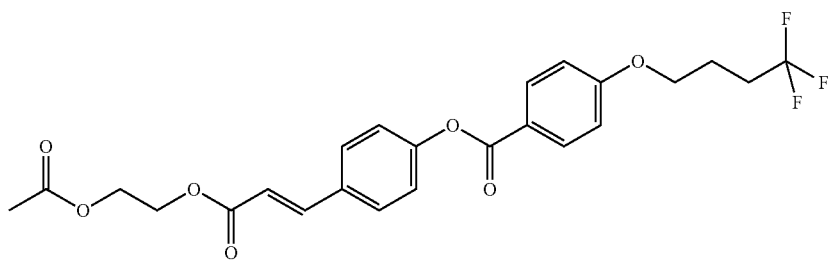
(Z-D15)
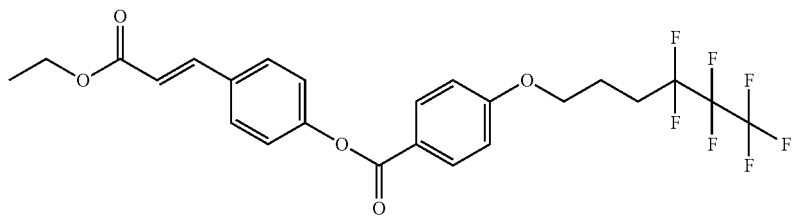
(Z-D16)
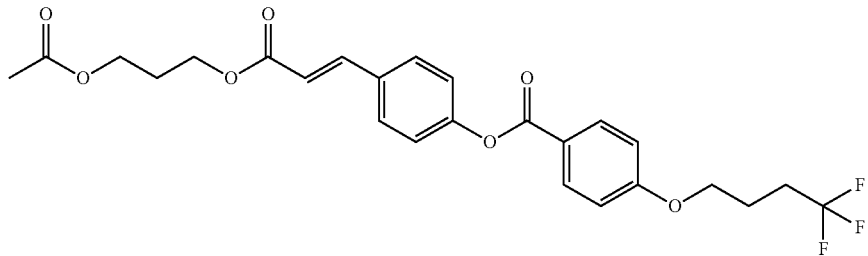
(Z-D17)
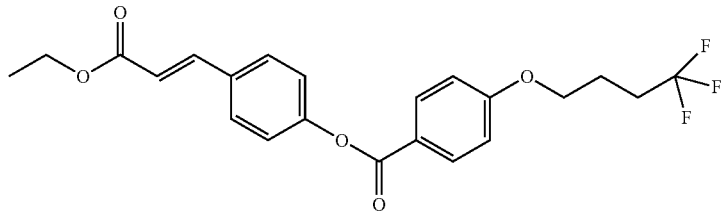

[Chem. 12]

(Z-D18)
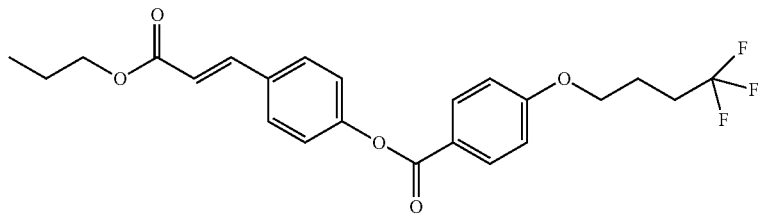

(Z-D19)
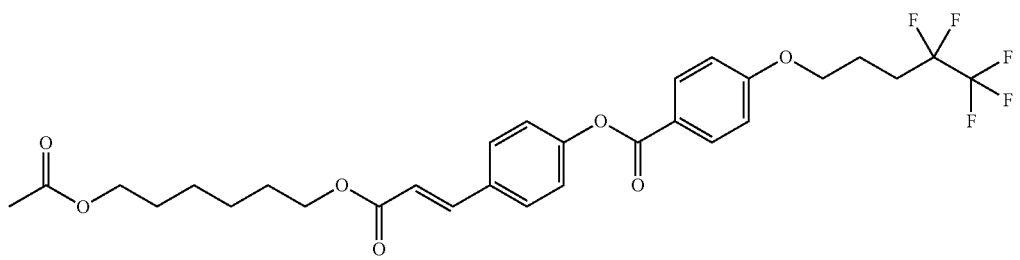

(Z-D20)
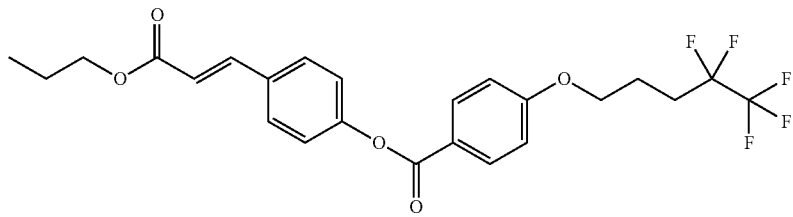

(Z-D21)
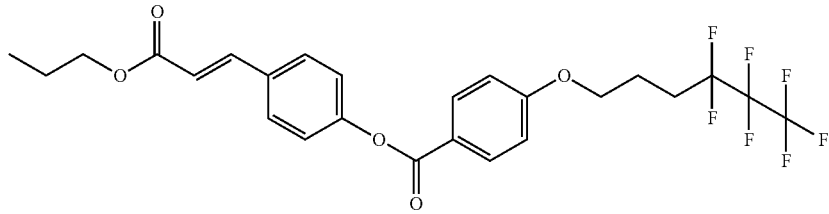

W1 may be any structure containing a spacer linking group that can be chemically bonded to a quantum dot. The spacer linking group may be, for example, an ester group, an amide group, an ether group, or a thiol group. Some or all of the repeating structural units represented by the formula (A-1) may not contain W1.

The quantum dots are each preferably chemically bonded to a polymer constituting the alignment films 22. Specifically, as shown in the following formula (A-2), the carboxyl group of the polyamic acid and the terminal hydroxy group of an organic chain of the quantum dot may be covalently bonded through dehydration condensation.

[Chem. 13]

(A-2)
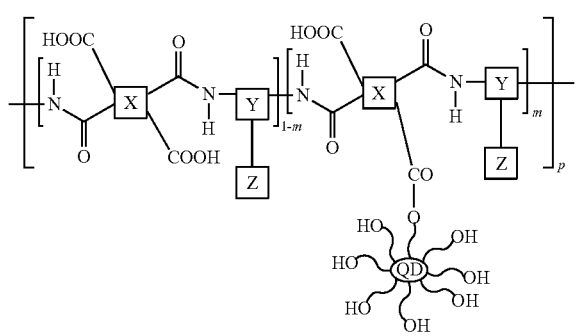

The quantum dots may not be chemically bonded to the polymer constituting the alignment film. For example, the quantum dots may each be bonded to the side chain Z by an intermolecular force as shown in the following formula (A-3) or to a functional group of the main chain by an intermolecular force.

[Chem. 14]

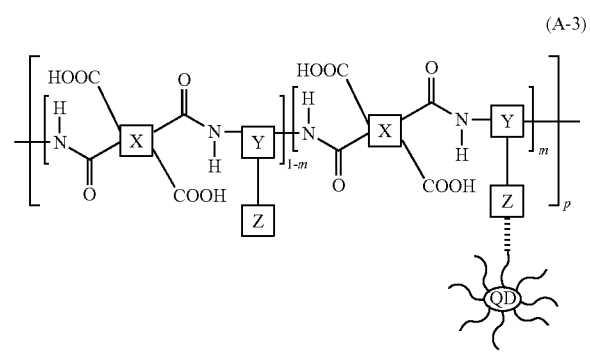

(A-3)

The polyamic acid may be partially imidized. The initial degree of chemical imidization of the polyamic acid is preferably 0% or higher and 50% or lower. The upper limit of the initial degree of chemical imidization of the polyamic acid is preferably 40%. The polyamic acid can be imidized by cyclodehydration using heat or a catalyst.

The polyamic acid preferably has a weight average molecular weight of 2500 or more and 1000000 or less. If the weight average molecular weight is more than 1000000, the alignment film material may have an excessively high viscosity and thus the alignment film 22 may not be formed. The weight average molecular weight can be determined by gel permeation chromatography (GPC).

The polyimide may have a repeating structural unit represented by the following formula (B-1), for example.

[Chem. 15]

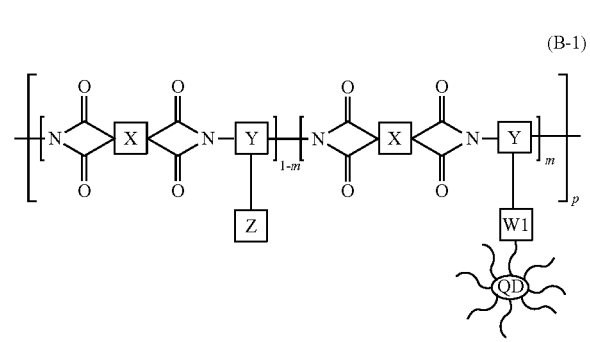

(B-1)

In the formula, m is a real number falling within the range of 0<m≤0.5; and p shows the degree of polymerization and is an integer of 1 or greater.

The polyimide may be obtained by cyclodehydrating (imidizing) a polyamic acid having a repeating structural unit represented by the formula (A-1) using heat or a catalyst. All the repeating structural units represented by the formula (A-1) are preferably imidized, but some of the repeating structural units may not be imidized. The initial degree of chemical imidization of the polyimide is preferably higher than 50%.

Z represents a side chain. Some or all of the repeating structural units represented by the formula (C-1) may not have a side chain Z. Z may additionally contain a horizontal alignment functional group, a vertical alignment functional group, a photo-aligning horizontal alignment functional group, or a photo-aligning vertical alignment functional group. Specific examples of the horizontal alignment functional group include structures represented by the formulas (Z-A1) to (Z-A8). Specific examples of the vertical alignment functional group include structures represented by the formulas (Z-B1) to (Z-B7). Specific examples of the photo-aligning horizontal alignment functional group include structures represented by the formulas (Z-C1) and (Z-C2). Specific examples of the photo-aligning vertical alignment functional groups include structures represented by the formulas (Z-D1) to (Z-D21).

W1 may be any structure containing a spacer linking group that can be chemically bonded to a quantum dot. The spacer linking group may be, for example, an ester group, an amide group, an ether group, or a thiol group. The quantum dots are each preferably chemically bonded to the polymer constituting the alignment film. Some or all of the repeating structural units represented by the formula (B-1) may not contain W1.

The polyimide preferably has a weight average molecular weight of 2500 or more and 1000000 or less. If the weight average molecular weight is more than 1000000, the alignment film material may have an excessively high viscosity and thus the alignment film 22 may not be formed.

The quantum dots may not be chemically bonded to the polymer constituting the alignment film. For example, the quantum dots may each be bonded to the side chain Z by an intermolecular force as shown in the following formula (B-2) or to a functional group of the main chain by an intermolecular force.

[Chem. 16]

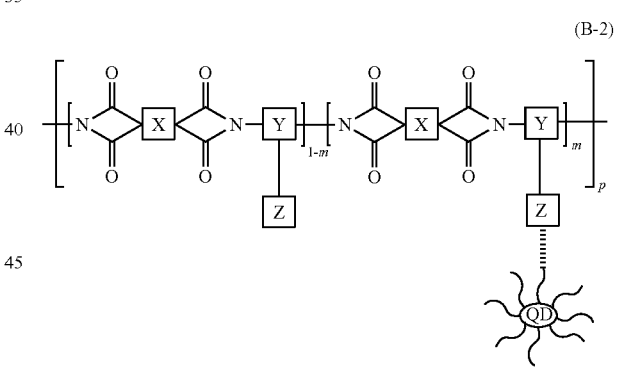

(B-2)

The polysiloxane may have a repeating structural unit represented by the following formula (C-1), for example.

[Chem. 17]

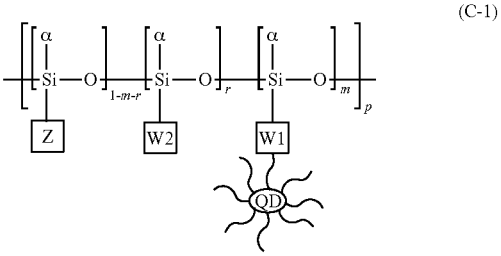

(C-1)

In the formula, α represents a —H group, a —OH group, a methoxy group, or an ethoxy group; and p shows the degree of polymerization and is an integer of 1 or greater.

The reference sign m is preferably a real number falling within the range of 0.001 to 0.5, more preferably a real number falling within the range of 0.01 to 0.05; and r is preferably a real number falling within the range of 0 to 0.7, more preferably a real number falling within the range of 0.05 to 0.5.

Z represents a side chain. Some or all of the repeating structural units represented by the formula (C-1) may not have a side chain Z. Z may additionally contain a horizontal alignment functional group, a vertical alignment functional group, a photo-aligning horizontal alignment functional group, or a photo-aligning vertical alignment functional group. Specific examples of the horizontal alignment functional group include structures represented by the formulas (Z-A1) to (Z-A8). Specific examples of the vertical alignment functional group include structures represented by the formulas (Z-B1) to (Z-B7). Specific examples of the photo-aligning horizontal alignment functional group include structures represented by the formulas (Z-C1) and (Z-C2). Specific examples of the photo-aligning vertical alignment functional groups include structures represented by the formulas (Z-D1) to (Z-D21).

W1 may be any structure containing a spacer linking group that can be chemically bonded to a quantum dot. The spacer linking group may be, for example, an ester group, an amide group, an ether group, or a thiol group. The quantum dots are each preferably chemically bonded to the polymer constituting the alignment film. Some or all of the repeating structural units represented by the formula (C-1) may not contain W1.

Some of the repeating structural units represented by the formula (C-1) may contain a structure terminated with an epoxy group. W2 is preferably a structure terminated with an epoxy group. This is because the polymer constituting the alignment film, when containing an epoxy group, can be chemically bonded to an organic chain of a quantum dot.

Specific examples of the repeating structural unit represented by the formula (C-1) include repeating structural units represented by the following formulas (C-2) and (C-3).

[Chem. 18]

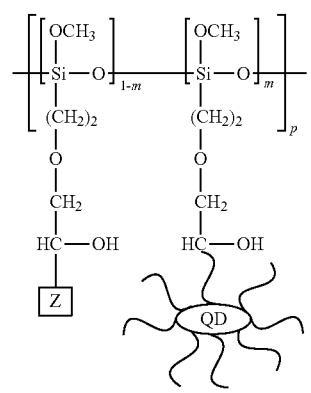

(C-2)

[Chem. 19]

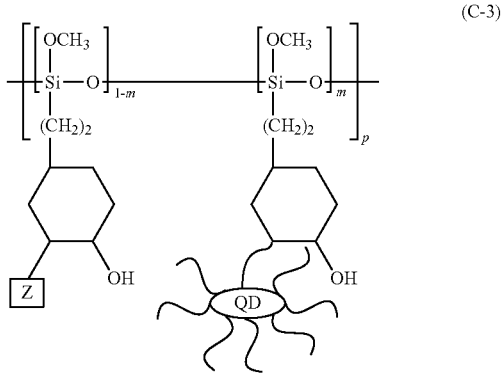

(C-3)

Z represents a structure containing a cinnamate group and represented by the following formula (Z-D13) or (Z-E1).

[Chem. 20]

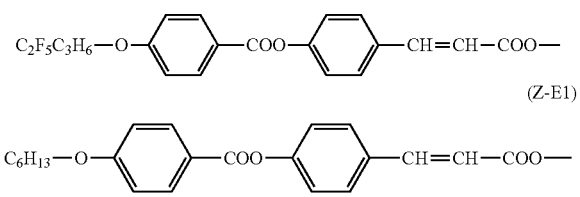

(Z-D13)

(Z-E1)

In the repeating structural unit represented by the formula (C-2), a covalent bond is formed between the epoxy group in the side chain of the polysiloxane and an organic chain (for example, carboxyl group) on the surface of the quantum dot. In the repeating structural unit represented by the formula (C-3), the polysiloxane and the quantum dot are covalently bonded.

Also in the case of the polysiloxane, the quantum dots may not be chemically bonded to the polysiloxane constituting the alignment film and may be bonded to the polysiloxane by an intermolecular force.

In the case where the polymer containing a photoreactive group is a polysiloxane, the polymer preferably has a weight average molecular weight of 2500 or more and 1000000 or less. If the weight average molecular weight is more than 1000000, the alignment film material may have an excessively high viscosity and thus the alignment film 22 may not be formed.

The polyvinyl may have a repeating structural unit represented by the following formula (D-1).

[Chem. 21]

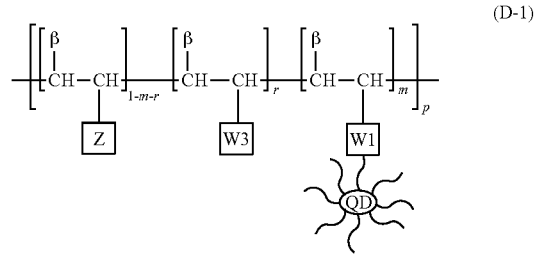

(D-1)

In the formula, β represents a —H group, a —CH₃ group, or a —C₂H₅ group; and p shows the degree of polymerization and is an integer of 1 or greater.

The reference sign m is preferably a real number falling within the range of 0.001 to 0.5, more preferably a real number falling within the range of 0.01 to 0.05; and r is preferably a real number falling within the range of 0 to 0.7, more preferably a real number falling within the range of 0.05 to 0.5.

Z represents a side chain. Some or all of the repeating structural units represented by the formula (D-1) may not have a side chain Z. Z may additionally contain a horizontal alignment functional group, a vertical alignment functional group, a photo-aligning horizontal alignment functional group, or a photo-aligning vertical alignment functional group. Specific examples of the horizontal alignment functional group include structures represented by the formulas (Z-A1) to (Z-A8). Specific examples of the vertical alignment functional group include structures represented by the formulas (Z-B1) to (Z-B7). Specific examples of the photo-aligning horizontal alignment functional group include structures represented by the formulas (Z-C1) and (Z-C2). Specific examples of the photo-aligning vertical alignment functional groups include structures represented by the formulas (Z-D1) to (Z-D21).

W1 may be any structure containing a spacer linking group that can be chemically bonded to a quantum dot. The spacer linking group may be, for example, an ester group, an amide group, an ether group, or a thiol group. The quantum dots are each preferably chemically bonded to the polymer constituting the alignment film. Some or all of the repeating structural units represented by the formula (D-1) may not contain W1.

Some of the repeating structural units represented by the formula (D-1) may contain a structure terminated with a carboxyl group. W3 is preferably a structure terminated with a carboxyl group. This is because the polymer constituting the alignment film, when containing a carboxyl group, can be chemically bonded to an organic chain of a quantum dot.

In the case where the polymer containing a photoreactive group is a polyvinyl, the polymer preferably has a weight average molecular weight of 2500 or more and 1000000 or less. If the weight average molecular weight is more than 1000000, the alignment film material may have an excessively high viscosity and thus the alignment film 22 may not be formed.

Also in the case of the polyvinyl, the quantum dots may be not be chemically bonded to the polyvinyl constituting the alignment film and may be bonded to the polyvinyl by an intermolecular force.

In the case where the polymer represented by any one of the formulas (A-1) to (A-3), (B-1), (B-2), (C-1) to (C-3), and (D-1) contains a photoreactive group, not all the repeating structural units are required to contain a photo-aligning functional group in one molecular chain, and only some of the repeating structural units may contain a photo-aligning functional group. The polymer may have only repeating structural units containing one type of photo-aligning functional groups or may contain repeating structural units containing multiple types of photo-aligning functional groups in one molecule. Also, the polymer may contain a mixture of a polymer chain containing one type of photo-aligning functional groups and a polymer chain containing different types of photo-aligning functional groups.

In the case where the polymer represented by any one of the formulas (A-1) to (A-3), (B-1), (B-2), (C-1) to (C-3), and (D-1) has a side chain in only some of the repeating structural units and no side chain in the other structural units, the arrangement of these structural units may be any arrangement. For example, the structural units with a side chain and the structural units with no side chain may be arranged alternately or randomly, or the structural units with a side chain or the structural units with no side chain may be arranged consecutively in blocks.

The alignment film 22 may further contain components other than the polymer and the quantum dots. Examples of the other components include curing agents, curing accelerators, and catalysts. The alignment film 22 may contain, as well as the aforementioned polymer, a common alignment film polymer not containing any of the photo-aligning functional groups and the vertical or horizontal alignment functional groups, for example, in terms of better solution characteristics of the alignment film material and better electrical characteristics of the alignment film.

The display mode of the liquid crystal display device is preferably the twisted nematic (TN) mode, the in-plane switching (IPS) mode, the fringe field switching (FFS) mode, the electrically controlled birefringence (ECB) mode, the multi-domain vertical alignment (MVA) mode, or the 4 domain reverse twisted nematic (4D-RTN) mode.

In the TN mode, pixel electrodes are disposed on one of the paired substrates 21 and a common electrode is disposed on the other of the paired substrates 21, so that a vertical electric field is generated in the liquid crystal layer 23. The alignment films 22 on the paired substrates 21 are horizontal alignment films which perform alignment treatment to provide a twist angle of 90° to liquid crystal molecules with no voltage applied.

In the FFS mode, a structure (FFS electrode structure) including a planar electrode, a slit electrode, and an insulating film disposed between the planar electrode and the slit electrode is disposed on at least one of the paired substrates 21, so that an oblique electric field (fringe electric field) is generated in the liquid crystal layer 23. Typically, the slit electrode, the insulating film, and the planar electrode are disposed in the given order from the liquid crystal layer 23 side. The slit electrode can be, for example, an electrode provided with linear slits surrounded entirely by the electrode portions, or a comb electrode including comb teeth with linear cuts (slits) between the comb teeth.

In the IPS mode, paired comb electrodes are disposed on at least one of the paired substrates 21, so that a transverse electric field is generated in the liquid crystal layer 23. The paired comb electrodes can be, for example, paired electrodes that are each provided with comb teeth and disposed such that the comb teeth of the electrodes mesh with each other.

In the ECB mode, birefringence of nematic liquid crystal having positive anisotropy of dielectric constant is utilized. The retardation is changed by voltage application to liquid crystal molecules, and with this effect in combination with a retardation film, the liquid crystal layer is controlled to be light transmissive or non-transmissive. Thereby, an image is displayed.

In the MVA mode, pixel electrodes are disposed on one of the paired substrates 21 and a common electrode is disposed on the other of the paired substrates 21, so that a vertical electric field is generated in the liquid crystal layer 23. Alignment controlling components such as slits or ribs are provided to at least one of the paired substrates 21 to control the alignment direction of liquid crystal molecules and divide the alignment into multiple domains.

In the 4D-RTN mode, the alignment azimuth of liquid crystal molecules in the TN mode is divided into four domains. The treatment on the alignment film divides the alignment in four azimuths, with any two of the four azimuths being different by an angle substantially equal to an integer multiple of 90°.

In the liquid crystal panel 20 of the present embodiment, usually, the paired substrates 21 are bonded to each other with a sealant (not illustrated) provided to surround the liquid crystal layer 23 such that the liquid crystal layer 23 is kept in the given region. The sealant can be, for example, an epoxy resin containing a curing agent and an inorganic or organic filler.

On the surface of each of the paired substrates 21 remote from the liquid crystal layer 23 may be disposed a polarizer (linear polarizer). Typical examples of the polarizer include those obtained by aligning a dichroic anisotropic material such as an iodine complex adsorbed on a polyvinyl alcohol (PVA) film. Generally, each surface of the PVA film is laminated with a protective film such as a triacetyl cellulose film before the film is put into practical use. An optical film such as a retardation film may be disposed between the polarizer and each of the paired substrates 21.

Figure 1:
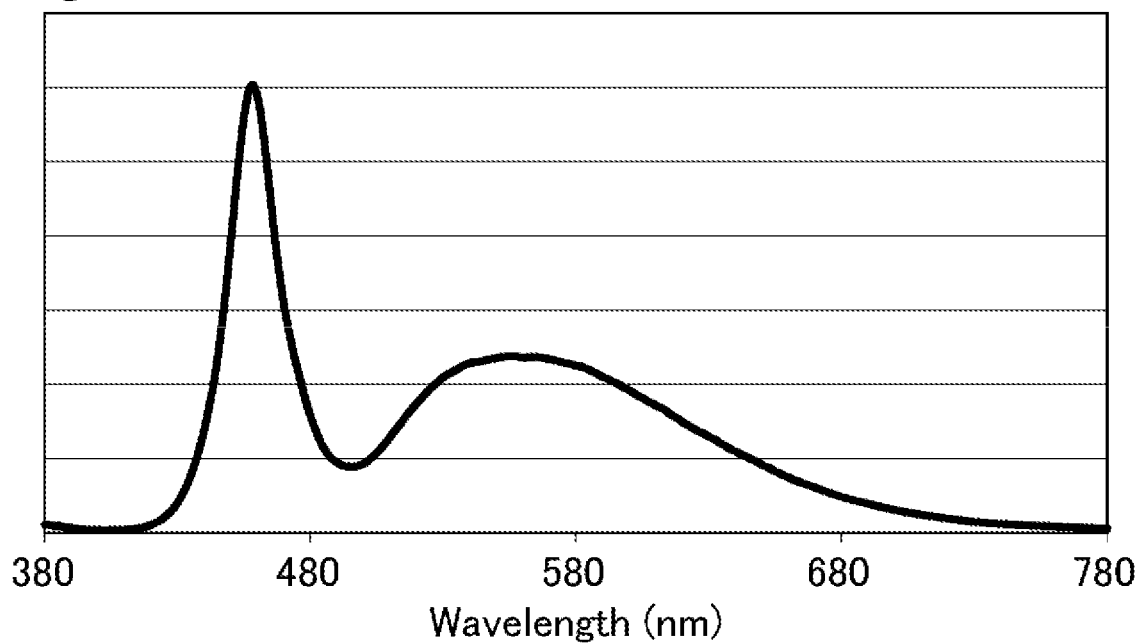
FIG. 1 is a graph of an emission spectrum in the case of adding no quantum dots to an alignment film.
Figure 2:
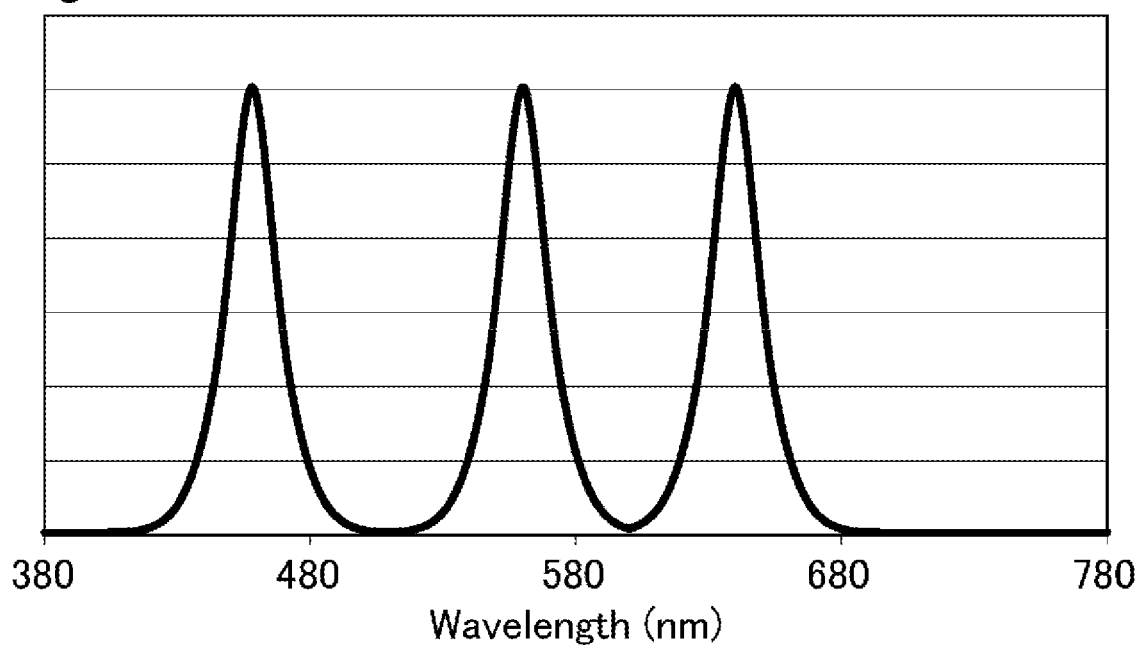
FIG. 2 is a graph of an emission spectrum in the case of adding quantum dots to an alignment film.

As shown in FIG. 1, the liquid crystal display device of the present embodiment includes the backlight 10 behind the liquid crystal panel. A liquid crystal display device having such a configuration is typically called a transmissive liquid crystal display device. The backlight 10 may be any backlight that emits light including visible light, and may be one that emits light including only visible light or emits light including both visible light and ultraviolet light. In order to enable the liquid crystal display device to provide color display, the backlight 10 preferably emits white light. The backlight 10 preferably utilizes a light emitting diode (LED), for example. The term "visible light" as used herein means light (electromagnetic waves) having a wavelength of 380 nm or longer and shorter than 800 nm.

The liquid crystal display device of the present embodiment preferably includes a backlight utilizing a blue light emitting diode. In the case where the backlight 10 utilizes a pseudo-white light emitting diode which emits white light using a blue light emitting diode emitting near-ultraviolet rays and a fluorescent substance such as YAG, the emitted light includes near-ultraviolet rays. In this case, the components constituting the liquid crystal panel, such as the alignment films and the liquid crystal material, easily generate radicals, so that long-term use of the display causes a VHR decrease, leading to image sticking. Since the liquid crystal display device of the present embodiment utilizes the alignment films 22 containing quantum dots, the device can convert light in the near-ultraviolet to blue spectral range in backlight illumination emitted by the backlight including a blue light emitting diode into light in the green to red spectral range, more effectively reducing generation of image sticking.

The liquid crystal display device of the present embodiment has a structure including, as well as the liquid crystal panel 20 and the backlight 10, components such as external circuits, including a tape-carrier package (TCP) and a printed circuit board (PCB); optical films, including a viewing angle-increasing film and a luminance-increasing film; and a bezel (frame). Some components may be incorporated into another component. In addition to the components described above, the liquid crystal display device may include any components that are usually used in the field of liquid crystal display devices. The detailed description for each of these additional components is therefore not provided herein.

Another aspect of the present invention may be an alignment film for use in controlling the initial alignment of liquid crystal in a liquid crystal display device, the alignment film containing quantum dots. The configuration of the alignment film is the same as that of the alignment films 22, and thus the detailed description for the alignment film is not provided herein.

An embodiment of the present invention has been described above. Each and every detail described above is applicable to all the aspects of the present invention.

The present invention is described in more detail based on the following examples and comparative examples. The present invention, however, is not limited to these examples.

Synthetic Example 1

In Synthetic Example 1, a horizontal photo-alignment film material was synthesized in which the main chain was derived from a polyamic acid and which was chemically bonded to quantum dots.

In Synthetic Example 1, toluene was used as a dispersion medium and a fluorescent material (available from Sigma-Aldrich Japan, CdSe/ZnS 480) was used as a dispersoid. The fluorescent material contained core-shell-type (CdSe/ZnS) quantum dots (the following structure (1)) obtained by coating colloidal particles of CdSe with ZnS. The quantum dots had hexadecylamine (HDA) introduced thereon as a capping agent. The quantum dots had an emission peak wavelength of 520 nm. The colloidal particles had a particle size of 2.5 nm. The fluorescent material had a solids content of 5 mg/mL.

As shown in the following reaction formula, the fluorescent material (5 mL) containing the quantum dots was added to tetrahydrofuran (THF) (50 mL). Into the mixture was slowly dropped a solution of an excessive amount (0.3 g) of 3-mercapto-1-propanol in THF, so that a precipitate was formed. The precipitate was collected by filtration and washed with THF for replacement of the capping agent. Thereby, quantum dots (12 mg) represented by the following structure (2) were obtained. The quantum dots represented by the following structure (2) had a core-shell structure (CdSe/ZnS) with the colloidal particles of CdSe coated with ZnS, and had organic chains each terminated with a hydroxy group on the ZnS-coated surface.

[Chem. 22]

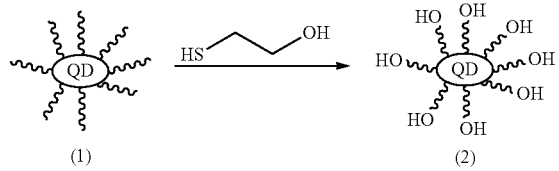

Into a 1-methyl pyrrolidone solution (20 mL) containing a polyamic acid (2 g, the following structure (3)) was dropped a 1-methyl pyrrolidone solution (5 mL) containing the obtained CdSe quantum dots (100 mg, the following structure (2)) having organic chains each terminated with a hydroxy group. A 1-methyl pyrrolidone solution (5 mL) containing N,N'-dicyclohexylcarboxyimide (DCC, 100 mg) and triethylamine (TEA, 100 mg) was then dropped into the solution and reacted in a nitrogen atmosphere at 60° C. for 24 hours.

A sodium hydroxide solution was then dropped into the solution to turn the unreacted carboxyl groups into a sodium carboxylate salt, whereby a precipitate was formed. The precipitate was collected with an evaporator. The collected precipitate was then dissolved and reprecipitated in methanol (poor solvent) and water (good solvent). Thereby, a polymer (the following structure (4)) modified with quantum dots was obtained. The sodium carboxylate salt was decomposed back to carboxylic acid by cation exchange chromatography. Thereby, the target horizontal photo-alignment film material (the following structure (5)) was obtained.

[Chem. 23]

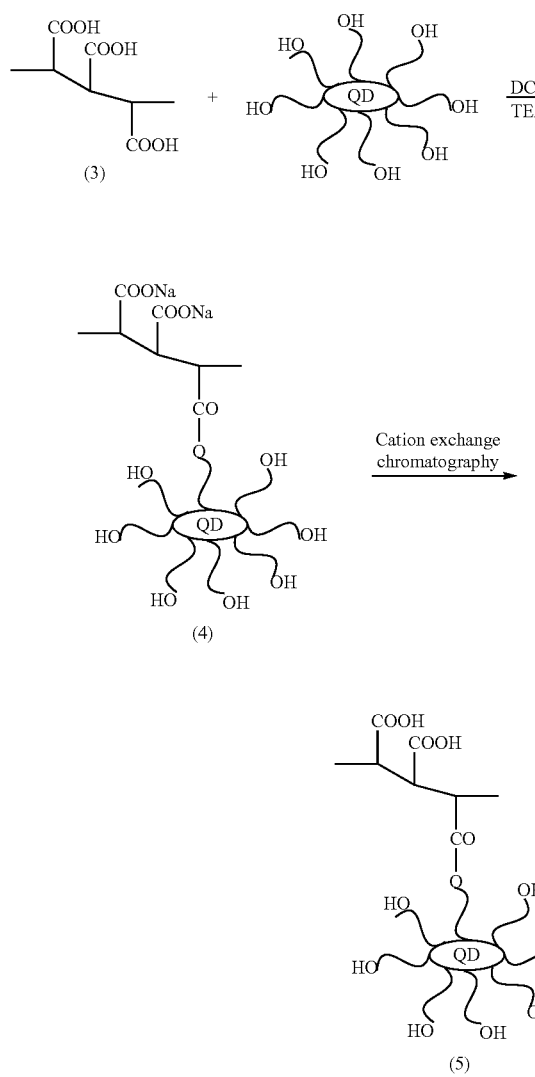

[Chem. 24]

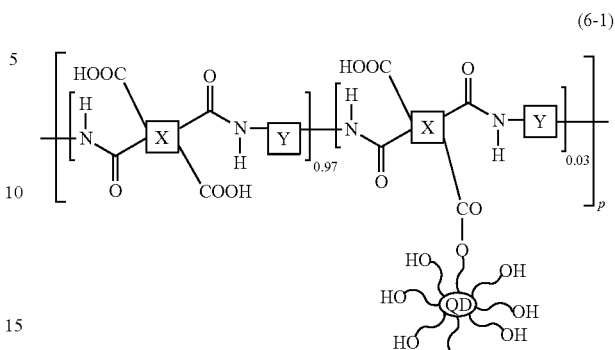

In the formula, p shows the degree of polymerization and is an integer of 1 or greater.

[Chem. 25]

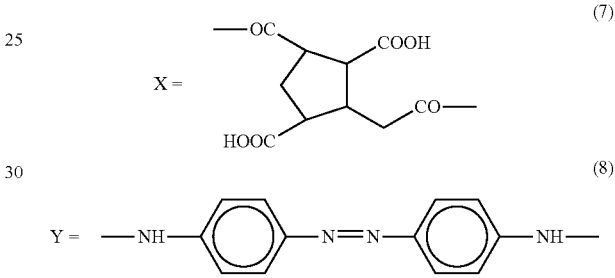

Synthetic Example 2

In Synthetic Example 2, a vertical alignment film material was synthesized in which the main chain was derived from a polyamic acid and which was bonded to quantum dots by an interaction.

In Synthetic Example 2, toluene was used as a dispersion medium and a fluorescent material (available from Sigma-Aldrich Japan, #662437) was used as a dispersoid. The fluorescent material contained core-type quantum dots (the following structure (10)) which were colloidal particles of CdSe. The quantum dots had hexadecylamine (HDA) introduced thereon as a capping agent. The quantum dots had an emission peak wavelength of 520 nm. The colloidal particles had a particle size of 2.5 nm. The fluorescent material had a solids content of 5 mg/mL. The polyamic acid used was a polyamic acid represented by the following formula (9). The polyamic acid represented by the following formula (9) had a structure represented by the following formula (12) as X, a structure represented by the following formula (13) as Y, and a steroidal vertical alignment side chain represented by the following formula (14) as Z.

As shown in the following reaction formula, the fluorescent material (10 mL) containing the quantum dots was added to a NMP/γ-butyrolactone mixed solution (10 mL) containing the polyamic acid (2 g). The solvent was then concentrated using an evaporator to remove toluene, whereby a vertical alignment film material containing a polymer represented by the following formula (11) was obtained.

The obtained horizontal photo-alignment film material contained a polymer represented by the following formula (6-1). In the following formula (6-1), X was the structure represented by the following formula (7) and Y was the structure represented by the following formula (8). The terminal hydroxy group in an organic chain on the surface of the quantum dot was bonded to the carboxyl group in the polyamic acid by an ester bond.

In the following formula (11), X was the structure represented by the following formula (12), Y was the structure represented by the following formula (13), and Z was the structure represented by the following formula (14). The hexadecyl group on the surface of the quantum dot and the steroidal skeleton in the side chain of the polyamic acid were bonded by an intermolecular force (hydrophobic interaction). The polymer represented by the following formula (11) had a unit containing the vertical alignment functional group represented by the following formula (14) and the quantum dot. In the following formulas (9) and (11), p shows the degree of polymerization and is an integer of 1 or greater.

[Chem. 26]

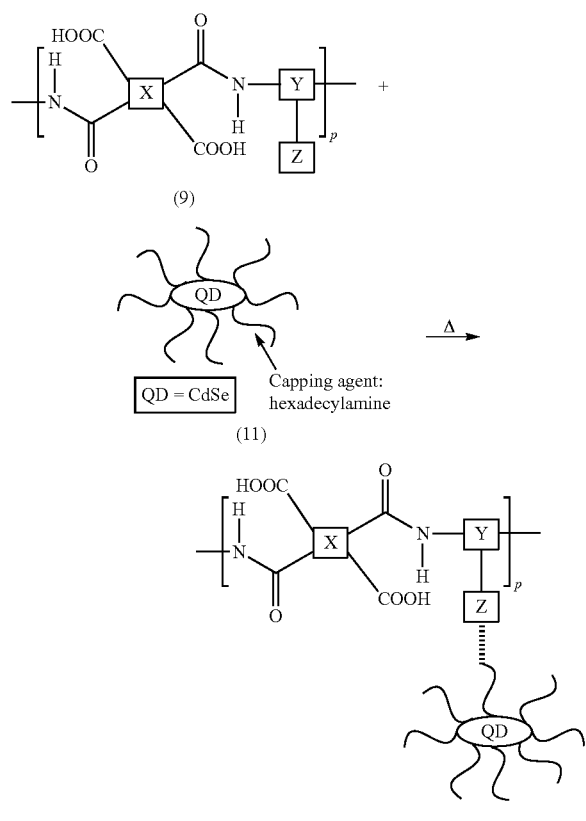

[Chem. 27]

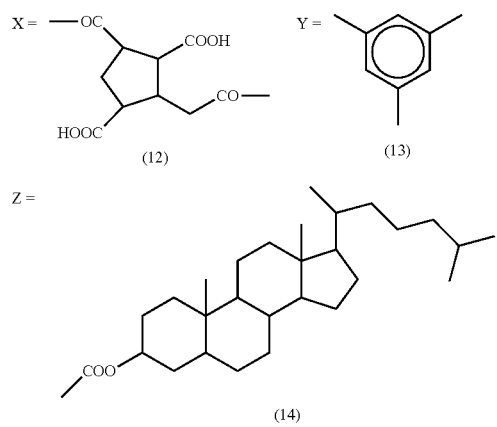

Synthetic Example 3

In Synthetic Example 3, a vertical photo-alignment film material was synthesized in which the main chain was derived from a polysiloxane and which was chemically bonded to quantum dots.

In Synthetic Example 3, toluene was used as a dispersion medium and a fluorescent material (available from Sigma-Aldrich Japan) was used as a dispersoid. The fluorescent material contained core-type quantum dots (the following structure (16)) which were colloidal particles of CdSe. The quantum dots had a carboxyl group introduced thereon as a capping agent. The quantum dots had an emission peak wavelength of 520 nm. The colloidal particles had a particle size of 2.5 nm. The fluorescent material had a solids content of 5 mg/mL. The polysiloxane used was a polysiloxane represented by the following formula (15). The polysiloxane represented by the following formula (15) has the photo-aligning vertical alignment side chain containing a cinnamate group and represented by the following formula (18) as Z.

As shown in the following reaction formula, the fluorescent material (10 mL) containing the quantum dots was dropped into a toluene solution (10 mL) containing the polysiloxane (2 g), and the mixture was reacted at 70° C. for five hours. After completion of the reaction, the resulting precipitate was dissolved and reprecipitated in ether (poor solvent) and NMP (good solvent). Thereby, a vertical photo-alignment film material was obtained containing a polymer represented by the following formula (17) modified with about 25 mol % quantum dots. In the following formulas (15) and (17), p shows the degree of polymerization and is an integer of 1 or greater.

In the following formula (17), Z was the structure represented by the following formula (18). The terminal carboxyl group of an organic chain on the surface of the quantum dot and the epoxy group of the polysiloxane were bonded by an ester bond.

[Chem. 28]

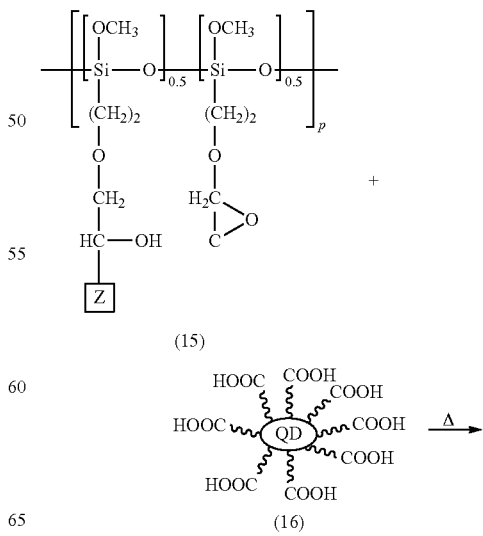

-continued

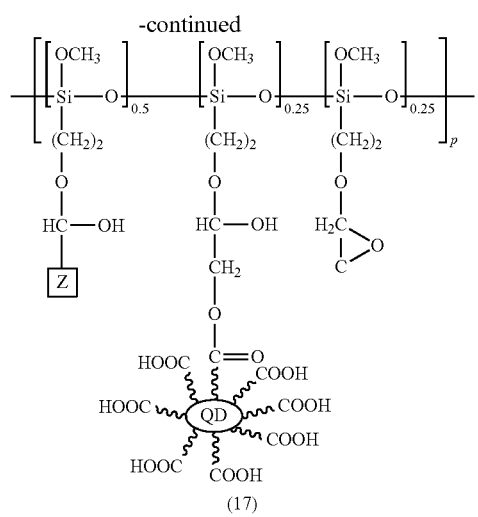

(17)

[Chem. 29]

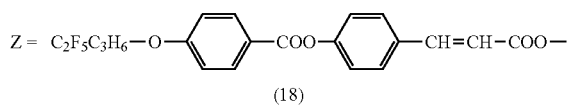

(18)

Example 1-1

An in-plane switching (IPS)-mode liquid crystal display device was actually produced by the following method.

First, a TFT substrate including components such as TFTs and IPS electrode structures as shown in FIG. 4 and a color filter substrate (CF substrate) not including any electrode and including components such as a black matrix and color filters were prepared.

To the surface of each of the TFT substrate and the CF substrate was applied the horizontal photo-alignment film material obtained in Synthetic Example 1. The substrates were pre-baked at 60° C. for 90 seconds. The alignment film material applied to the surfaces of the substrates was irradiated with linearly polarized ultraviolet light having a dominant wavelength of 365 nm with an intensity of 2 J/cm² (photo-alignment treatment). Application of linearly polarized ultraviolet light caused trans-cis isomerization of the azobenzene structure, imparting alignment-controlling force to the alignment film material. The substrates were then post-baked at 230° C. for 40 minutes. Upon the post-baking, the polyamic acid structure was partially imidized (cyclodehydrated) and thus formed into a polyimide structure. Thereby, horizontal photo-alignment films having sufficient alignment-controlling force owing to photo-irradiation were obtained. Each post-baked alignment film had a thickness of 100 nm.

The obtained horizontal photo-alignment films had a structure represented by the following formula (6-1). In the following formula (6-1), X was the structure represented by the following formula (7) and Y was the structure represented by the following formula (8).

[Chem. 30]

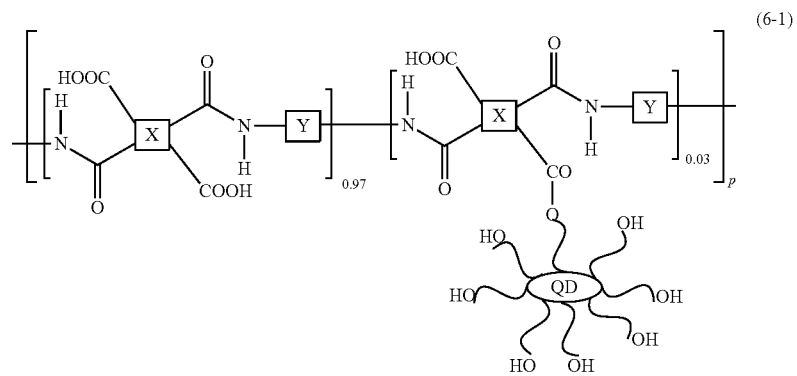

(6-1)

[Chem. 31]

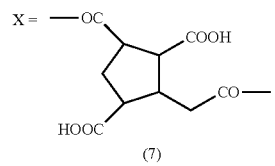

(7)

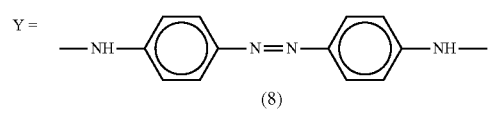

(8)

In the polymer represented by the formula (6-1), the main chain was derived from a polyamic acid, and the terminal hydroxy group of an organic chain on the surface of the quantum dot and the carboxyl group of the polyamic acid were bonded by an ester bond. The polymer represented by the formula (6-1) was a copolymer of a unit containing the photo-aligning functional group (azobenzene group) represented by the formula (8) and the horizontal alignment functional group (—H) and a unit containing the photo-aligning functional group represented by the formula (8), the horizontal alignment functional group (—H), and the quantum dot.

To one of the substrates was applied an ultraviolet-curable sealant (Sekisui Chemical Co., Ltd., trade name: Photolec S-WB) in a predetermined pattern using a dispenser. Onto the predetermined positions of the other substrate was dropped a liquid crystal composition containing liquid crystal molecules having negative anisotropy of dielectric constant ($\Delta\varepsilon=-3.7$). The substrates were bonded to each other in a vacuum, and the sealant was cured by ultraviolet light. The substrates were then heated at 130° C. for 40 minutes and subjected to realignment treatment such that the liquid crystal transformed into an isotropic phase, followed by cooling down to room temperature.

To the respective back side (backlight illumination incident surface) of the TFT substrate and viewer side (backlight illumination emitting surface) of the CF substrate were attached paired polarizing plates such that the polarization axes were in crossed Nicols, whereby a liquid crystal panel was produced. A backlight including a pseudo-white LED was mounted behind the liquid crystal panel, so that a liquid crystal display device of Example 1-1 was completed.

Example 1-2

A liquid crystal display device of Example 1-2 was produced as in Example 1-1, except that quantum dots having a different emission peak wavelength and a different particle size were used.

A horizontal photo-alignment film material was synthesized as in Synthetic Example 1, except that core-shell-type (CdSe/ZnS) quantum dots (available from Sigma-Aldrich Japan, #662488) were used which were obtained by coating colloidal particles of CdSe with ZnS and had hexadecylamine (HDA) introduced thereon as a capping agent, the quantum dots had an emission peak wavelength of 610 nm, and the colloidal particles had a particle size of 5.0 nm. A liquid crystal display device of Example 1-2 was produced as in Example 1-1 using the obtained horizontal photo-alignment film material.

Comparative Example 1

A liquid crystal display device of Comparative Example 1 was produced as in Example 1-1, except that a fluorescent material containing quantum dots was not added.

<High-Temperature Test on Backlight>

In order to evaluate the heat resistance of the IPS-mode liquid crystal cells produced in Examples 1-1, 1-2, and Comparative Example 1, each liquid crystal cell was left to stand on a backlight in a turn-on state for 5000 hours, with the temperature of the liquid crystal cell increased to 75° C. The voltage holding ratio (VHR) and the contrast ratio were determined before and after the test. The results are shown in the following Table 2. The VHR was determined at 1 V and 70° C. using a VHR measurement system Model 6254 (Toyo Corp.). The contrast ratio was determined at 25° C. using the spectrophotometer SR-UL1R available from Topcon Technohouse Corporation.

TABLE 2

| | Before test | | After 5000-hour test | |
|---|---|---|---|---|
| | VHR (%) | Contrast ratio | VHR (%) | Contrast ratio |
| Example 1-1 | 99.5 | 1500 | 97.1 | 1300 |
| Example 1-2 | 99.5 | 1500 | 97.2 | 1300 |
| Comparative Example 1 | 99.5 | 1500 | 86.5 | 800 |

As shown in Table 2, the VHR and the contrast ratio significantly decreased after the high-temperature test in Comparative Example 1 in which no quantum dot was introduced into the alignment film material. This is presumably because under the ultraviolet rays in light from the backlight including a blue LED as a light source, radicals were generated from the aromatic ring and the alkoxy group in the negative liquid crystal component, turned into impurity ions, and dissolved into the liquid crystal layer. In contrast, in Examples 1-1 and 1-2 in which quantum dots were chemically bonded to the alignment film material, a comparatively high VHR and a comparatively high contrast ratio were achieved even after the high temperature test on the backlight. This is presumably because the ultraviolet rays in the backlight illumination were converted into low energy visible light by the quantum dots, and thus generation of radicals from the negative liquid crystal was reduced.

Example 2-1

A fringe field switching (FFS)-mode liquid crystal display device was actually produced by the following method. First, a TFT substrate including components such as TFTs and an FFS electrode structure as shown in FIG. 4 and a color filter substrate (CF substrate) not including any electrode and including components such as a black matrix and color filters were prepared.

A horizontal photo-alignment film material was synthesized as in Synthetic Example 1, except that core-type quantum dots (available from Sigma-Aldrich Japan) were used which were colloidal particles of InP and had hexadecylamine (HDA) introduced thereon as a capping agent, the quantum dots had an emission peak Wavelength of 530 nm, and the colloidal particles had a particle size of 2.7 nm.

Horizontal photo-alignment films were formed on the surfaces of the respective TFT substrate and CF substrate as in Example 1-1 using the obtained horizontal photo-alignment film material. Each post-baked alignment film had a thickness of 100 nm. A liquid crystal panel was produced as in Example 1-1 and a backlight including a pseudo-white LED was mounted behind the liquid crystal panel, so that a liquid crystal display device of Example 2-1 was completed.

Example 2-2

A liquid crystal display device of Example 2-2 was produced as in Example 2-1, except that quantum dots having a different emission peak wavelength and a different particle size were used.

A horizontal photo-alignment film material was synthesized as in Synthetic Example 1, except that core-type quantum dots (available from Sigma-Aldrich Japan) were used which were colloidal particles of InP and had hexadecylamine (HDA) introduced thereon as a capping agent, the quantum dots had an emission peak wavelength of 600 nm, and the colloidal particles had a particle size of 5.4 nm. A liquid crystal display device of Example 2-2 was produced as in Example 2-1 using the obtained horizontal photo-alignment film material.

Comparative Example 2

A liquid crystal display device of Comparative Example 2 was produced as in Example 2-1, except that a fluorescent material containing quantum dots was not added.
<High-Temperature Test on Backlight>
The same evaluation test as in Example 1-1 was performed on the FFS-mode liquid crystal cells produced in Examples 2-1 and 2-2 and Comparative Example 2. The results are shown in the following Table 3.

TABLE 3

|  | Before test | | After 5000-hour test | |
| --- | --- | --- | --- | --- |
|  | VHR (%) | Contrast ratio | VHR (%) | Contrast ratio |
| Example 2-1 | 99.5 | 1500 | 96.8 | 1280 |
| Example 2-2 | 99.5 | 1500 | 96.5 | 1250 |
| Comparative Example 2 | 99.5 | 1500 | 86.5 | 800 |

As shown in Table 3, the VHR and the contrast ratio significantly decreased after the high-temperature test in Comparative Example 2 in which no quantum dot was introduced into the alignment film material. In contrast, in Examples 2-1 and 2-2 in which quantum dots were chemically bonded to the alignment film material, a comparatively high VHR and a comparatively high contrast ratio were achieved even after the high temperature test on the backlight. The results show that an alignment film containing quantum dots can reduce a decrease in VHR and contrast ratio. Also, comparison of Examples 1-1 and 1-2 with Examples 2-1 and 2-2 shows that any quantum dots whose absorption wavelength includes the ultraviolet wavelength range and whose emission wavelength is in the visible light range (500 nm or longer), regardless of their atomic species and composition, can improve the reliability in reducing a decrease in VHR and contrast ratio.

Example 3-1

A fringe field switching (FFS)-mode liquid crystal display device was actually produced by the following method. First, a TFT substrate including components such as TFTs and FFS electrode structures as shown in FIG. 4 and a color filter substrate (CF substrate) not including any electrode and including components such as a black matrix and color filters were prepared.

The horizontal photo-alignment film material used was obtained by adding quantum dots to a polyamic acid containing an azobenzene group as a photo-functional group. The quantum dots used were core-shell-type (CdSe/ZnS) quantum dots (available from Sigma-Aldrich Japan, #694649) which were obtained by coating colloidal particles of CdSe with ZnS and had hexadecylamine (HDA) introduced thereon as a capping agent. The quantum dots had an emission peak wavelength of 530 nm. The colloidal particles had a particle size of 3.3 nm.

Horizontal photo-alignment films were formed on the surfaces of the respective TFT substrate and CF substrate as in Example 1-1 using the horizontal photo-alignment film material. Each post-baked alignment film had a thickness of 100 nm.

The obtained horizontal photo-alignment films had a structure represented by the following formula (6-2). In the following formula (6-2), X was the structure represented by the following formula (7) and Y was the structure represented by the following formula (8).

[Chem. 32]

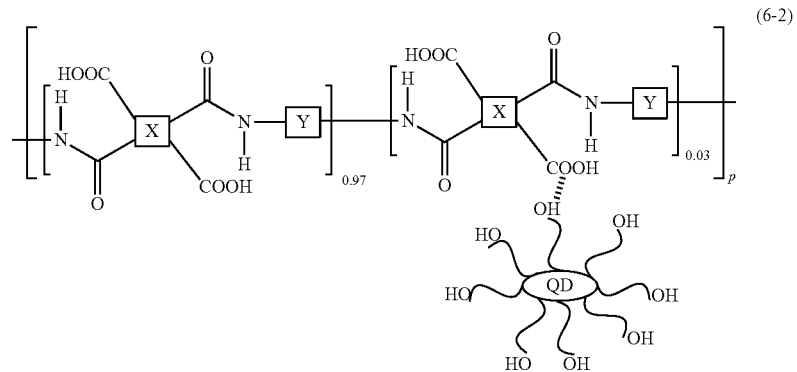

(6-2)

[Chem. 33]

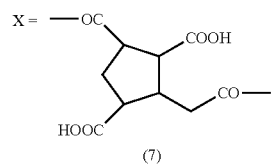

(7)

Y = 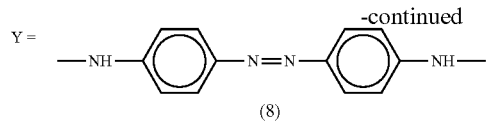
(8)

In the polymer represented by the formula (6-2), the main chain was derived from a polyamic acid, and the terminal hydroxy group of an organic chain on the surface of the quantum dot and the carboxyl group of the polyamic acid were bonded by an intermolecular force (hydrogen bond). The polymer represented by the formula (6-2) was a horizontal alignment polymer formed of a copolymer of a unit containing the photo-aligning functional group (azobenzene group) represented by the formula (8) and a unit containing the photo-aligning functional group represented by the formula (8) and the quantum dot.

A liquid crystal panel was then produced as in Example 1-1. A backlight including a pseudo-white LED was mounted behind the liquid crystal panel, so that a liquid crystal display device of Example 3-1 was completed.

Example 3-2

A liquid crystal display device of Example 3-2 was produced as in Example 3-1, except that quantum dots having a different emission peak wavelength and a different particle size were used.

The quantum dots used were core-shell-type (CdSe/ZnS) quantum dots (available from Sigma-Aldrich Japan) which were obtained by coating colloidal particles of CdSe with ZnS and had hexadecylamine (HDA) introduced thereon as a capping agent. The quantum dots had an emission peak wavelength of 610 nm. The colloidal particles had a particle size of 5.2 nm. A horizontal alignment film material was obtained by adding the quantum dots to a polyamic acid containing an azobenzene group as a photo-functional group as in Example 3-1. A liquid crystal display device of Example 3-2 was produced as in Example 3-1 using the obtained horizontal photo-alignment film material.

Comparative Example 3

A liquid crystal display device of Comparative Example 3 was produced as in Example 3-1, except that a fluorescent material containing quantum dots was not added.
<High-Temperature Test on Backlight>
The same evaluation test as in Example 1-1 was performed on the FFS-mode liquid crystal cells produced in Examples 3-1 and 3-2 and Comparative Example 3. The results are shown in the following Table 4.

TABLE 4

|  | Before test | | After 5000-hour test | |
| --- | --- | --- | --- | --- |
|  | VHR (%) | Contrast ratio | VHR (%) | Contrast ratio |
| Example 3-1 | 99.5 | 1500 | 97.5 | 1350 |
| Example 3-2 | 99.5 | 1500 | 97.3 | 1310 |
| Comparative Example 3 | 99.5 | 1500 | 86.5 | 800 |

As shown in Table 4, the VHR and the contrast ratio significantly decreased after the high-temperature test in Comparative Example 3 in which no quantum dot was introduced into the alignment film material. In contrast, in Examples 3-1 and 3-2 in which quantum dots were bonded to the alignment film material by an intermolecular force (hydrogen bond), a comparatively high VHR and a comparatively high contrast ratio were achieved even after the high temperature test on the backlight. The results show that an alignment film containing quantum dots can reduce a decrease in VHR and contrast ratio. Also, comparison of Examples 1-1 and 1-2 with Examples 3-1 and 3-2 shows that the polymer constituting the alignment films and quantum dots can improve the reliability in reducing a decrease in VHR and contrast ratio regardless of whether they are bonded by a chemical bond or by an intermolecular force. The comparison also shows that any quantum dots whose absorption wavelength includes the ultraviolet wavelength range and whose emission wavelength is in the visible light range (500 nm or longer), regardless of their atomic species and composition, can improve the reliability.

Example 4-1

A multi-domain vertical alignment (MVA)-mode liquid crystal display device was actually produced by the following method. First, a TFT substrate including components such as TFTs and pixel electrodes as shown in FIG. 3 and a color filter substrate (CF substrate) including a counter electrode with slits, a black matrix, and color filters were prepared.

To the surface of each of the TFT substrate and the CF substrate was applied the vertical alignment film material obtained in Synthetic Example 2. The substrates were pre-baked at 90° C. for 5 minutes, and then post-baked at 200° C. for 40 minutes. The post-baking caused partial imidization (cyclodehydration) of the polyamic acid structure, and the polyamic acid was thus formed into a polyimide structure. Each post-baked alignment film had a thickness of 100 nm.

The obtained vertical alignment film contained a polymer represented by the following formula (11). In the following formula (11), X was the structure represented by the following formula (12), Y was the structure represented by the following formula (13), and Z was the structure represented by the following formula (14).

[Chem. 34]

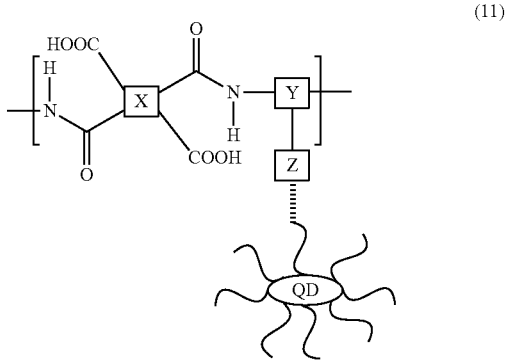
(11)

[Chem. 35]

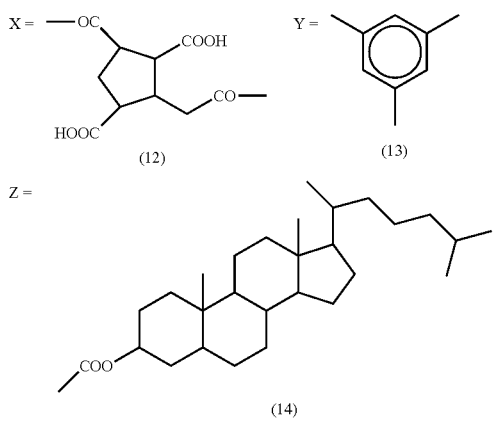

In the polymer represented by the formula (11), the main chain was derived from a polyamic acid, and a hexadecyl group on the surface of the quantum dot and the steroidal skeleton in the side chain of the polyamic acid were bonded by an intermolecular force (hydrophobic interaction). The polymer represented by the formula (11) had a unit containing the photo-aligning vertical alignment functional group (steroidal skeleton) represented by the formula (14) and the quantum dots.

A liquid crystal panel was then produced as in Example 1-1, and a backlight including a pseudo-white LED was mounted behind the liquid crystal panel, so that a liquid crystal display device of Example 4-1 was completed.

Example 4-2

A liquid crystal display device of Example 4-2 was produced as in Example 4-1, except that quantum dots having a different emission peak wavelength and a different particle size were used.

A vertical alignment film material was synthesized as in Synthetic Example 2, except that core-type quantum dots (available from Sigma-Aldrich Japan, #662488) were used which were colloidal particles of CdSe and had hexadecylamine (HDA) introduced thereon as a capping agent, the quantum dots had an emission peak wavelength of 610 nm, and the colloidal particles had a particle size of 5.0 nm. A liquid crystal display device of Example 4-2 was produced as in Example 4-1 using the obtained vertical alignment film material.

Comparative Example 4

A liquid crystal display device of Comparative Example 4 was produced as in Example 4-1, except that a fluorescent material containing quantum dots was not added.

<High-Temperature Test on Backlight>

The same evaluation test as in Example 1-1 was performed on the MVA-mode liquid crystal cells produced in Examples 4-1 and 4-2 and Comparative Example 4. The results are shown in the following Table 5.

TABLE 5

| | Before test | | After 5000-hour test | |
|---|---|---|---|---|
| | VHR (%) | Contrast ratio | VHR (%) | Contrast ratio |
| Example 4-1 | 99.5 | 4000 | 98.5 | 3850 |
| Example 4-2 | 99.5 | 4000 | 98.5 | 3800 |
| Comparative Example 4 | 99.5 | 4000 | 92.5 | 2700 |

As shown in Table 5, the VHR and the contrast ratio hardly decreased even after the high-temperature test in Examples 4-1 and 4-2 in which quantum dots were introduced into the alignment film material. In contrast, the VHR and the contrast ratio decreased after the high-temperature test in Comparative Example 4 in which no quantum dot was introduced into the alignment film material. The VHR and the contrast ratio decreased presumably because in the case of introducing no quantum dots into the alignment film material, under the ultraviolet rays in the backlight illumination, radicals were generated from the aromatic ring and the alkoxy group in the negative liquid crystal component, turned into impurity ions, and dissolved into the liquid crystal layer. In contrast, in the case of introducing quantum dots into the alignment film material, a decrease in VHR and contrast ratio was reduced presumably because the ultraviolet rays in the backlight illumination were converted into low energy visible light by the quantum dots, and thus generation of radicals from the negative liquid crystal was reduced.

Example 5-1

A 4D-RTN-mode liquid crystal display device was actually produced by the following method. First, a TFT substrate including components such as TFTs and pixel electrodes as shown in FIG. 3 and a color filter substrate (CF substrate) including an ITO electrode, a back matrix, and color filters were prepared.

To the surface of each of the TFT substrate and the CF substrate was applied the vertical photo-alignment film material obtained in Synthetic Example 3 and an alignment film material mixed with a polyamic acid-based alignment agent as a base layer. The substrates were pre-baked at 60° C. for five minutes. The alignment film material applied to the surfaces of the substrates was irradiated with linearly polarized ultraviolet light having a dominant wavelength of 330 nm with an intensity of 50 J/cm$^2$ (photo-alignment treatment). The photo-alignment treatment was performed on four alignment regions such that the tilt angle would be about 88.6°, using linearly polarized ultraviolet light. Thereby, vertical photo-alignment films having the alignment-controlling force were obtained. Each alignment film had a thickness of 100 nm. The polyamic acid used as the base layer contained no photoreactive group and no vertical or horizontal alignment functional group.

The obtained vertical photo-alignment films had a structure represented by the following formula (17). In the following formula (17), Z was the structure represented by the following formula (18).

[Chem. 36]

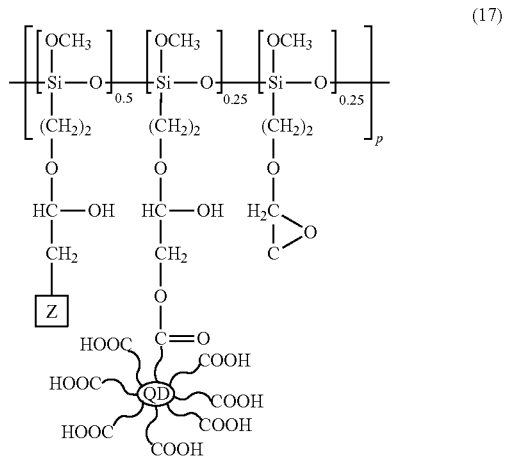

(17)

[Chem. 37]

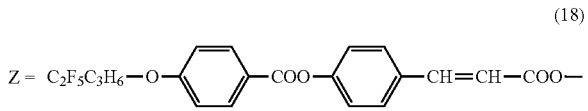

(18)

In the polymer represented by the formula (17), the main chain was derived from a polysiloxane, and the epoxy group of the polysiloxane and the terminal carboxyl group of an organic chain on the surface of the quantum dot were bonded by an ester bond. The polymer represented by the formula (17) was a copolymer of a unit containing a vertical alignment functional group with the photo-aligning functional group (cinnamate group) and represented by the formula (18) and a unit containing the quantum dot.

A liquid crystal panel was then produced as in Example 1-1. A backlight including a pseudo-white LED was mounted behind the liquid crystal panel, so that a liquid crystal display device of Example 5-1 was completed.

Example 5-2

A liquid crystal display device of Example 5-2 was produced as in Example 5-1, except that quantum dots having a different emission peak wavelength and a different particle size were used.

A vertical photo-alignment film material was synthesized as in Synthetic Example 3, except that core-type quantum dots (available from Sigma-Aldrich Japan, #662488) were used which were colloidal particles of CdSe and had hexadecylamine (HDA) introduced thereon as a capping agent, the quantum dots had an emission peak wavelength of 610 nm, and the colloidal particles had a particle size of 5.0 nm. A liquid crystal display device of Example 5-2 was produced as in Example 5-1 using the obtained vertical photo-alignment film material.

Comparative Example 5

A liquid crystal display device of Comparative Example 5 was produced as in Example 5-1, except that a fluorescent material containing quantum dots was not added.
<High-Temperature Test on Backlight>
The same evaluation test as in Example 1-1 was performed on the 4D-RTN-mode liquid crystal cells produced in Examples 5-1 and 5-2 and Comparative Example 5. The results are shown in the following Table 6.

TABLE 6

| | Before test | | After 5000-hour test | |
| --- | --- | --- | --- | --- |
| | VHR (%) | Contrast ratio | VHR (%) | Contrast ratio |
| Example 5-1 | 99.2 | 5000 | 98.1 | 4600 |
| Example 5-2 | 99.1 | 5000 | 97.8 | 4500 |
| Comparative Example 5 | 99.1 | 5000 | 90.5 | 3900 |

As shown in Table 6, the VHR and the contrast ratio hardly decreased even after the high-temperature test in Examples 5-1 and 5-2 in which quantum dots were introduced into the alignment film material. In contrast, the VHR and the contrast ratio decreased after the high-temperature test in Comparative Example 5 in which no quantum dot was introduced into the alignment film material. The VHR and the contrast ratio decreased presumably because in the case of introducing no quantum dots into the alignment film material, under the ultraviolet rays in the backlight illumination, radicals were generated from the aromatic ring and the alkoxy group in the negative liquid crystal component, turned into impurity ions, and dissolved into the liquid crystal layer. In contrast, in the case of introducing quantum dots into the alignment film material, a decrease in VHR and contrast ratio was reduced presumably because the ultraviolet rays in the backlight illumination were converted into low energy visible light by the quantum dots, and thus generation of radicals from the negative liquid crystal was reduced.

[Additional Remarks]

A first aspect of the present invention may be a liquid crystal display device including: paired substrates; a liquid crystal layer that is held between the paired substrates and contains liquid crystal molecules; and an alignment film disposed between at least one of the paired substrates and the liquid crystal layer, the alignment film containing quantum dots.

In the first aspect, the quantum dots each preferably have an organic chain on its surface. The quantum dots are each preferably chemically bonded to a polymer constituting the alignment film. The quantum dots preferably have an emission peak wavelength longer than 400 nm. The quantum dots are preferably formed of at least one compound selected from the group consisting of cadmium selenide, cadmium telluride, cadmium sulfide, and indium phosphide.

In the first aspect, the alignment film preferably aligns its neighboring liquid crystal molecules in a direction parallel to a surface thereof. The alignment film preferably contains a unit containing a horizontal alignment functional group and a unit containing a quantum dot.

In the first aspect, the alignment film preferably aligns its neighboring liquid crystal molecules in a direction perpendicular to a surface thereof. The alignment film preferably contains a unit containing a vertical alignment functional group and a unit containing a quantum dot.

In the first aspect, the alignment film is preferably a photo-alignment film containing a photo-aligning functional group. The photo-aligning functional group is preferably at least one photo-aligning functional group selected from the group consisting of a cinnamate group, a chalcone group, a coumarin group, an azobenzene group, and a tolane group. The photo-aligning functional group is preferably a cinnamate group. The photo-alignment film preferably contains a unit containing a photo-aligning functional group and a unit containing a quantum dot.

In the first aspect, the alignment film preferably contains at least one polymer selected from the group consisting of a polyamic acid, a polyimide, a polysiloxane, and a polyvinyl.

In the first aspect, the liquid crystal molecules preferably have negative anisotropy of dielectric constant.

The liquid crystal display device preferably further includes a backlight including a blue light emitting diode.

The display mode of the liquid crystal display device is preferably the twisted nematic (TN) mode, the in-plane switching (IPS) mode, the fringe field switching (FFS) mode, the electrically controlled birefringence (ECB) mode, the multi-domain vertical alignment (MVA) mode, or the 4 domain reverse twisted nematic (4D-RTN) mode.

A second aspect of the present invention may be an alignment film for use in controlling the initial alignment of liquid crystal in a liquid crystal display device, the alignment film containing quantum dots.

In the second aspect, the quantum dots each preferably have an organic chain on its surface. The quantum dots are each preferably chemically bonded to a polymer constituting the alignment film. The quantum dots are preferably formed of at least one compound selected from the group consisting of cadmium selenide, cadmium telluride, cadmium sulfide, and indium phosphide.

In the second aspect, the alignment film preferably contains a unit containing a horizontal alignment functional group and a unit containing a quantum dot.

In the second aspect, the alignment film is preferably a photo-alignment film containing a photo-aligning functional group. The photo-aligning functional group is preferably at least one photo-aligning functional group selected from the group consisting of a cinnamate group, a chalcone group, a coumarin group, an azobenzene group, and a tolane group. The photo-aligning functional group is preferably a cinnamate group.

In the second aspect, the photo-alignment film preferably contains a unit containing a photo-aligning functional group and a unit containing a quantum dot.

In the second aspect, the alignment film preferably contains at least one polymer selected from the group consisting of a polyamic acid, a polyimide, a polysiloxane, and a polyvinyl.

These aspects of the present invention may appropriately be combined within the spirit of the present invention.

REFERENCE SIGNS LIST

10: Backlight
20: Liquid crystal panel
21: Substrate
22: Alignment film
23: Liquid crystal layer
31: Gate signal line
32: Gate insulator
33: Source signal line
34: Drain electrode
35: Semiconductor layer
36: First interlayer film
37: First electrode
38: Second interlayer film
39: Second electrode

The invention claimed is:

1. A liquid crystal display device comprising:

paired substrates;

a liquid crystal layer that is held between the paired substrates and contains liquid crystal molecules; and an alignment film disposed between at least one of the paired substrates and the liquid crystal layer, the alignment film containing a polymer including quantum dots and having a repeating structural unit represented by the following formula (A-2):

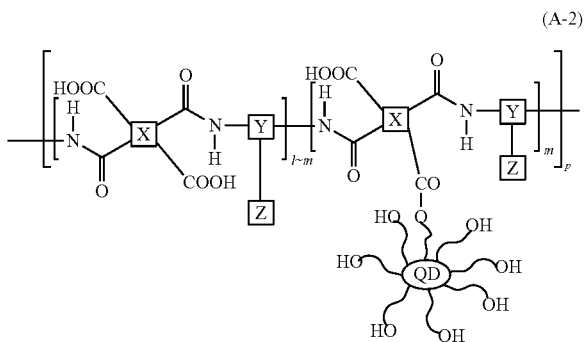

(A-2)

wherein QD denotes quantum dots;

wherein Xs are the same as or different from each other, and each represent any one of the following formulas (X-A1) to (X-A12) or (X-B1) to (X-B4):

(X-A1)

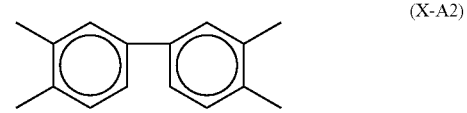

(X-A2)

(X-A3)

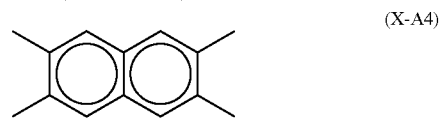

(X-A4)

(X-A5)

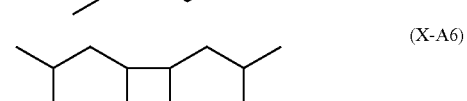

(X-A6)

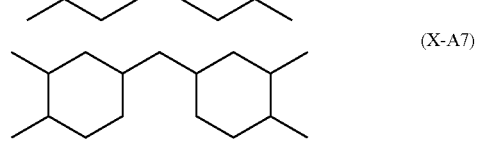

(X-A7)

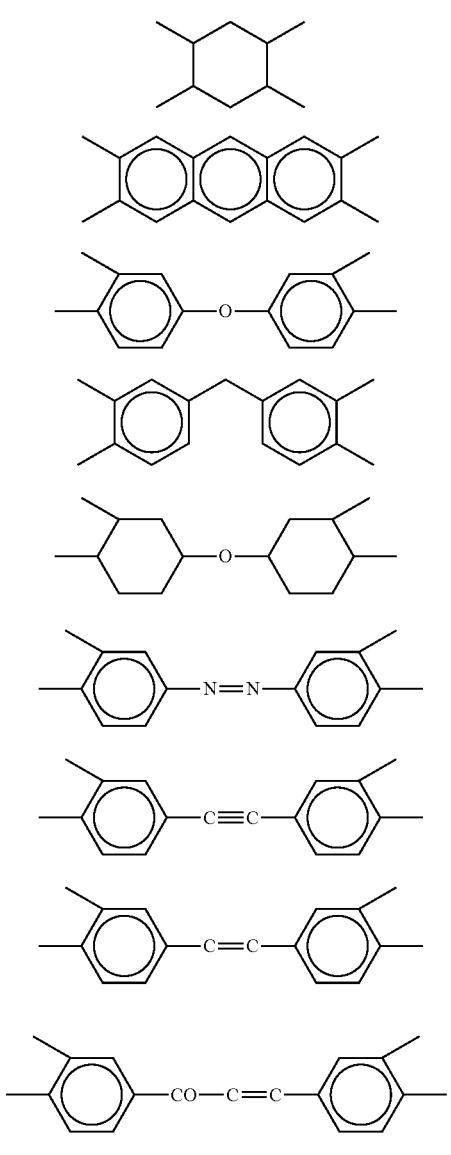
wherein at least one hydrogen atom in the formulas (X-A1) to (X-A12) or (X-B1) to (X-B4) may be replaced by a fluorine group, a methyl group, an ethyl group, or an isopropyl group;
wherein Ys are the same as or different from each other, and each represent any one of the following formulas (Y-A1) to (Y-A16) or (Y-B1) to (Y-B8):
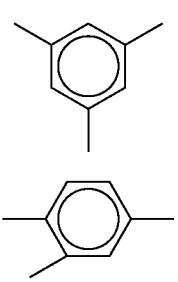
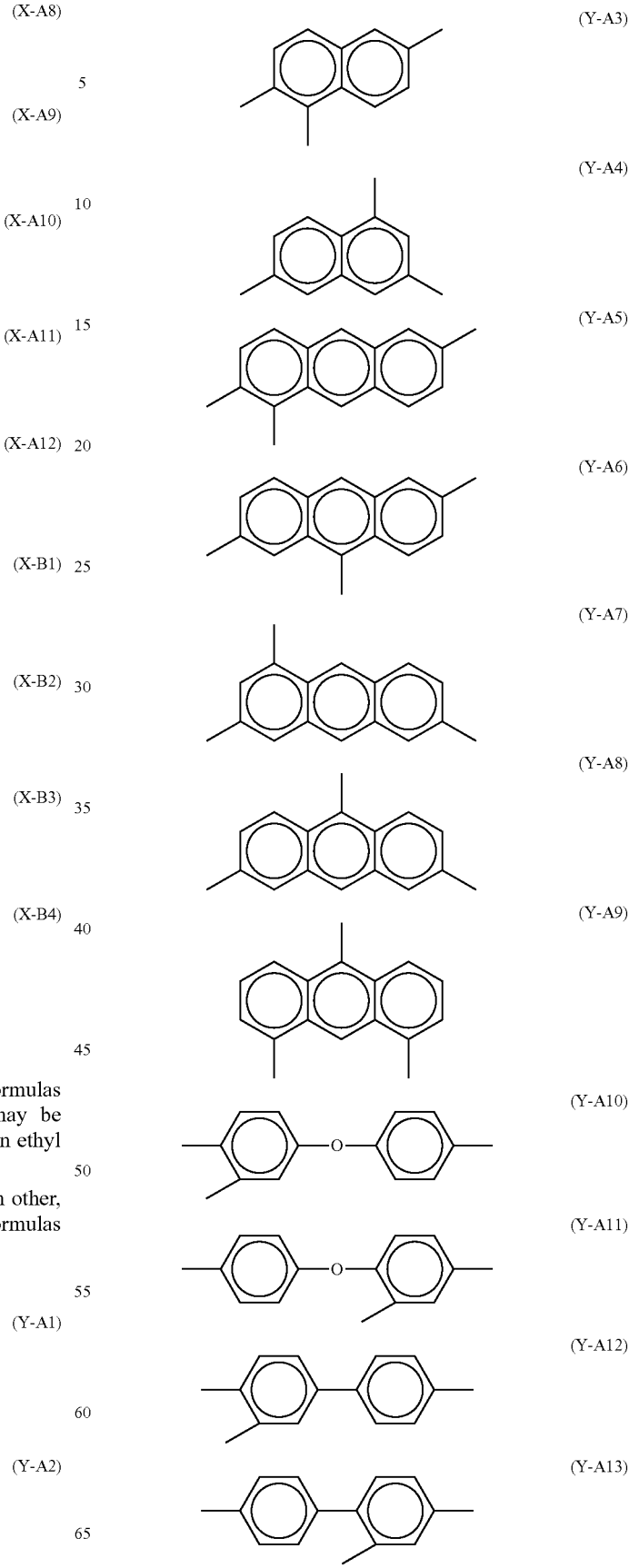

-continued

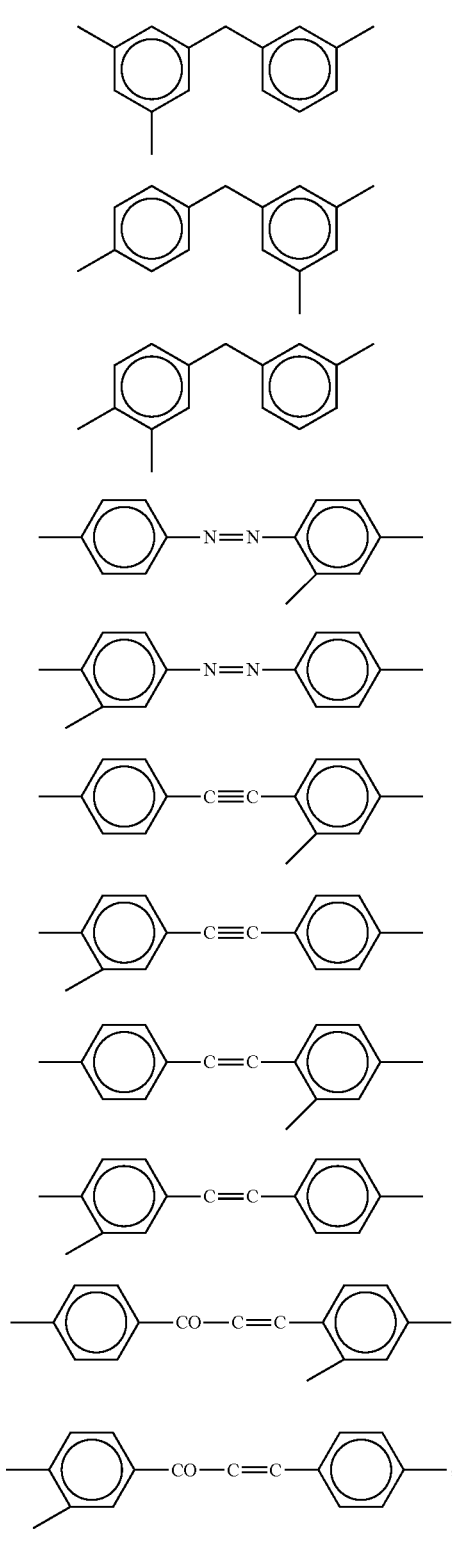

wherein at least one hydrogen atom in the formulas (Y-A1) to (Y-A16) or (Y-B1) to (Y-B8) may be replaced by a fluorine group, a methyl group, an ethyl group, or an isopropyl group;

wherein Zs are optional structures, the same as or different from each other, and each represent any one of the following formulas (Z-A1) to (Z-A8), (Z-B1) to (Z-B7), (Z-C1) to (Z-C2) or (Z-D1) to (Z-D21):

—H    (Z-A1)

—CH$_3$    (Z-A2)

—C$_2$H$_5$    (Z-A3)

—CF$_3$    (Z-A4)

 (Z-A5)

 (Z-A6)

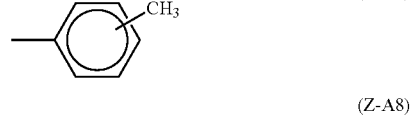 (Z-A7)

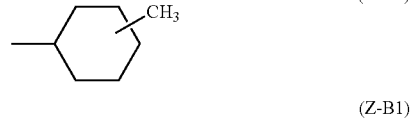 (Z-A8)

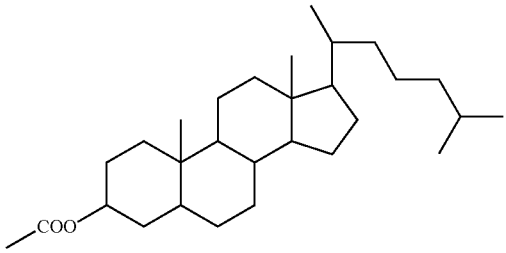 (Z-B1)

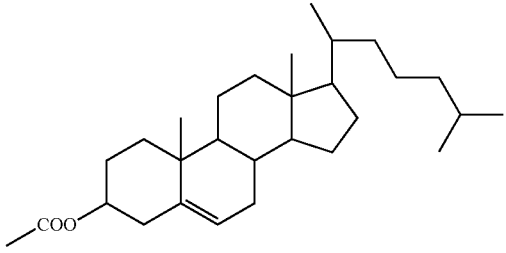 (Z-B2)

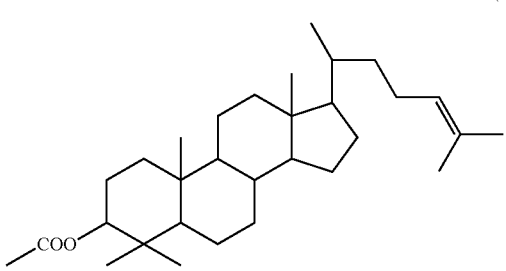 (Z-B3)

(Z-B4)
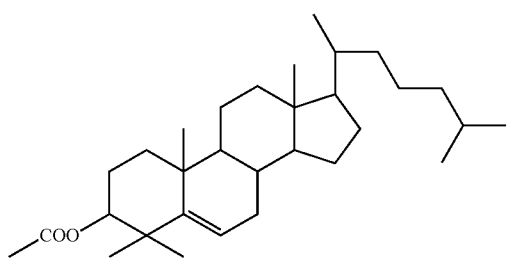
(Z-B5)
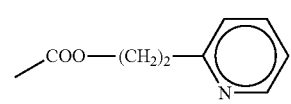
(Z-B6)
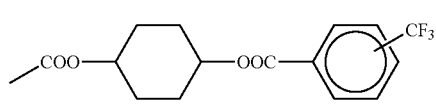
(Z-B7)
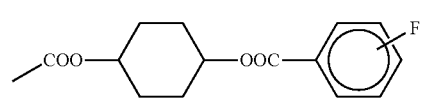
(Z-C1)
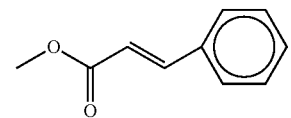
(Z-C2)
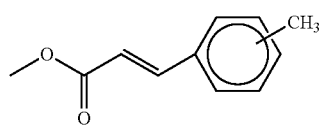
(Z-D1)
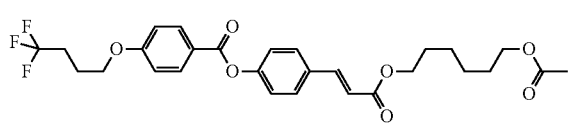
(Z-D2)
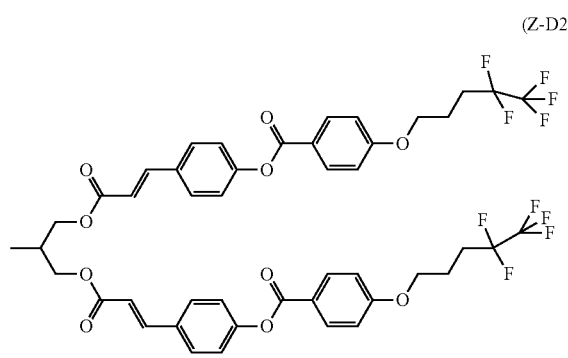
(Z-D3)
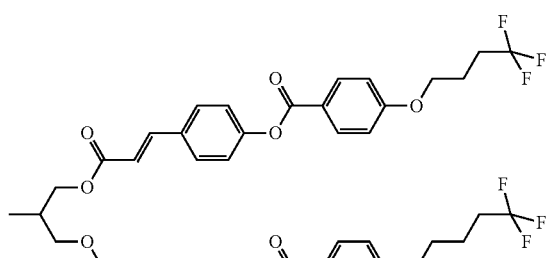
(Z-D4)
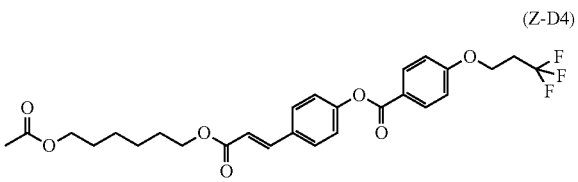
(Z-D5)
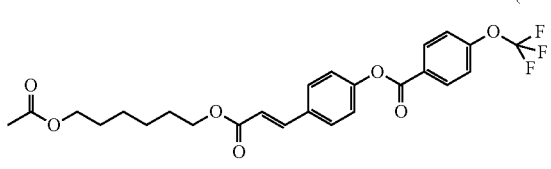
(Z-D6)
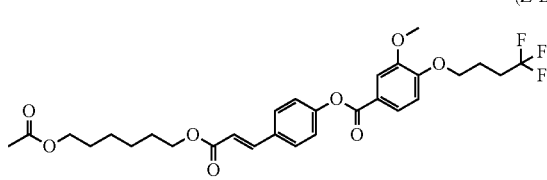
(Z-D7)
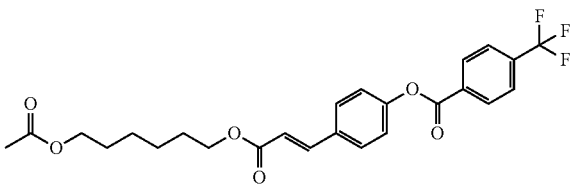
(Z-D8)
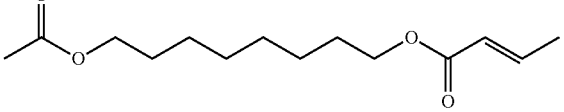
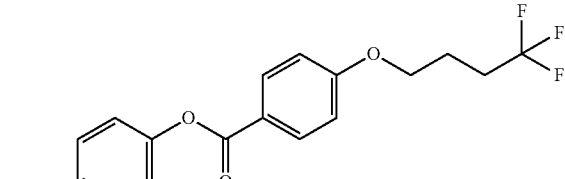
(Z-D9)
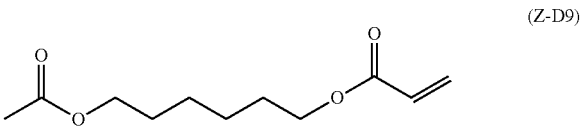

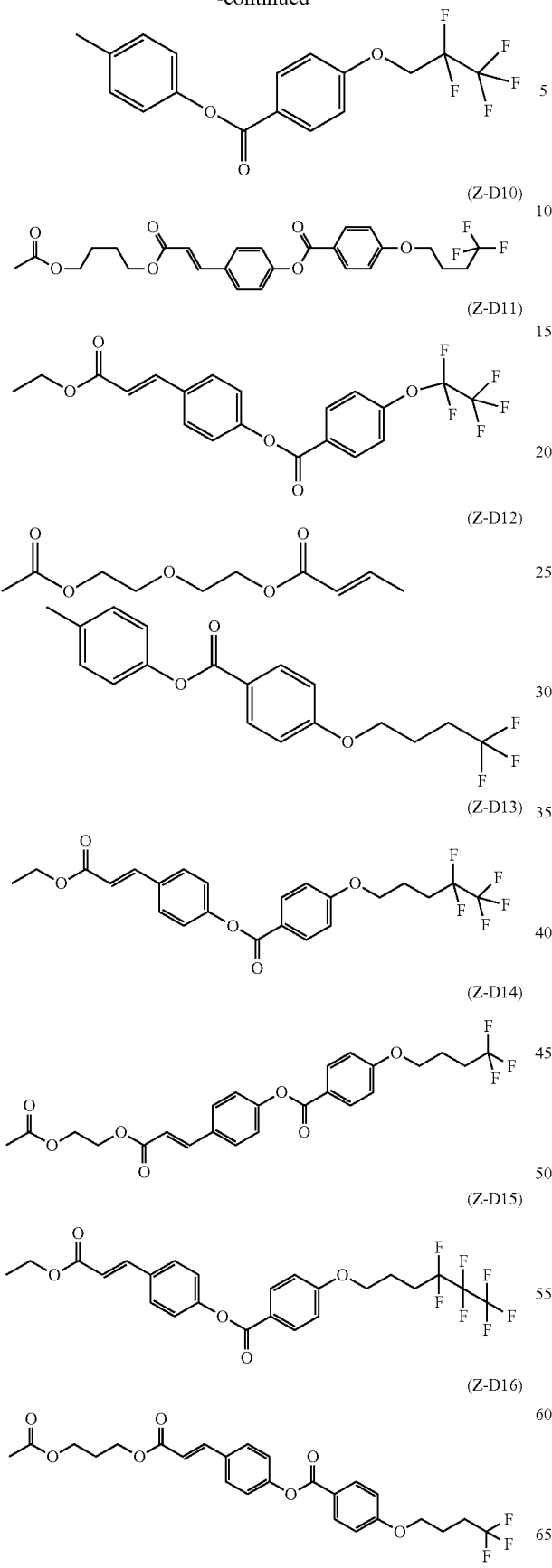

wherein m is a real number falling within a range of 0<m≤0.5; and wherein p denotes a degree of polymerization and is an integer of 1 or greater.

2. The liquid crystal display device according to claim 1, wherein the quantum dots each have an organic chain on its surface.

3. The liquid crystal display device according to claim 2, wherein the quantum dots are each chemically bonded to a polymer constituting the alignment film.

4. The liquid crystal display device according to claim 1, wherein the quantum dots have an emission peak wavelength longer than 400 nm.

5. The liquid crystal display device according to claim 1, wherein the quantum dots are formed of at least one compound selected from the group consisting of cadmium selenide, cadmium telluride, cadmium sulfide, and indium phosphide.

6. The liquid crystal display device according to claim 1, wherein the liquid crystal molecules have negative anisotropy of dielectric constant.

7. The liquid crystal display device according to claim 1, further comprising a backlight including a blue light emitting diode.

8. The liquid crystal display device according to claim 1, wherein the polymer has a repeating structural unit represented by the following formulas (6-1), (7) and (8):

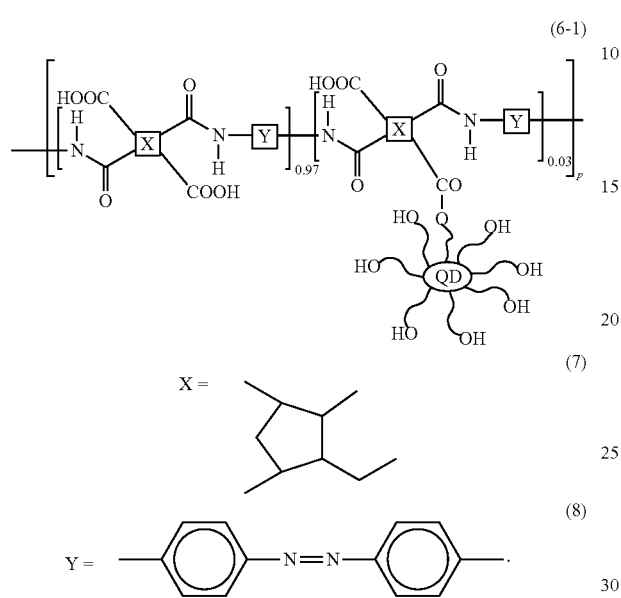

9. The liquid crystal display device according to claim 1, wherein the polymer has a repeating structural unit represented by the following formulas (6-2), (7) and (8):

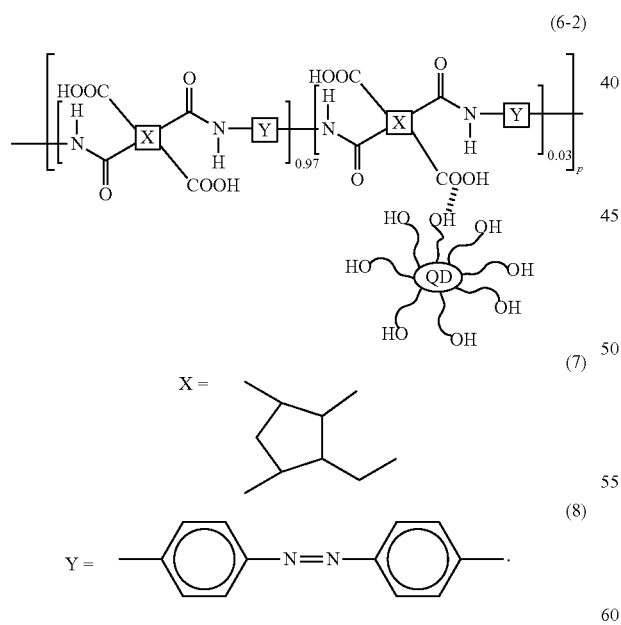

10. A liquid crystal display device comprising:
paired substrates;
a liquid crystal layer that is held between the paired substrates and contains liquid crystal molecules; and
an alignment film disposed between at least one of the paired substrates and the liquid crystal layer, the alignment film containing a polymer including quantum dots and having a repeating structural unit represented by the following formula (A-1):

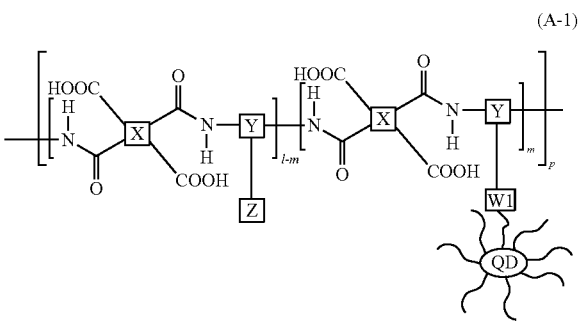

wherein QD denotes quantum dots;
wherein Xs are the same as or different from each other, and each represent any one of the following formulas (X-A1) to (X-A12) or (X-B1) to (X-B4):

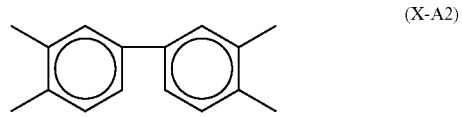

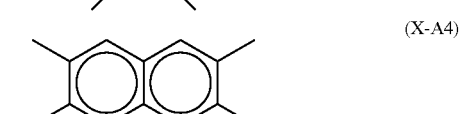

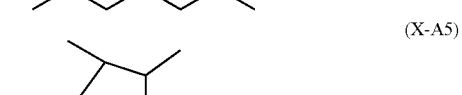

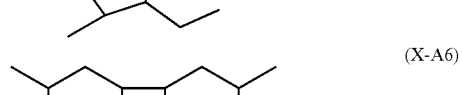

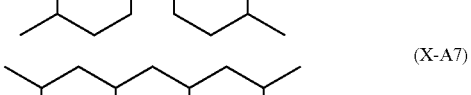

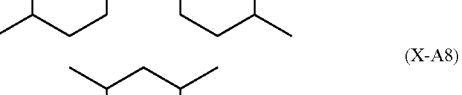

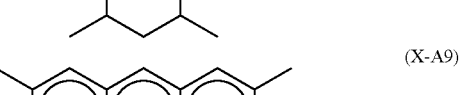

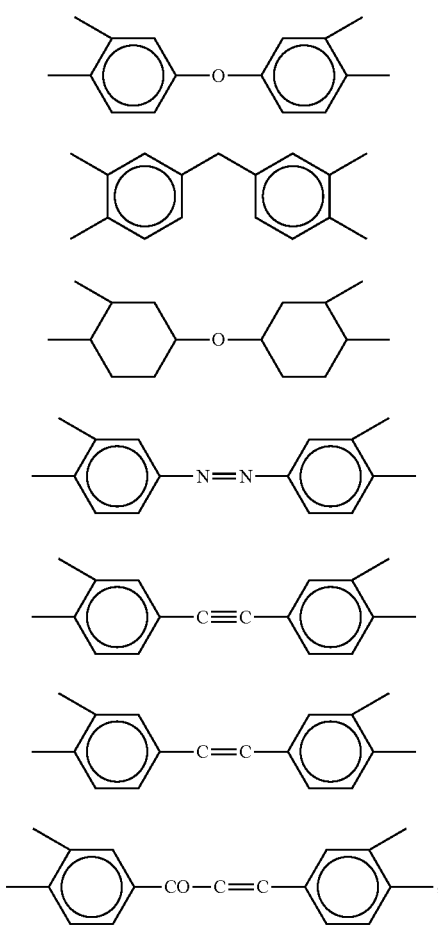
wherein at least one hydrogen atom in the formulas (X-A1) to (X-A12) or (X-B1) to (X-B4) may be replaced by a fluorine group, a methyl group, an ethyl group, or an isopropyl group;
wherein Ys are the same as or different from each other, and each represent any one of the following formulas (Y-A1) to (Y-A16) or (Y-B1) to (Y-B8):
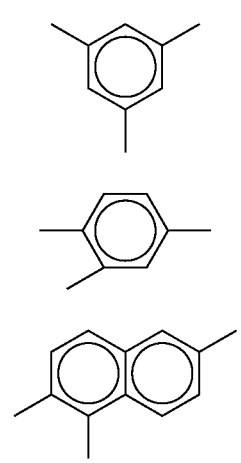

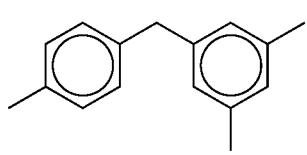
(Y-A15)

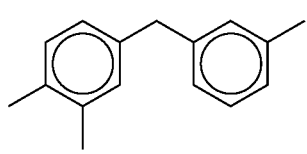
(Y-A16)

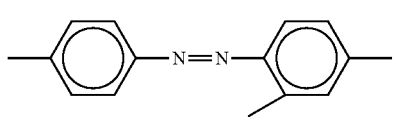
(Y-B1)

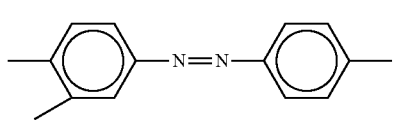
(Y-B2)

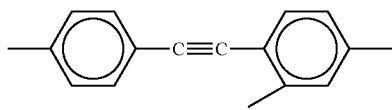
(Y-B3)

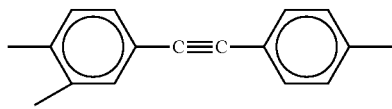
(Y-B4)

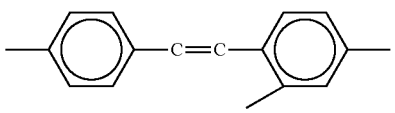
(Y-B5)

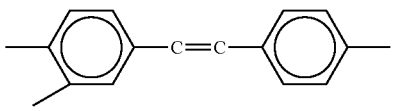
(Y-B6)

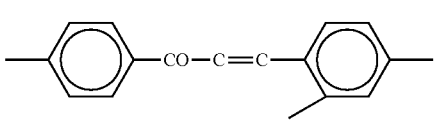
(Y-B7)

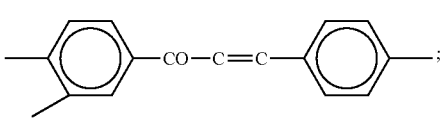
(Y-B8)

wherein at least one hydrogen atom in the formulas (Y-A1) to (Y-A16) or (Y-B1) to (Y-B8) may be replaced by a fluorine group, a methyl group, an ethyl group, or an isopropyl group;

wherein Zs are optional structures, the same as or different from each other, and each represent any one of the following formulas (Z-A1) to (Z-A8), (Z-B1) to (Z-B7), (Z-C1) to (Z-C2) or (Z-D1) to (Z-D21):

—H  (Z-A1)

—CH₃  (Z-A2)

—C₂H₅  (Z-A3)

—CF₃  (Z-A4)

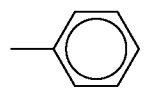
(Z-A5)

(Z-A6)

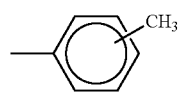
(Z-A7)

(Z-A8)

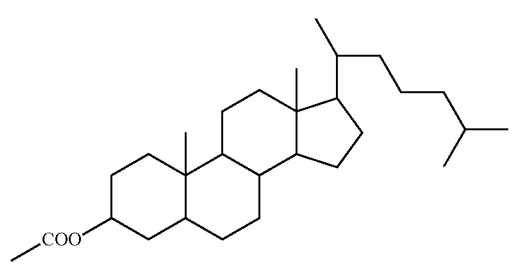
(Z-B1)

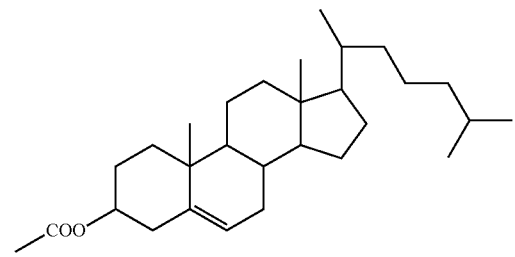
(Z-B2)

-continued
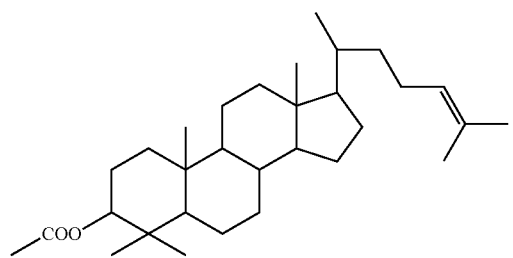
(Z-B3)
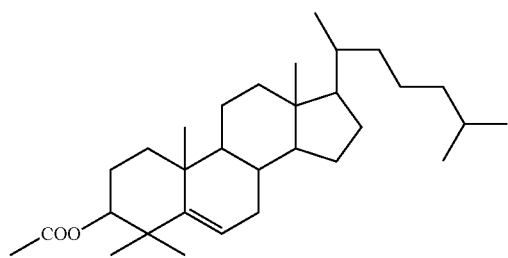
(Z-B4)
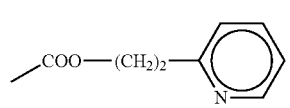
(Z-B5)
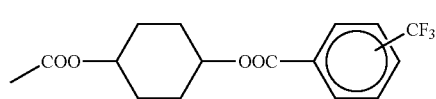
(Z-B6)
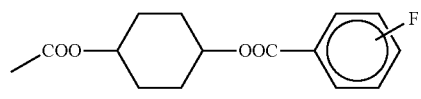
(Z-B7)
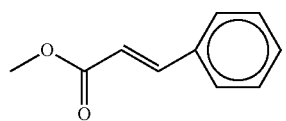
(Z-C1)
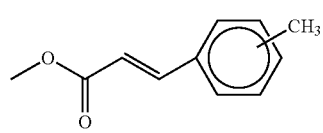
(Z-C2)
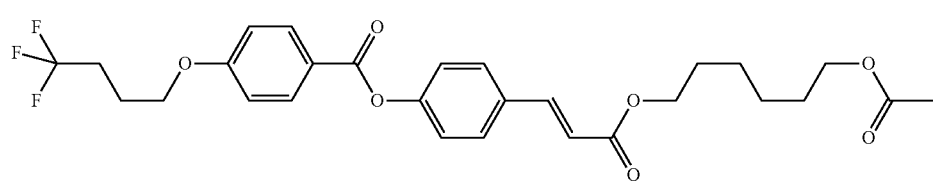
(Z-D1)
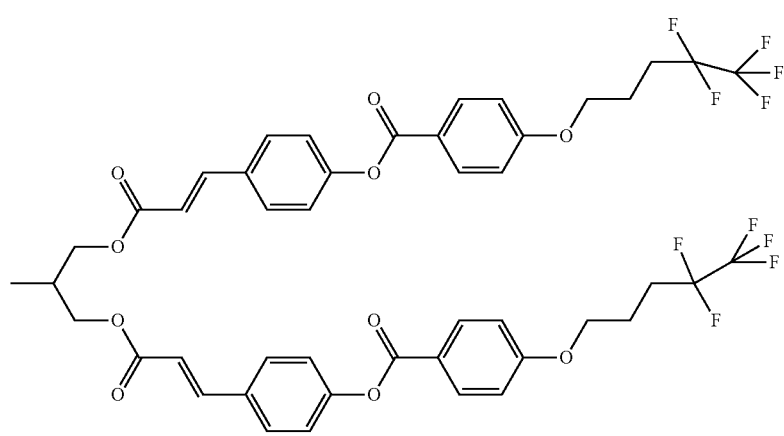
(Z-D2)

(Z-D3)
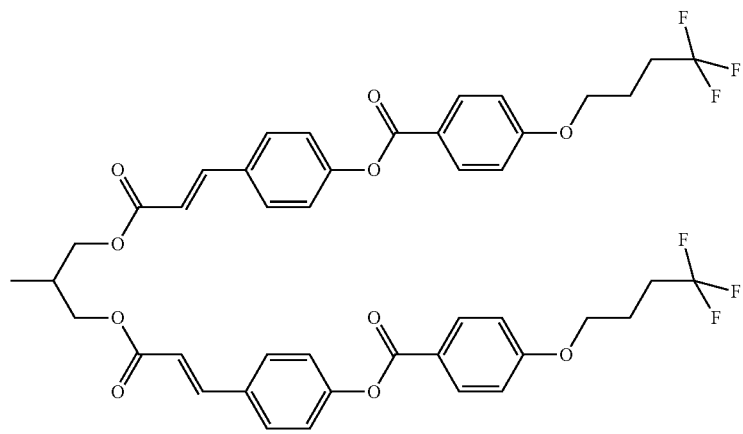
(Z-D4)
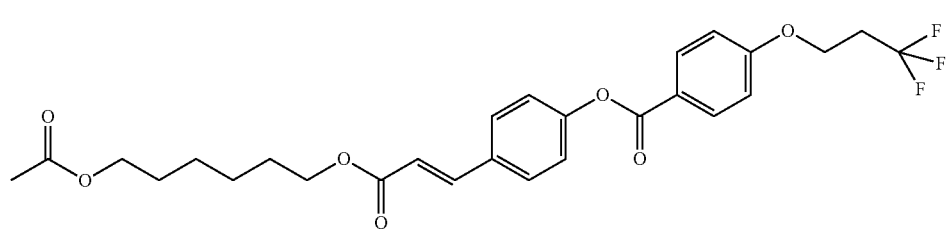
(Z-D5)
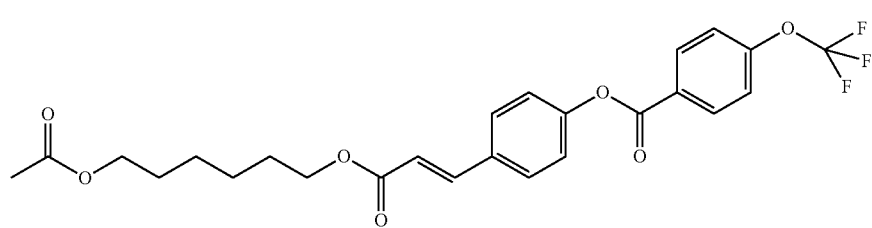
(Z-D6)
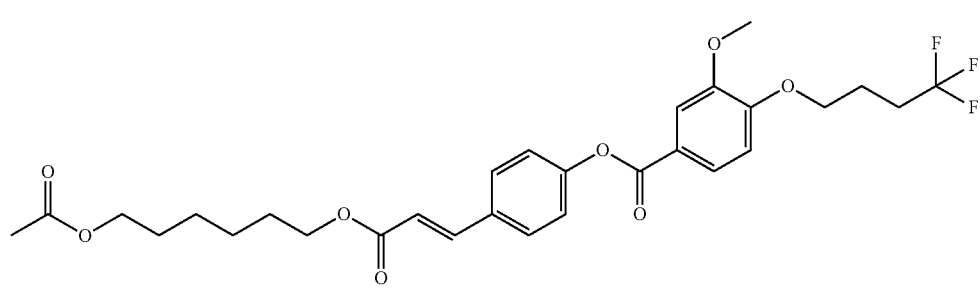
(Z-D7)
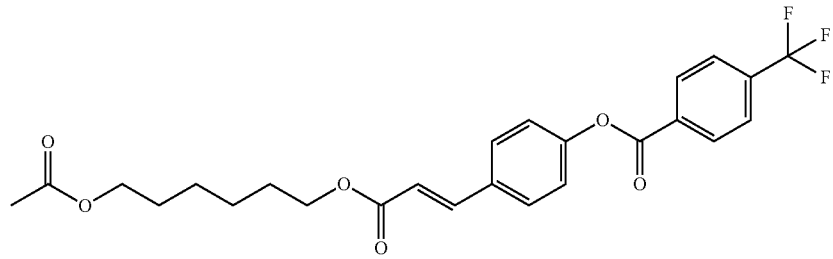

-continued
(Z-D8)
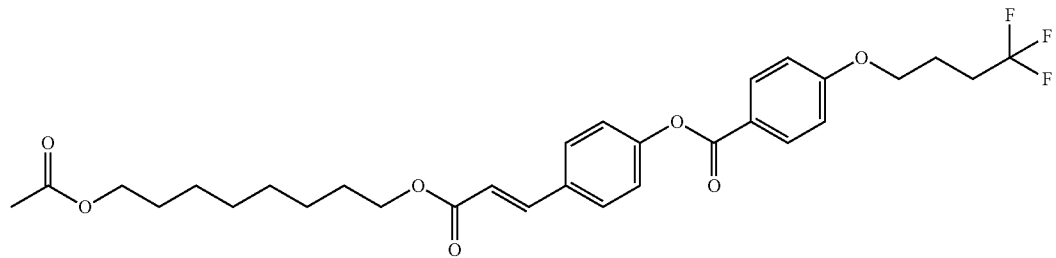
(Z-D9)
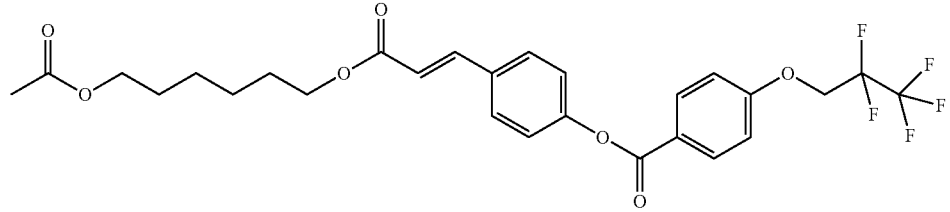
(Z-D10)
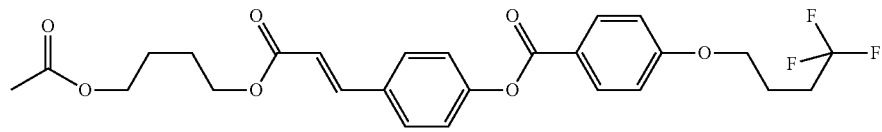
(Z-D11)
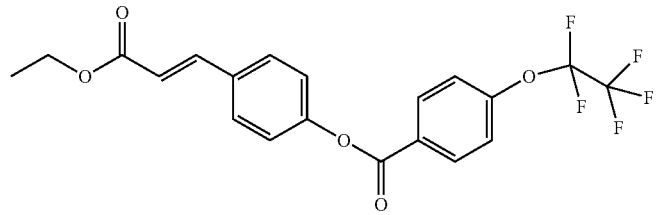
(Z-D12)
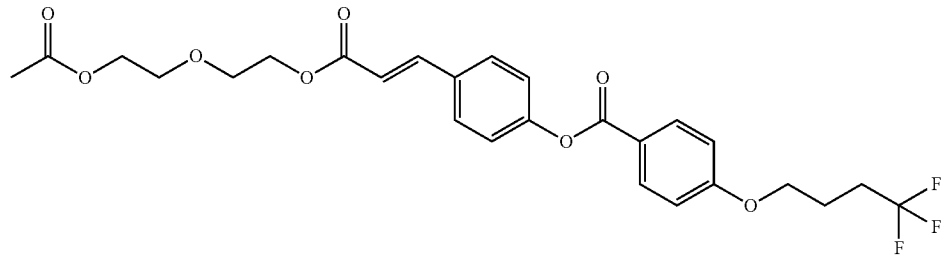
(Z-D13)
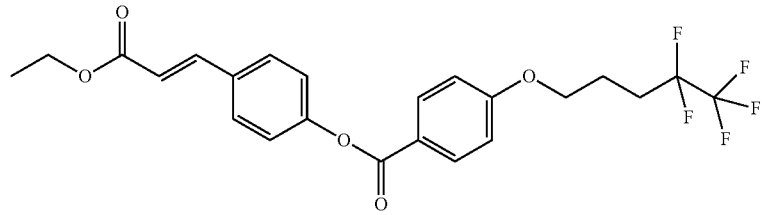
(Z-D14)
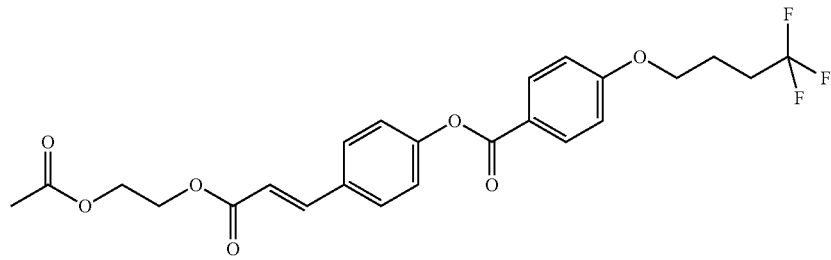

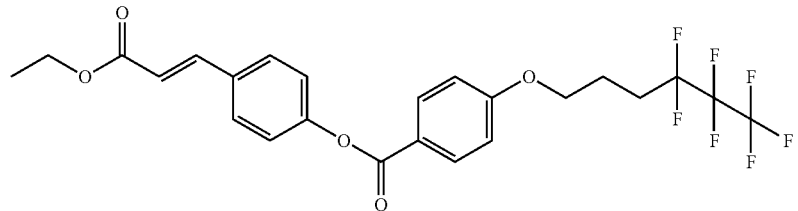
(Z-D15)
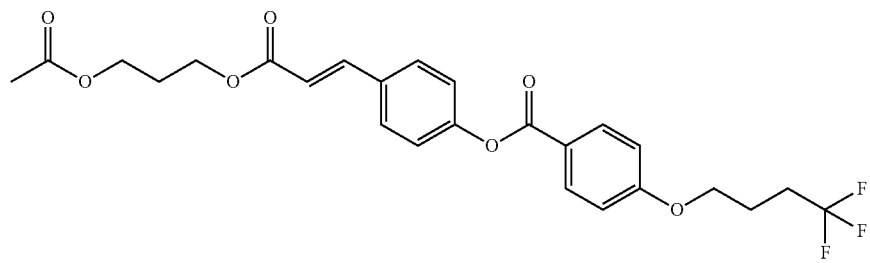
(Z-D16)
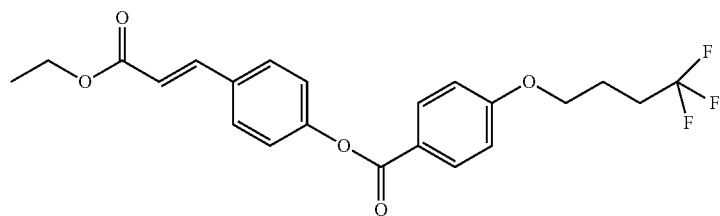
(Z-D17)
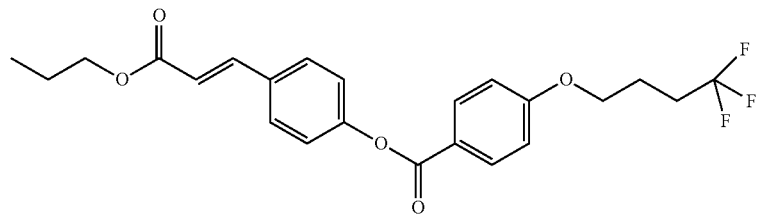
(Z-D18)
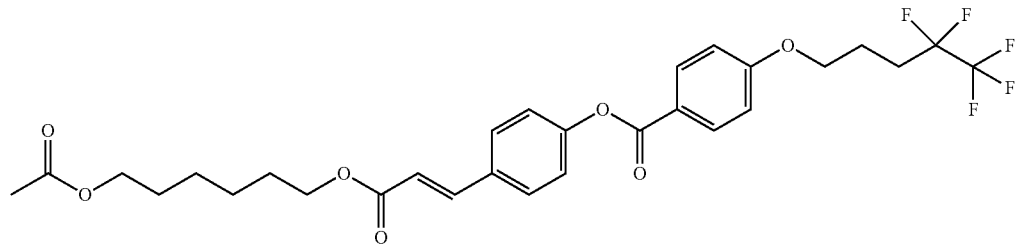
(Z-D19)
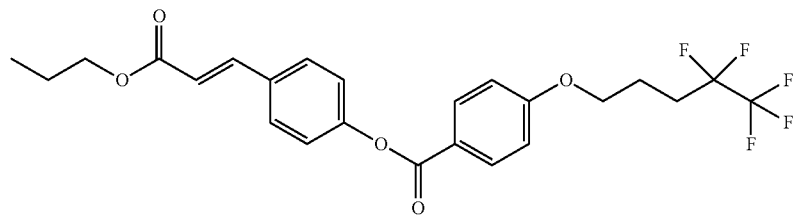
(Z-D20)

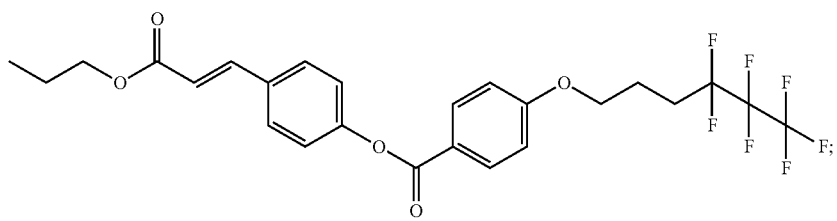 (Z-D21)

wherein W1 is an optional structure and denotes a spacer linking group;

wherein m is a real number falling within a range of $0 < m \leq 0.5$; and wherein p denotes a degree of polymerization and is an integer of 1 or greater.

11. The liquid crystal display device according to claim 10, wherein the quantum dots each have an organic chain on its surface.

12. The liquid crystal display device according to claim 11, wherein the quantum dots are each chemically bonded to a polymer constituting the alignment film.

13. The liquid crystal display device according to claim 10, wherein the quantum dots have an emission peak wavelength longer than 400 nm.

14. The liquid crystal display device according to claim 10, wherein the quantum dots are formed of at least one compound selected from the group consisting of cadmium selenide, cadmium telluride, cadmium sulfide, and indium phosphide.

15. A liquid crystal display device comprising:

paired substrates;

a liquid crystal layer that is held between the paired substrates and contains liquid crystal molecules; and an alignment film disposed between at least one of the paired substrates and the liquid crystal layer, the alignment film containing a polymer including quantum dots and having a repeating structural unit represented by the following formula (A-3):

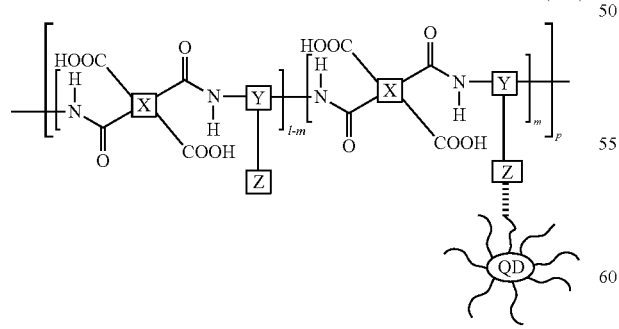 (A-3)

wherein QD denotes quantum dots;

wherein Xs are the same as or different from each other, and each represent any one of the following formulas (X-A1) to (X-A12) or (X-B1) to (X-B4):

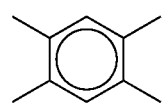 (X-A1)

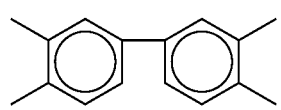 (X-A2)

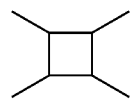 (X-A3)

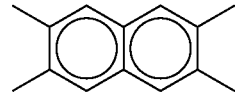 (X-A4)

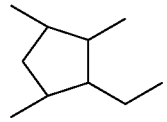 (X-A5)

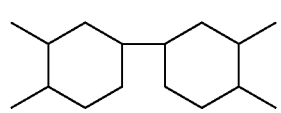 (X-A6)

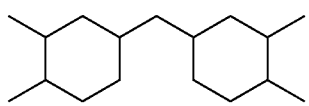 (X-A7)

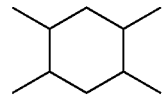 (X-A8)

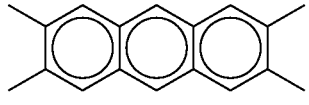 (X-A9)

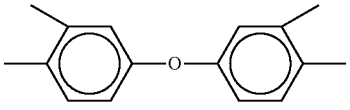 (X-A10)

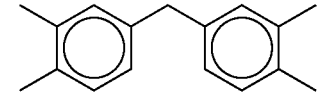 (X-A11)

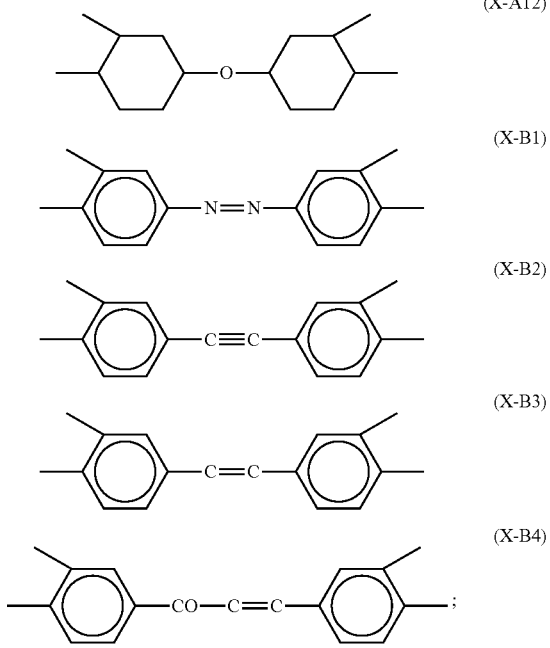
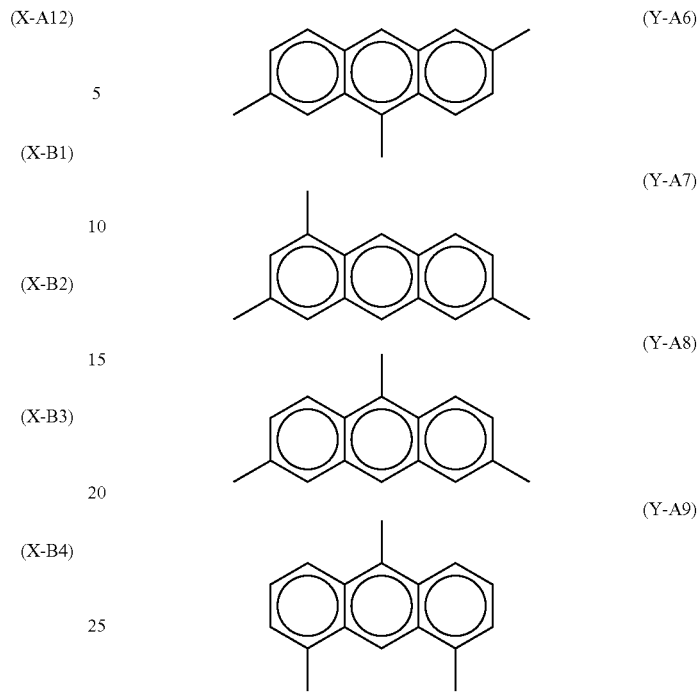
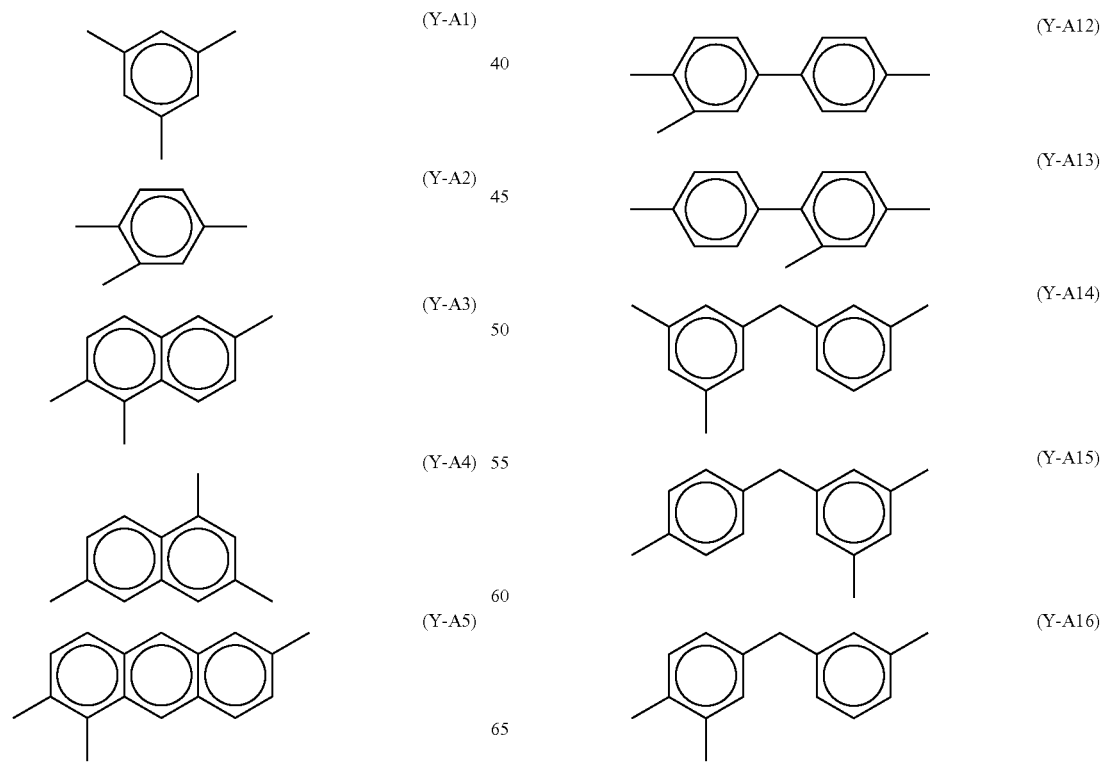
wherein at least one hydrogen atom in the formulas (X-A1) to (X-A12) or (X-B1) to (X-B4) may be replaced by a fluorine group, a methyl group, an ethyl group, or an isopropyl group;
wherein Ys are the same as or different from each other, and each represent any one of the following formulas (Y-A1) to (Y-A16) or (Y-B1) to (Y-B8):

(Y-B1) 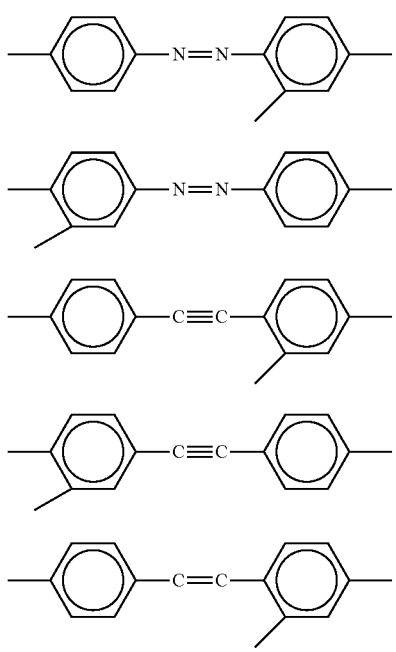
(Y-B2)
(Y-B3)
(Y-B4)
(Y-B5)

(Y-B6) 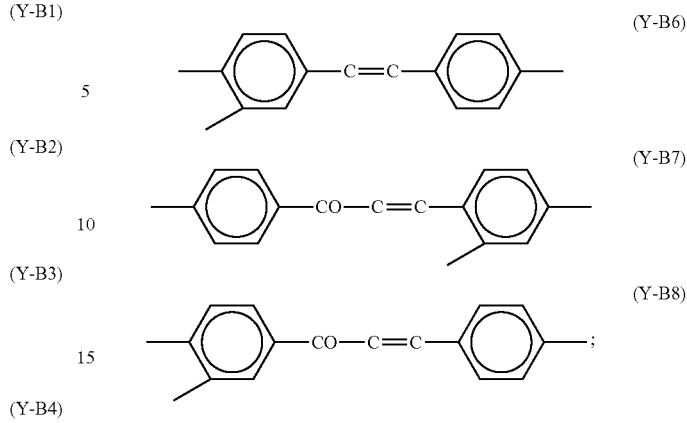
(Y-B7)
(Y-B8);

wherein at least one hydrogen atom in the formulas (Y-A1) to (Y-A16) or (Y-B1) to (Y-B8) may be replaced by a fluorine group, a methyl group, an ethyl group, or an isopropyl group;

wherein Zs are optional structures, the same as or different from each other, and each represent any one of the following formulas (Z-A1) to (Z-A8), (Z-B1) to (Z-B7), (Z-C1) to (Z-C2) or (Z-D1) to (Z-D21):

(Z-A1) —H
(Z-A2) —CH$_3$
(Z-A3) —C$_2$H$_5$
(Z-A4) —CF$_3$
(Z-A5) 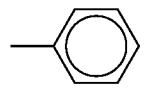
(Z-A6) 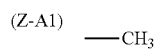
(Z-A7) 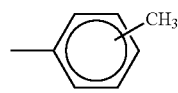
(Z-A8) 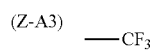

(Z-B1) 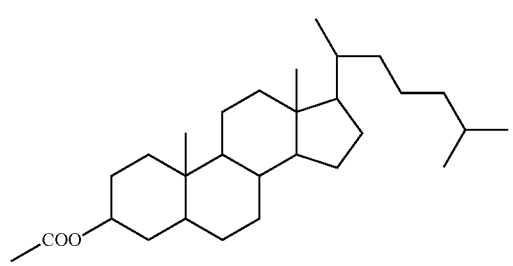
(Z-B2) 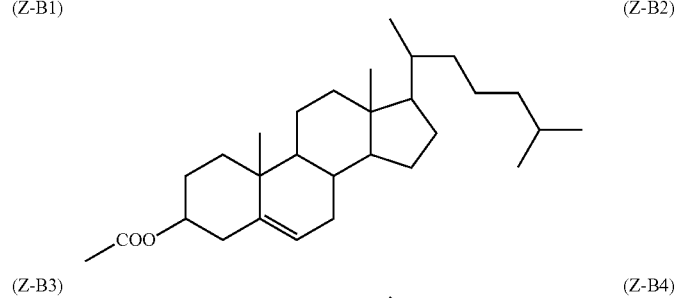

(Z-B3) 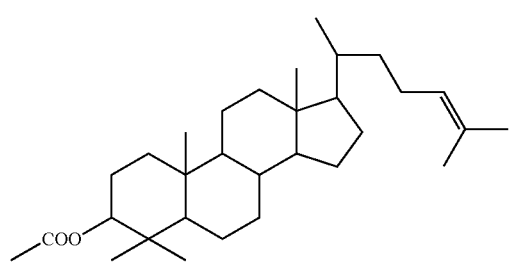
(Z-B4) 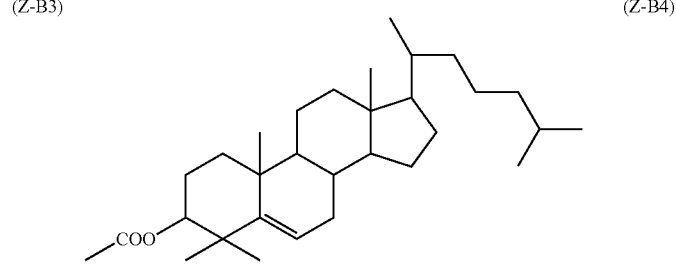

(Z-B5) 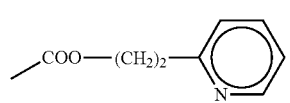
(Z-B6) 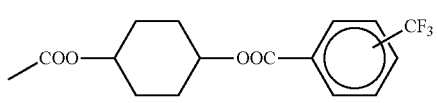

-continued
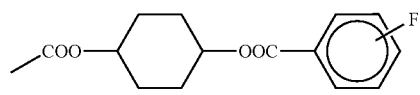 (Z-B7)
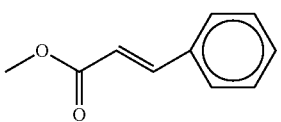 (Z-C1)
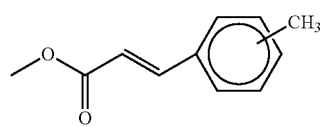 (Z-C2)
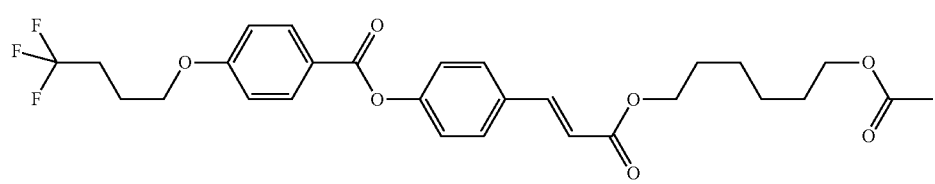 (Z-D1)
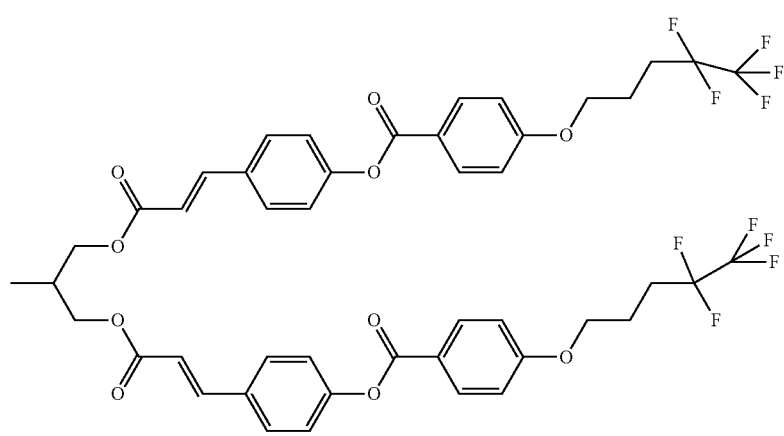 (Z-D2)
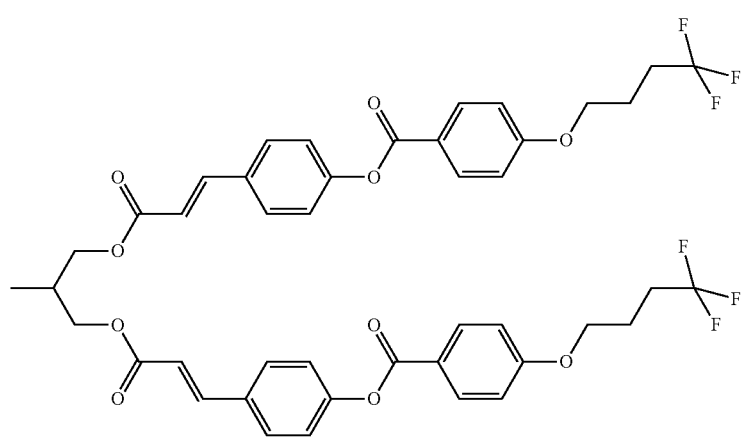 (Z-D3)
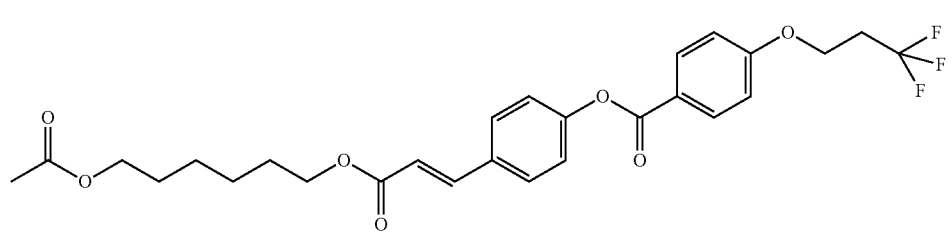 (Z-D4)

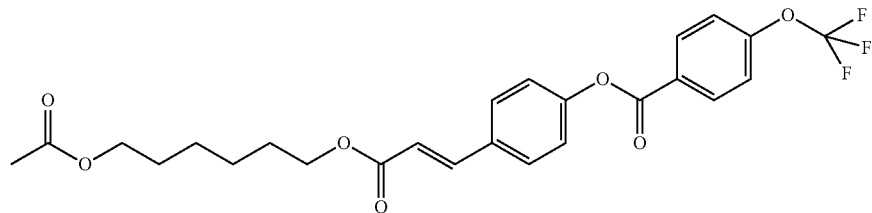
(Z-D5)
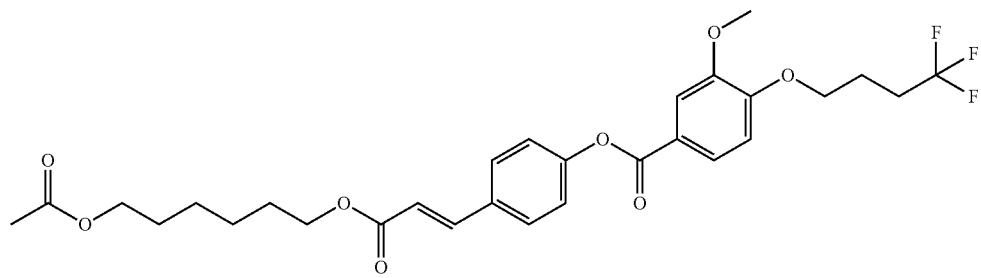
(Z-D6)
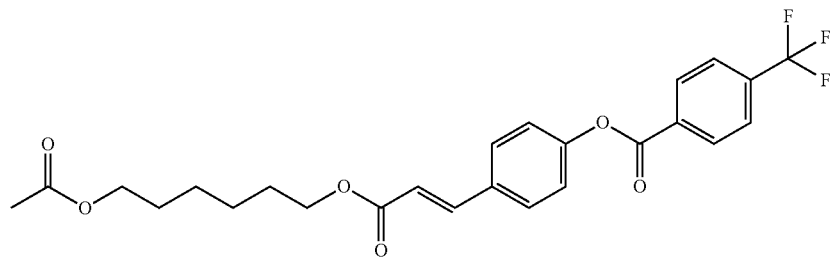
(Z-D7)
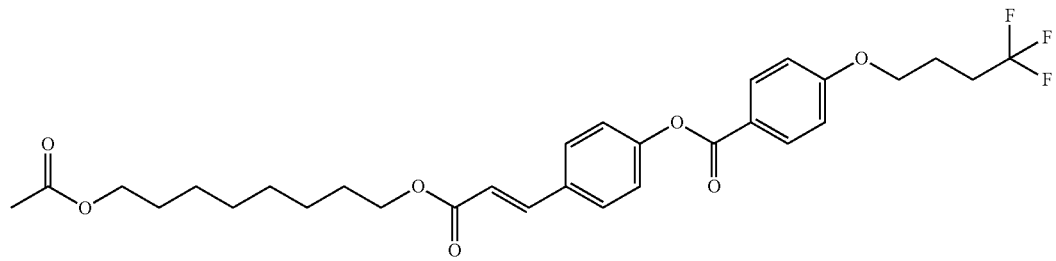
(Z-D8)
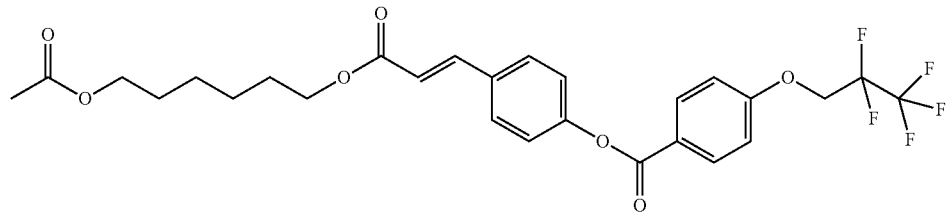
(Z-D9)
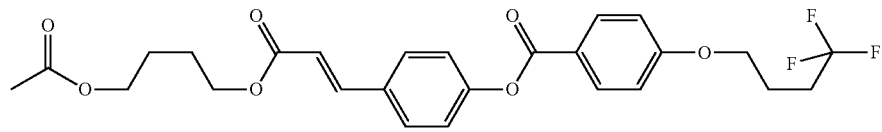
(Z-D10)
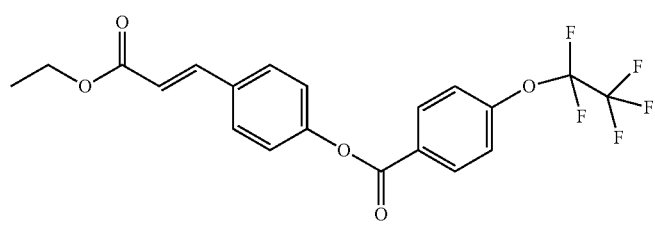
(Z-D11)

-continued
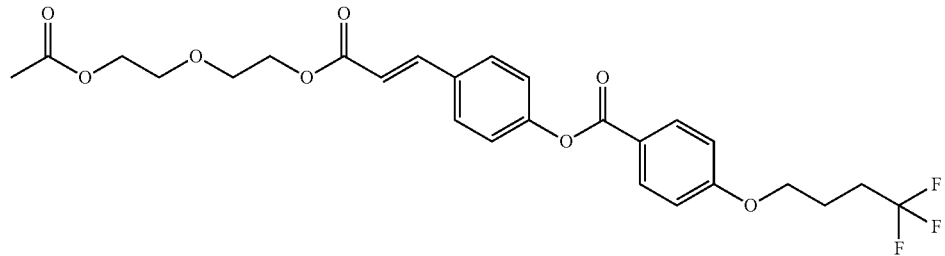
(Z-D12)
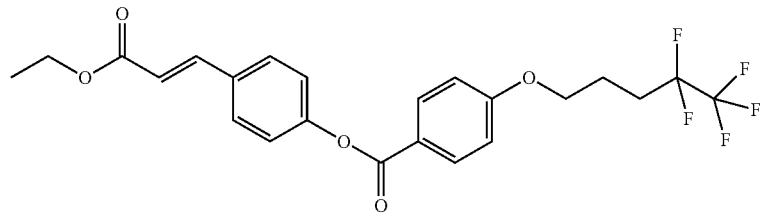
(Z-D13)
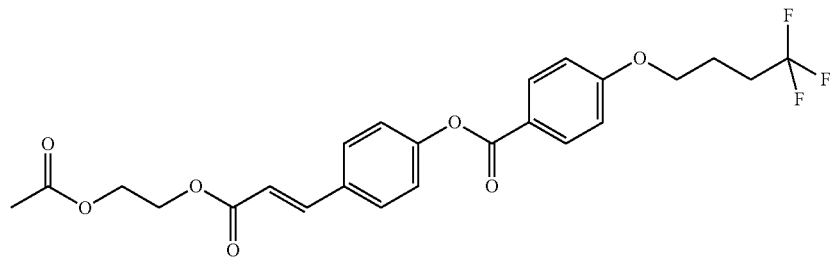
(Z-D14)
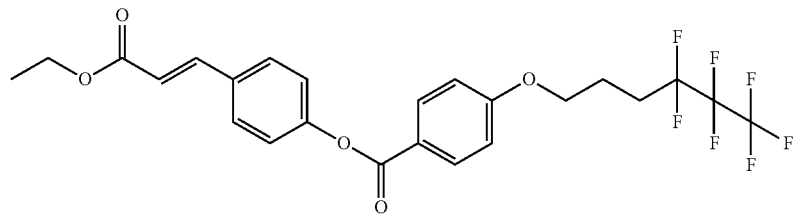
(Z-D15)
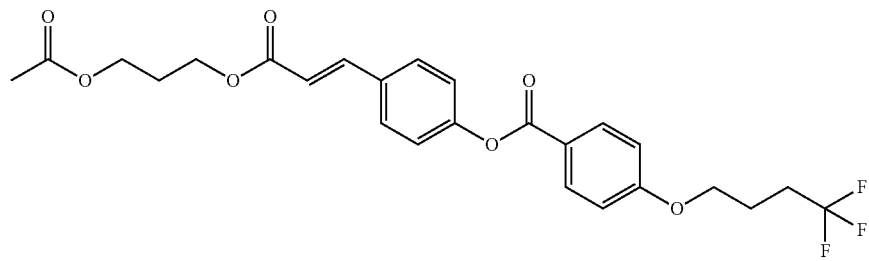
(Z-D16)
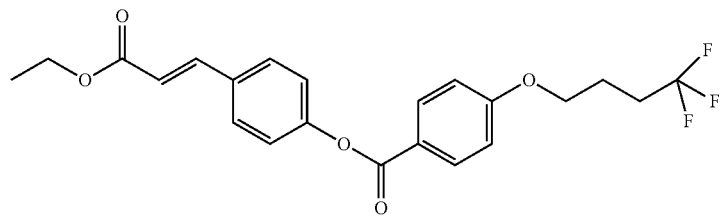
(Z-D17)

-continued

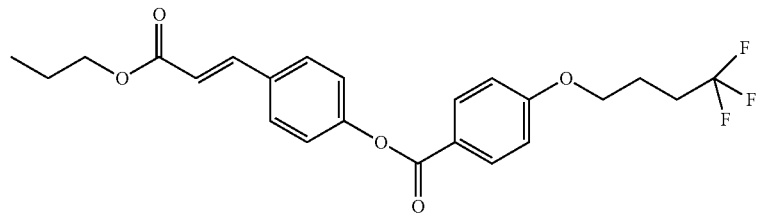
(Z-D18)

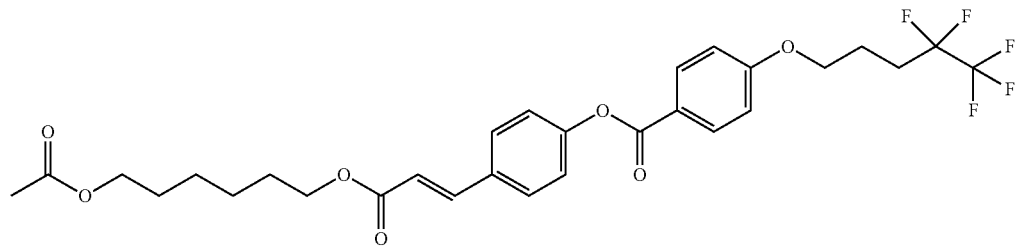
(Z-19)

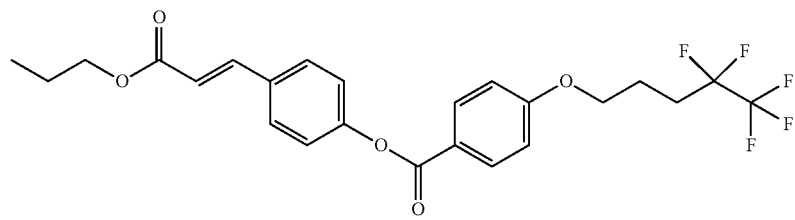
(Z-20)

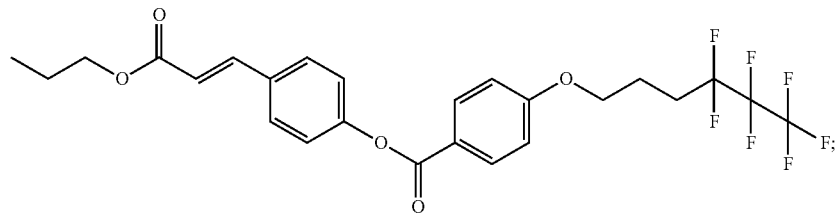
(Z-21)

wherein m is a real number falling within a range of $0 < m \leq 0.5$; and wherein p denotes a degree of polymerization and is an integer of 1 or greater.

16. The liquid crystal display device according to claim 15, wherein the quantum dots each have an organic chain on its surface.

17. The liquid crystal display device according to claim 16, wherein the quantum dots are each chemically bonded to a polymer constituting the alignment film.

18. The liquid crystal display device according to claim 15, wherein the quantum dots have an emission peak wavelength longer than 400 nm.

19. The liquid crystal display device according to claim 15, wherein the quantum dots are formed of at least one compound selected from the group consisting of cadmium selenide, cadmium telluride, cadmium sulfide, and indium phosphide.

* * * * *